US009912111B2

(12) United States Patent
Little et al.

(10) Patent No.: US 9,912,111 B2
(45) **Date of Patent: *Mar. 6, 2018**

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Chien-Ping Kao, Hummels town, PA (US); Wei-Hao Su, New Taipei (TW); An-Jen Yang, Irvine, CA (US); De-Cheng Zou, Monterey Park, CA (US); Chih-Hsien Chou, San Jose, CA (US); Yuan Zhang, Rowland-Heights, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/346,642

(22) Filed: Nov. 8, 2016

(65) Prior Publication Data

US 2017/0054258 A1 Feb. 23, 2017

Related U.S. Application Data

(63) Continuation-in-part of application No. 14/839,880, filed on Aug. 28, 2015, now Pat. No. 9,490,579, and
(Continued)

(51) Int. Cl.
*H01R 13/652* (2006.01)
*H01R 24/60* (2011.01)
(Continued)

(52) U.S. Cl.
CPC ......... *H01R 24/60* (2013.01); *H01R 13/6275* (2013.01); *H01R 13/6583* (2013.01); *H01R 13/6587* (2013.01); *H01R 2107/00* (2013.01)

(58) Field of Classification Search
CPC .. H01R 13/652; H01R 24/60; H01R 13/6658; H01R 12/724; H01R 13/6591–13/6595;
(Continued)

(56) References Cited

U.S. PATENT DOCUMENTS 5,073,130 A 12/1991 Nakamura
6,755,689 B2 6/2004 Zhang et al.
(Continued)

FOREIGN PATENT DOCUMENTS

CM CN201868687 U 6/2011
CN 1253402 A 5/2000
(Continued)

OTHER PUBLICATIONS

Universal Serial Bus Type-C Cable and Connector Specification Revision 0.7 Working Draft Jan. xx, 2014, p. 13-14, 20-21, 33, 38.
(Continued)

*Primary Examiner* — Gary Paumen
(74) *Attorney, Agent, or Firm* — Wei Te Chung; Ming Chieh Chang

(57) ABSTRACT

A receptacle connector includes an insulative housing defining a base and a mating tongue extending from the base with a widen and thicken step structure formed around a root of the mating tongue near to the base, two rows of plate contacts disposed in the insulative housing with contacting sections exposed upon the mating tongue and in front of the step structure and categorized with signal contacts, power contacts and grounding contacts, and a metallic shielding plate disposed within a middle level of the mating tongue and occupying most portions of said mating tongue. The
(Continued)

shielding plate defines a pair of immoveable and un-deflectable lateral edge sections in front of the step structure, each lateral edge section is configured to be adapted to be locked with a latch of a plug connector in a transverse direction.

20 Claims, 63 Drawing Sheets

Related U.S. Application Data a continuation-in-part of application No. 14/688,993, filed on Apr. 16, 2015, now Pat. No. 9,496,664, said application No. 14/839,880 is a continuation-in-part of application No. 14/558,732, filed on Dec. 3, 2014, now Pat. No. 9,490,594, and a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, and a continuation-in-part of application No. 14/477,889, filed on Sep. 5, 2014, now Pat. No. 9,525,223, and a continuation-in-part of application No. 14/454,737, filed on Aug. 8, 2014, now Pat. No. 9,525,227, and a continuation-in-part of application No. 14/337,180, filed on Jul. 21, 2014, now Pat. No. 9,318,853, said application No. 14/542,550 is a continuation-in-part of application No. 14/517,941, filed on Oct. 20, 2014, now Pat. No. 9,496,662.

(60) Provisional application No. 62/044,195, filed on Aug. 30, 2014, provisional application No. 61/989,508, filed on May 6, 2014, provisional application No. 61/981,217, filed on Apr. 18, 2014, provisional application No. 62/001,084, filed on May 21, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.

| | |
|---|---|
| ***H01R 13/66*** | (2006.01) |
| ***H01R 12/72*** | (2011.01) |
| ***H01R 13/642*** | (2006.01) |
| ***H01R 13/6582*** | (2011.01) |
| ***H01R 24/28*** | (2011.01) |
| ***H05K 1/11*** | (2006.01) |
| ***H05K 1/18*** | (2006.01) |
| ***H01R 13/627*** | (2006.01) |
| ***H01R 13/6583*** | (2011.01) |
| ***H01R 13/6587*** | (2011.01) |
| *H01R 107/00* | (2006.01) |

(58) Field of Classification Search
CPC ...... H01R 13/66; H01R 12/72; H01R 13/642; H01R 13/6582; H01R 24/28; H05K 1/11; H05K 1/18
USPC ............................... 439/660, 607.23, 607.35
See application file for complete search history.

(56) References Cited

U.S. PATENT DOCUMENTS

| | | | | |
|---|---|---|---|---|
| 6,811,434 | B2 * | 11/2004 | Wu .................... | H01R 12/7029 439/541.5 |
| 7,651,371 | B2 * | 1/2010 | Yi .................... | H01R 13/65802 439/541.5 |
| 7,758,379 | B2 | 7/2010 | Chen | |
| 8,087,944 | B2 | 1/2012 | Kumamoto et al. | |
| 8,308,515 | B2 * | 11/2012 | Chang .................... | H01R 12/73 439/660 |
| 8,517,773 | B2 | 8/2013 | Lee et al. | |
| 8,968,031 | B2 | 3/2015 | Simmel et al. | |
| 9,004,945 | B2 * | 4/2015 | Nagata ............... | H01R 13/6594 439/607.35 |
| 9,281,642 | B1 | 3/2016 | Tseng et al. | |
| 9,300,095 | B2 | 3/2016 | Lin et al. | |
| 9,312,641 | B2 | 4/2016 | Wang et al. | |
| 9,318,856 | B2 | 4/2016 | MacDougall et al. | |
| 9,379,499 | B2 | 6/2016 | Miyoshi et al. | |
| 2007/0049100 | A1 | 3/2007 | Tsai | |
| 2008/0003881 | A1 | 1/2008 | Wu | |
| 2009/0156027 | A1 | 6/2009 | Chen | |
| 2010/0267261 | A1 | 10/2010 | Lin et al. | |
| 2013/0095702 | A1 | 4/2013 | Golko et al. | |
| 2014/0024257 | A1 | 1/2014 | Castillo et al. | |
| 2015/0162684 | A1 | 6/2015 | Amini et al. | |
| 2015/0171562 | A1 | 6/2015 | Gao et al. | |
| 2015/0214673 | A1 | 7/2015 | Gao et al. | |
| 2015/0214674 | A1 | 7/2015 | Simmel et al. | |
| 2015/0295362 | A1 | 10/2015 | Tziviskos et al. | |
| 2015/0340813 | A1 | 11/2015 | Ng et al. | |
| 2015/0340815 | A1 | 11/2015 | Gao et al. | |
| 2015/0340825 | A1 | 11/2015 | Ng et al. | |
| 2016/0118752 | A1 | 4/2016 | Guo et al. | |

FOREIGN PATENT DOCUMENTS

| | | | |
|---|---|---|---|
| CN | 2454802 | Y | 10/2001 |
| CN | 2724249 | Y | 9/2005 |
| CN | 2728006 | Y | 9/2005 |
| CN | 2821921 | Y | 9/2006 |
| CN | 201029143 | Y | 2/2008 |
| CN | 201078847 | Y | 6/2008 |
| CN | 201107821 | Y | 8/2008 |
| CN | 201230066 | Y | 4/2009 |
| CN | 101573840 | A | 11/2009 |
| CN | 201498627 | U | 6/2010 |
| CN | 201708399 | U | 1/2011 |
| CN | 201717435 | U | 1/2011 |
| CN | 201741935 | U | 2/2011 |
| CN | 201741937 | U | 2/2011 |
| CN | 201868687 | U | 6/2011 |
| CN | 102280732 | B | 12/2011 |
| CN | 202076514 | U | 12/2011 |
| CN | 102437482 | A | 5/2012 |
| CN | 103107439 | A | 5/2012 |
| CN | 202217831 | U | 5/2012 |
| CN | 202231226 | U | 5/2012 |
| CN | 102544812 | A | 7/2012 |
| CN | 202423735 | | 9/2012 |
| CN | 202513384 | U | 10/2012 |
| CN | 202737282 | | 2/2013 |
| CN | 103081253 | A | 5/2013 |
| CN | 203242848 | U | 10/2013 |
| CN | 103401087 | A | 11/2013 |
| CN | 103427263 | A | 12/2013 |
| CN | 203326282 | U | 12/2013 |
| CN | 103579820 | A | 2/2014 |

(56) References Cited

FOREIGN PATENT DOCUMENTS

| | | | |
|---|---|---|---|
| CN | 103647172 | A | 3/2014 |
| CN | 203481540 | U | 3/2014 |
| CN | 103762479 | A | 4/2014 |
| CN | 203521683 | | 4/2014 |
| CN | 203521683 | U | 4/2014 |
| CN | 104377509 | A | 2/2015 |
| CN | 204243365 | U | 4/2015 |
| CN | 204577669 | U | 8/2015 |
| KR | 2020100004799 | U | 5/2010 |
| TW | 371520 | | 10/1999 |
| TW | 452247 | | 8/2001 |
| TW | M266600 | | 6/2005 |
| TW | M288035 | | 2/2006 |
| TW | M299952 | | 10/2006 |
| TW | M357077 | | 5/2009 |
| TW | M386661 | | 8/2010 |
| TW | M391213 | | 10/2010 |
| TW | M398256 | | 2/2011 |
| TW | M398262 | | 2/2011 |
| TW | I427870 | | 6/2011 |
| TW | M414692 | | 10/2011 |
| TW | M426911 | | 4/2012 |
| TW | M443957 | | 12/2012 |
| TW | M453995 | | 5/2013 |
| TW | M454654 | | 6/2013 |
| TW | 201328064 | A | 7/2013 |
| TW | M471688 | | 2/2014 |
| TW | M475728 | | 4/2014 |
| WO | WO2009147791 | | 12/2009 |
| WO | WO2013/020359 | | 2/2013 |

OTHER PUBLICATIONS

USB Type-C Specification 0.9c05—May 18, 2014, p. 24-44, 47, 53-64, 84-86.

Universal Serial Bus Type-C Cable and Connector Specification Revision 1.0 Aug. 11, 2014, p. 18-19, 28-48, 51, 55, 58, 59-63, 65-67, 70, 93, 96-99.107, 110-113.

* cited by examiner

FLIPPABLE ELECTRICAL CONNECTOR

CROSS REFERENCE TO RELATED APPLICATIONS

This application is a continuation of the co-pending application Ser. No. 14/558,732 filed on Dec. 3, 2014, and Ser. No. 14/839,880 filed on Aug. 28, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals.

Hence, a new and simple electrical plug connector and the complementary receptacle connector are desired.

SUMMARY OF THE INVENTION

Accordingly, the object of the present invention is to provide a receptacle connector adapted for mating with a plug connector, comprises: an insulative housing defining a base and a mating tongue extending from the base with a widen and thicken step structure formed around a root of the mating tongue near to the base; two rows of plate contacts disposed in the insulative housing with contacting sections exposed upon the mating tongue and in front of the step structure and categorized with signal contacts, power contacts and grounding contacts; a metallic shielding plate disposed within a middle level of the mating tongue and occupying most portions of said mating tongue. The shielding plate defines a pair of immoveable and un-deflectable lateral edge sections in front of the step structure, each lateral edge section is configured to be adapted to be locked with a latch of the plug connector in a transverse direction.

Other objects, advantages and novel features of the invention will become more apparent from the following detailed description when taken in conjunction with the accompanying drawings.

DETAILED DESCRIPTION OF THE PREFERRED EMBODIMENT

Figure 1:
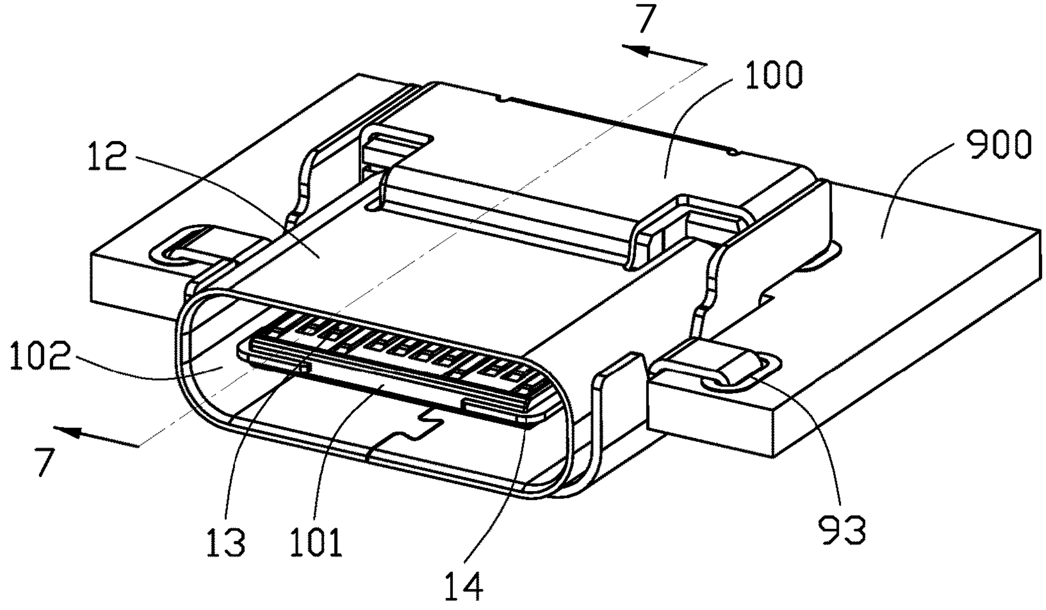
FIG. 1 is a perspective view of a receptacle connector of a first embodiment of the instant invention, which is mounted upon a printed circuit board (PCB) in a sink manner.
Figure 2:
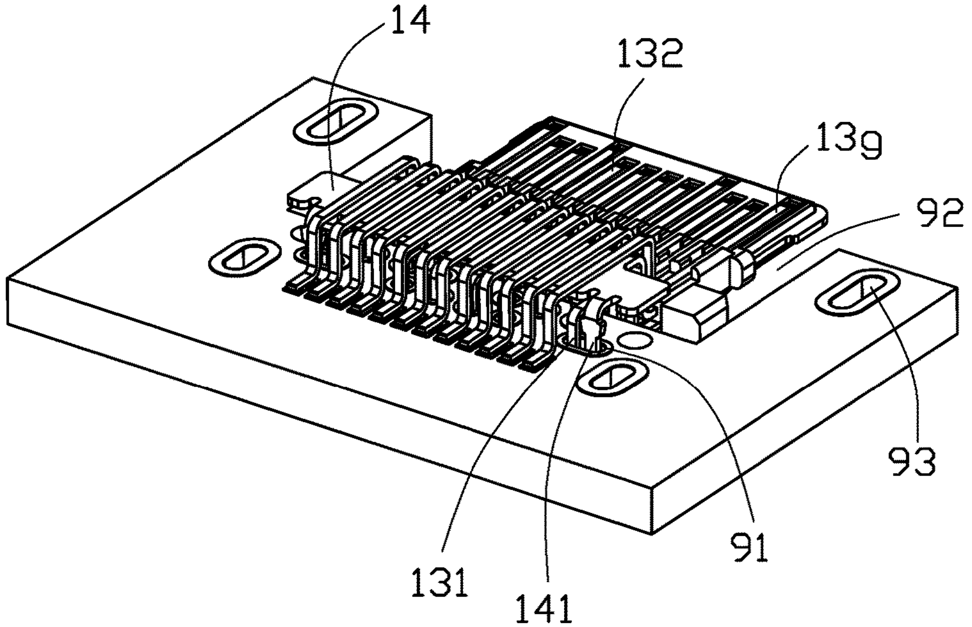
FIG. 2 is a perspective view of the partial receptacle connector and the PCB.
Figure 3:
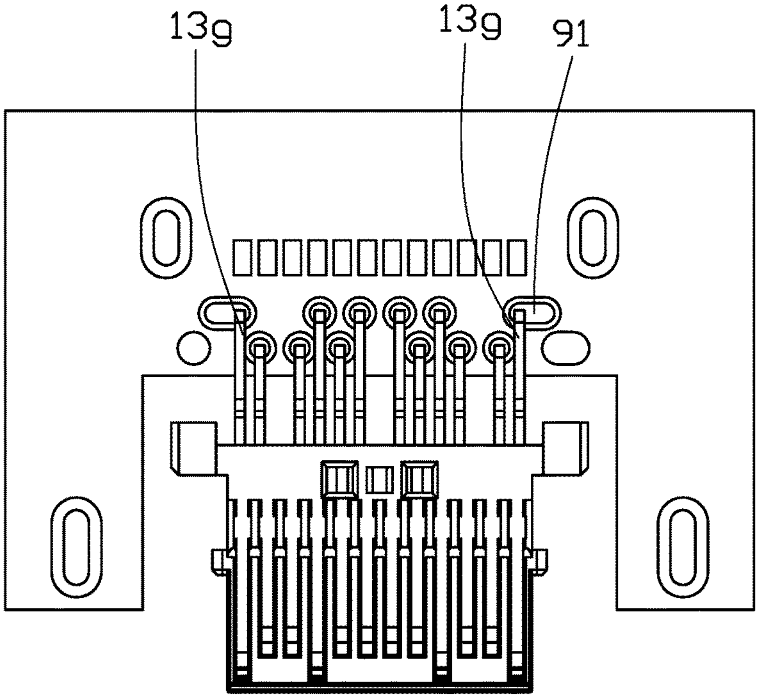
FIG. 3 is a top view of the partial receptacle connector and the PCB of FIG. 2 wherein upper contacts and the shielding plate are taken away.
Figure 4:
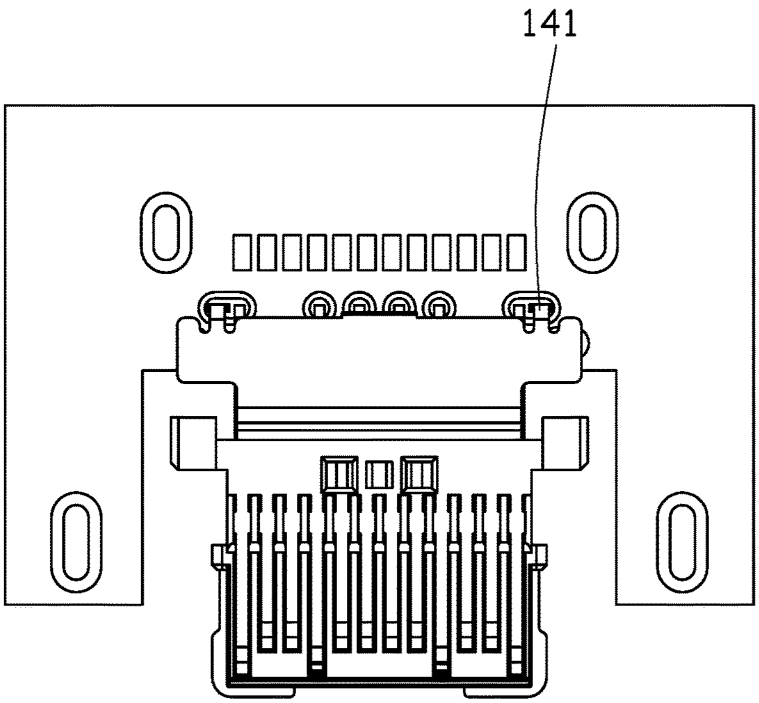
FIG. 4 is a top view of the partial receptacle connector and the PCB of FIG. 2 wherein the upper contacts are taken away.
Figure 5:
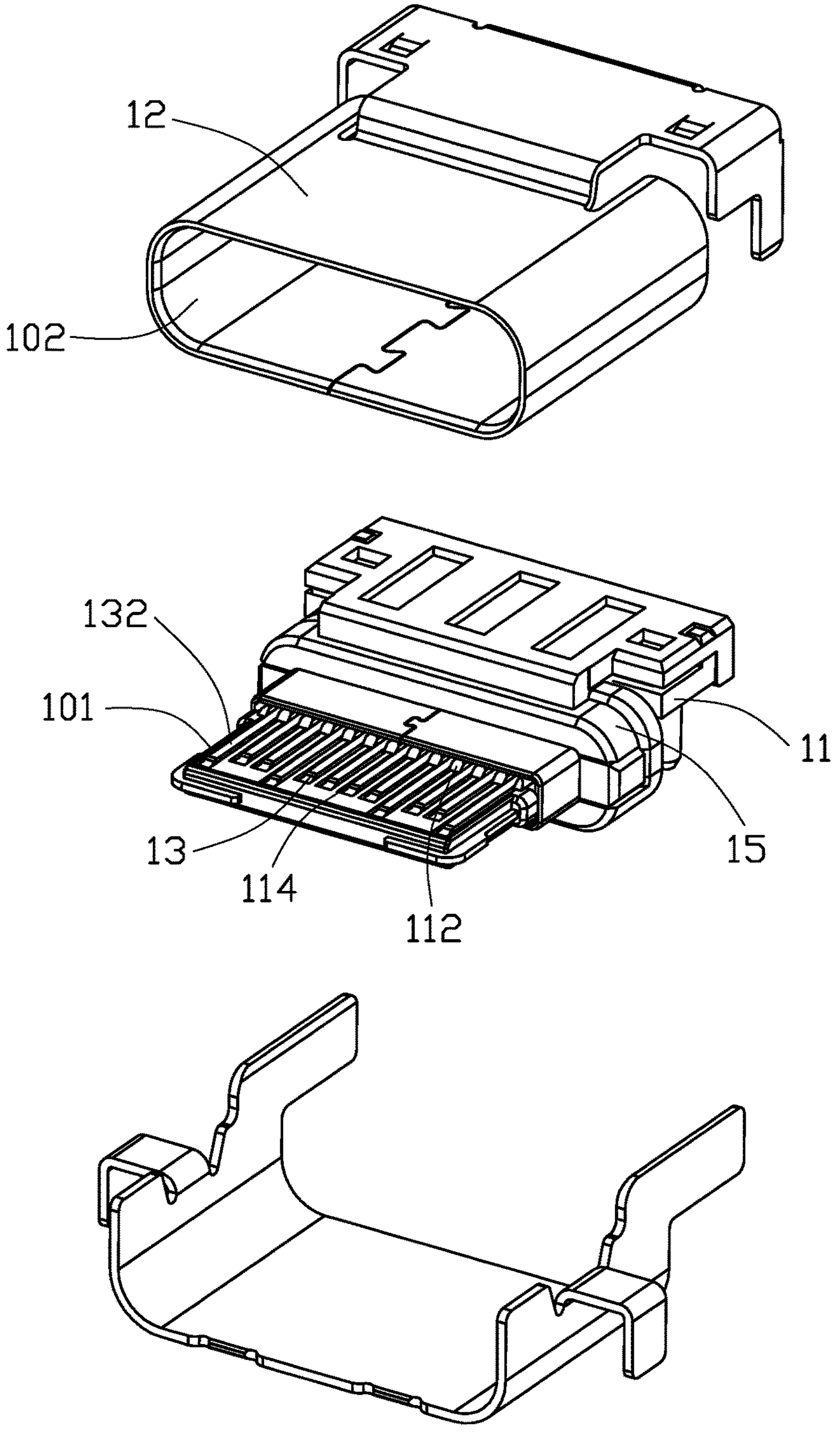
FIG. 5 is a front and toppartially exploded perspective view of the receptacle connector of FIG. 1.
Figure 6:
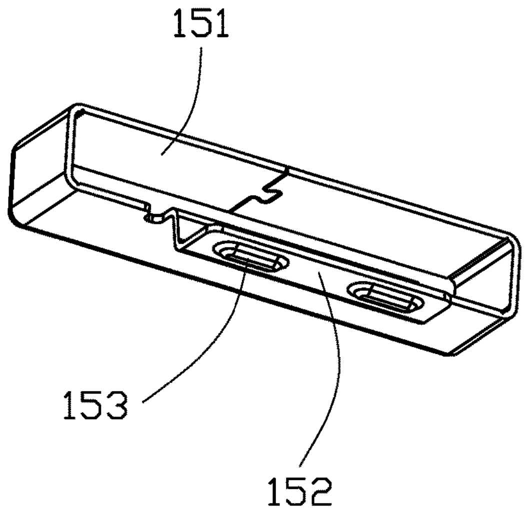
FIG. 6 is an enlarged perspective view of the metallic EMI collar of the receptacle connector.

Reference will now be made in detail to the preferred embodiment of the present invention.

FIGS. 1-12 show a first embodiment of a receptacle connector 100 mounted upon a printed circuit board 900 in a sink manner and a plug connector 200. As shown in FIGS. 1-7, the receptacle connector 100 includes an insulative housing with a mating tongue 101 enclosed in a metallic shell or EMI bracelet 12. A plurality of contacts 13 are disposed in the housing with contacting sections 132 exposed upon two opposite surfaces of the mating tongue 101. Understandably, the contacts 13 include the signal contacts, the grounding contacts and the power contacts thereof. A metallic shielding plate 14 is located at a middle level within the mating tongue 101 with edge portions extending out of the edges of the mating tongue for protection and locking consideration. The leg 141 of the shielding plate 14 and the tail 131 of the outmost grounding contact 13*g* extend into a same oval shaped via 91 of the printed circuit board 900. This common termination arrangement may achieve good signal transmission performance. Understandably, because the receptacle connector 100 is mounted in a notch 92 of the printed circuit board 900 in a sink manner in this embodiment, the tails 131 of the contacts 13 and the shielding plate 14 form the U-shaped structure for compliantly mounted to the printed circuit board 900.

Figure 7:
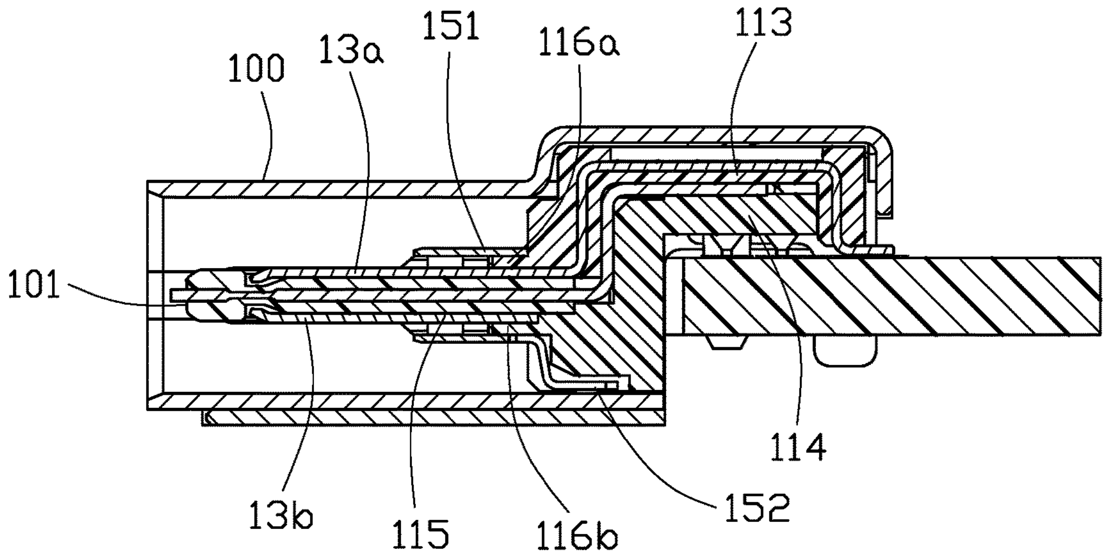
FIG. 7 is a cross-sectional view of the receptacle connector taken along lines 7-7 in FIG. 1.
Figure 8:
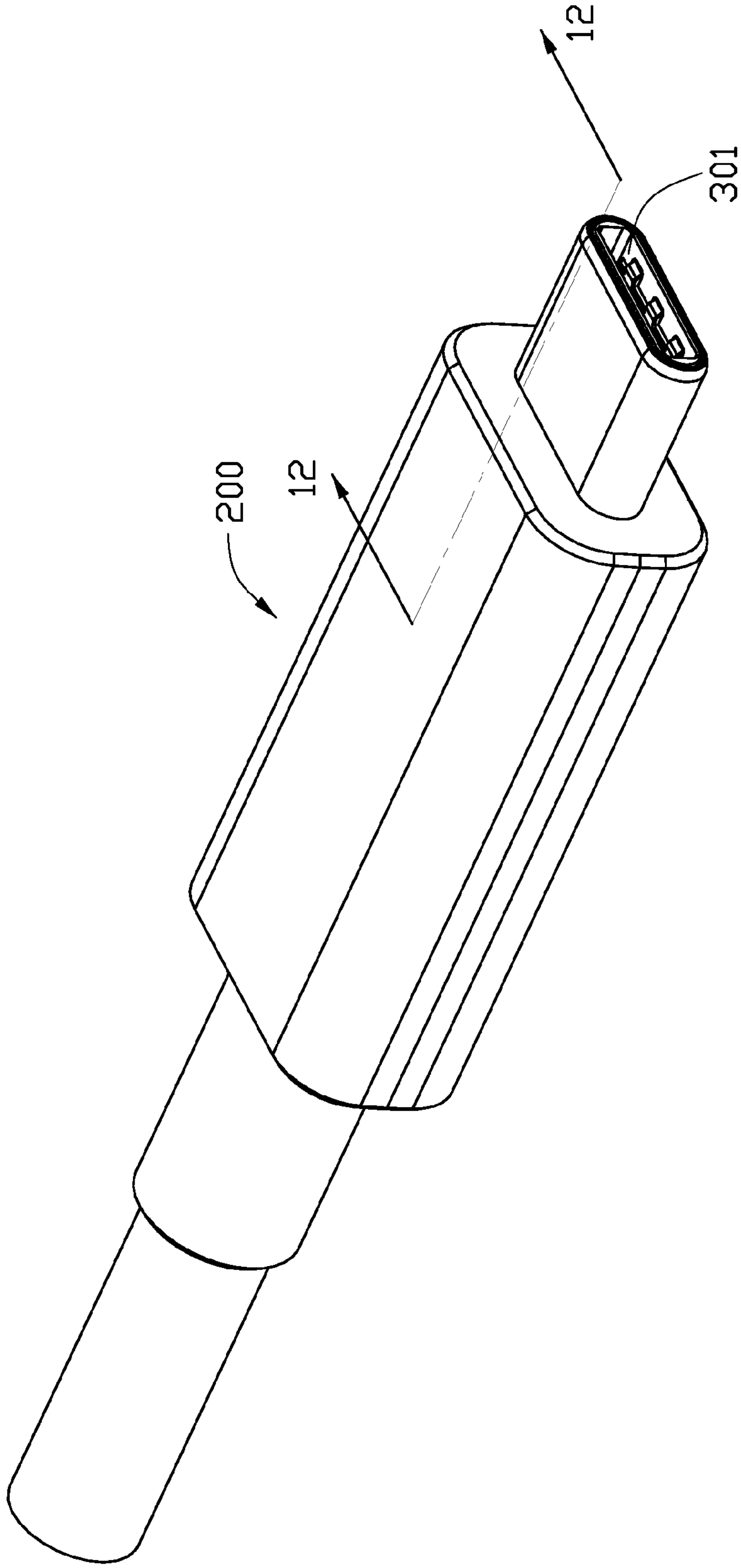
FIG. 8 is a perspective view of a plug connector of the first embodiment of the instant invention.
Figure 9:
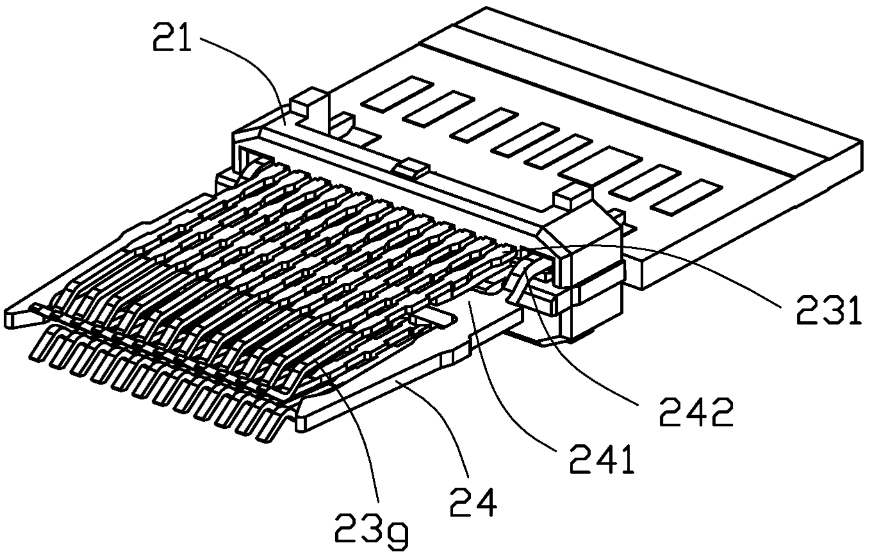
FIG. 9 is an enlarged perspective views of the partial plug connector of FIG. 8 to show the leg of the latch and the tail of the grounding contact share the same grounding pad on the paddle card.
Figure 10:
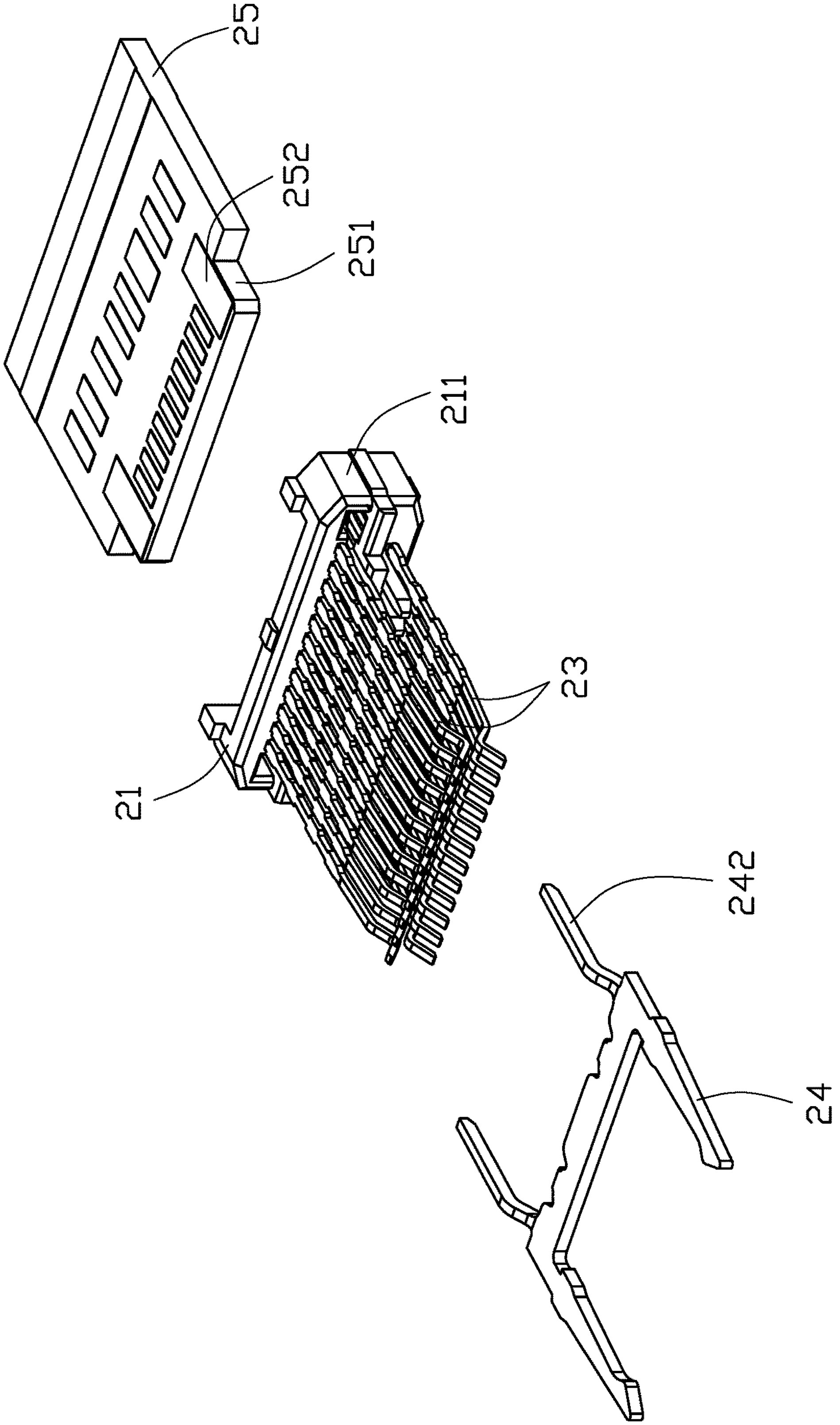
FIG. 10 is an exploded perspective views of the partial plug connector of FIG. 9.
Figure 12:
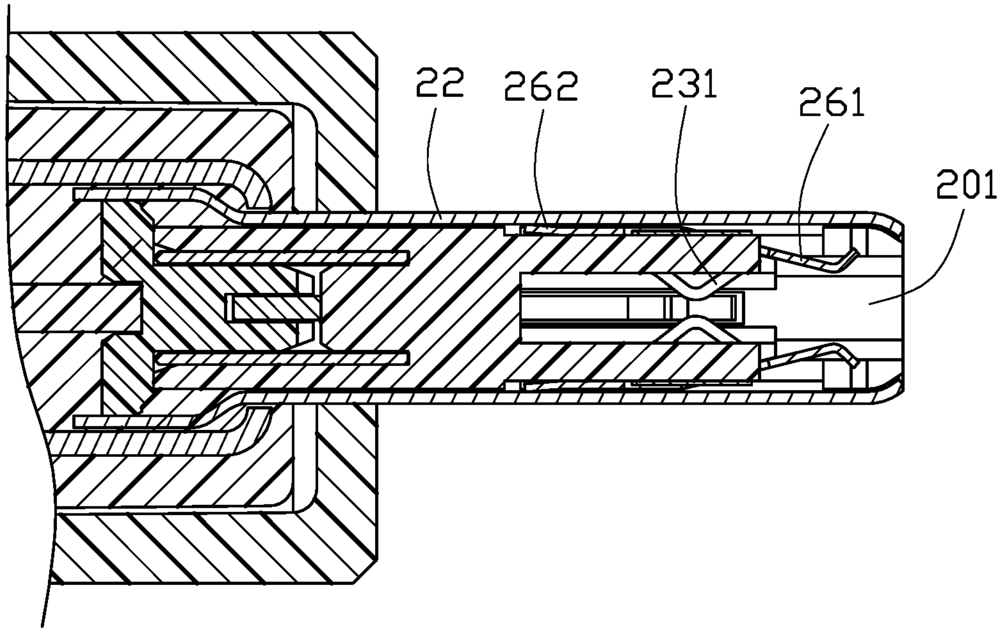
FIG. 12 is an enlarged cross-sectional view of the plug connector taken along lines 12-12 in FIG. 8.
Figure 13:
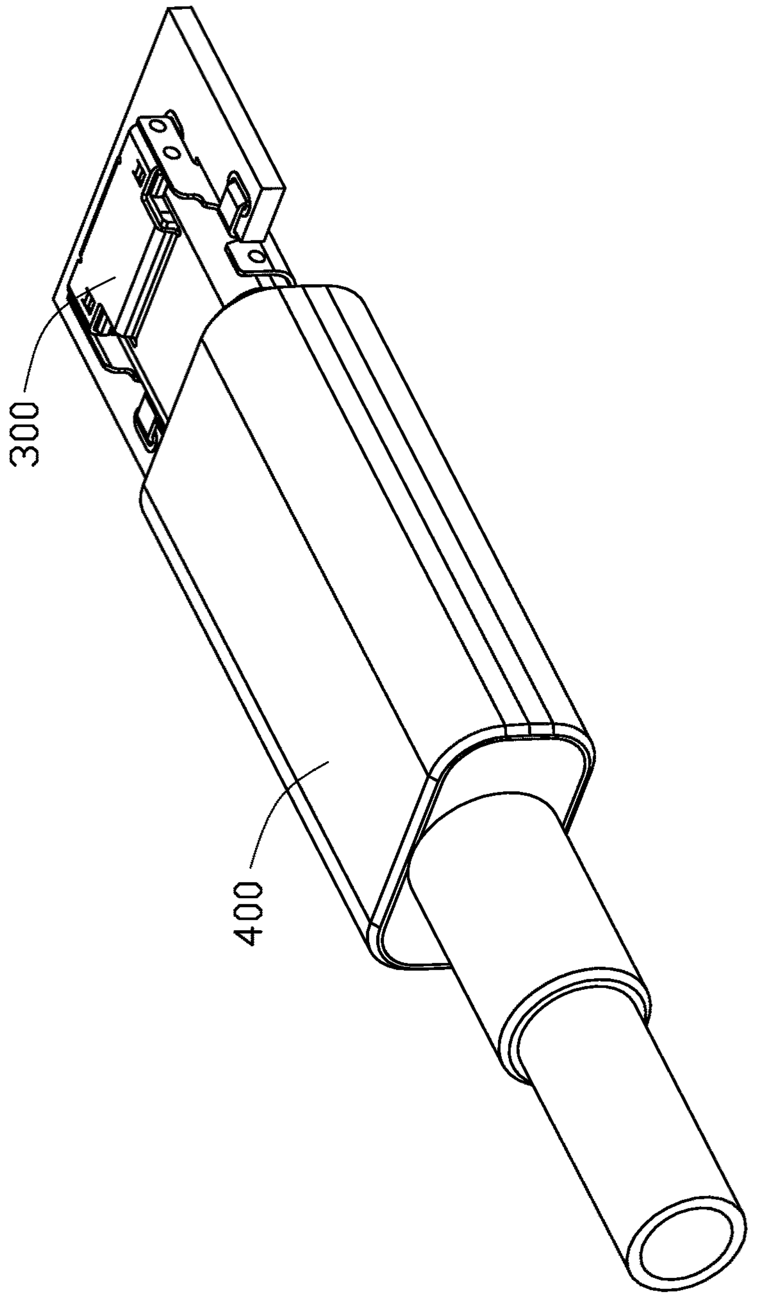
FIG. 13 is an assembled perspective view of a mated receptacle connector on the PCB and a plug connector of a second embodiment of the instant invention.
Figure 14:
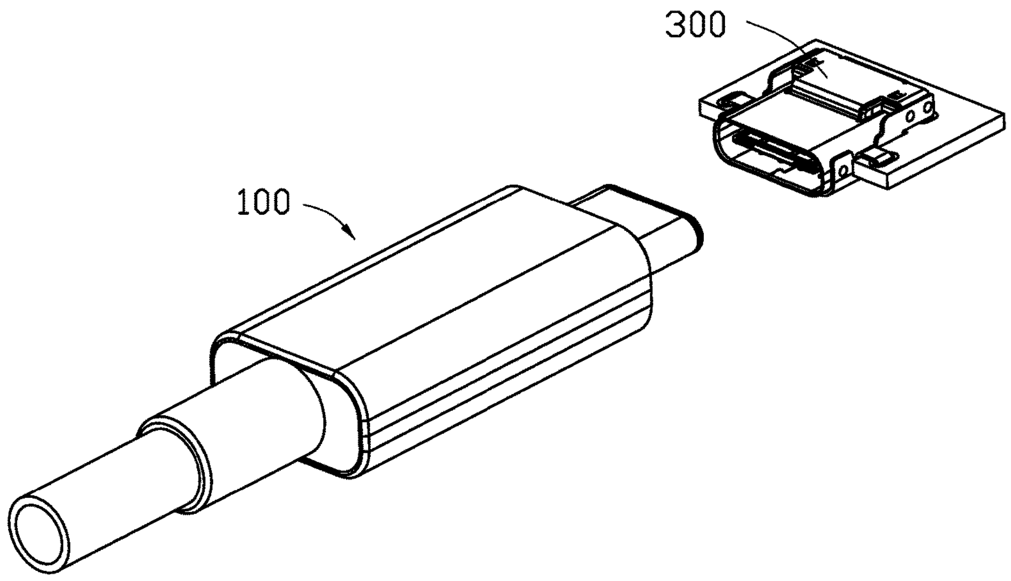
FIG. 14 is a front exploded perspective view of the receptacle connector and the plug connector of FIG. 13.
Figure 15:
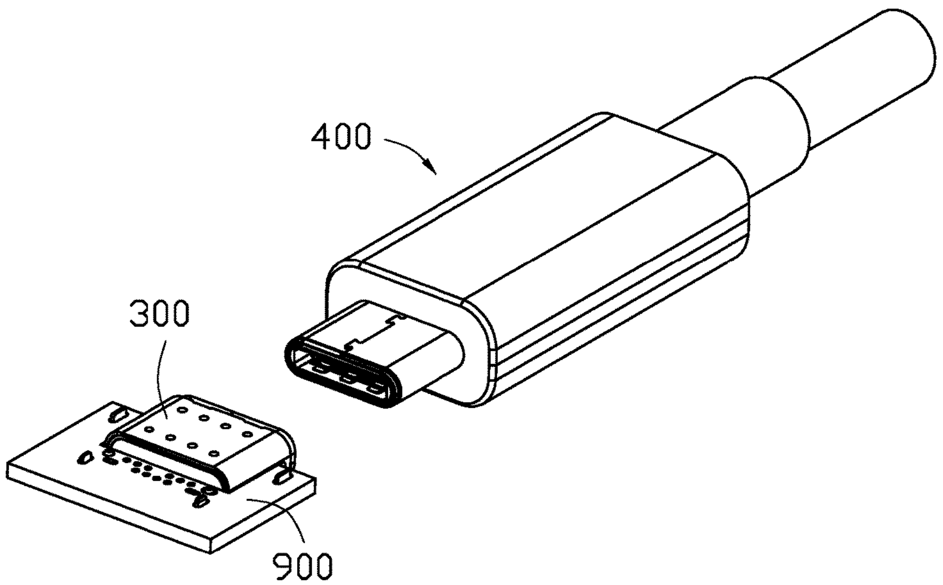
FIG. 15 is a rear exploded perspective view of the receptacle connector and the plug connector of FIG. 13.

As referring to FIGS. 5(A)-7, the receptacle connector 100 includes the insulative housing 11 with the mating tongue 101 forwardly extending in a capsular mating cavity 102 of the metallic shell 12 which encloses the housing 11. Opposite upper and lower rows of contacts 13 are disposed in the housing 11 with corresponding contacting sections 132 seated upon opposite surfaces of the mating tongue 101. A step structure 112 is formed around a root of the mating tongue 101. A one piece metallic EMI collar 15 includes a loop structure 151 intimately surrounding the step structure 112 so as to have a front resilient region 261 of the EMI plate 26 abut thereagainst during mating as best shown in FIG. 12, and a plate structure 152 unitarily extending rearwardly from a rear edge of the loop structure 151 with compression feature 153 thereon to contact the metallic shell 12 (as best shown in FIG. 7). It is noted that because the passageway 114 receiving the corresponding contact 13 is communicative with an exterior in the vertical direction, the corresponding contact 13 may be assembled thereinto in the vertical direction instead of forwardly in a front-to-back direction.

The metallic shell 12 of the receptacle connector 100 includes a top/inner part 122 and a bottom/outer part 123 wherein the top/inner part 122 forms the capsular mating cavity 102 while the bottom/outer part 123 forms the corresponding mounting legs 1231 mounted with the corresponding mounting holes 93 (labeled in FIG. 1) in the printed circuit board 900.

As shown in FIG. 7, the insulative housing 11 of receptacle connector 100 is composed of the upper piece 113 and a lower piece 114 commonly sandwiching therebetween a middle piece 115 which forms the mating tongue 101. The upper row contacts 13*a* are associated with the upper piece 113, the lower row contacts 13*b* with a lower piece 114 and the shielding plate 14 is associated with the middle piece 115. The feature of this embodiment includes a rear portion of the step structure 112 is removed to have a front edge region 116*a* of the upper piece 114 and the front edge region 116*b* of the lower piece 114 sandwiched between the middle piece 115 and the loop structure 151 of the EMI collar 15 so as to enhance the strength during mating under some bending.

FIGS. 8-12 show the plug connector 200 which is adapted for mating with the receptacle connector 100 of the first embodiment, which defines a front mating cavity 301 to receiving the mating tongue 101 of the receptacle connector 100. The plug connector 200 includes an insulative housing 21 having a base 211 defining rear receiving cavity (not shown) to receive a front edge region 251 of the paddle card 25, and the front mating cavity 201 to receive the mating tongue 101 of the receptacle connector 100. Two rows of contacts 23 are disposed in the housing by two sides of the mating cavity 201 in the vertical direction and are categorized with signal contacts, grounding contacts and power contacts. A pair of latches 24 are disposed in the housing by two opposite transverse ends of the mating cavity 201 wherein the rear leg 242 of the latch 24 and the tail 231 of the outmost grounding contact 23*g* are commonly mounted upon the same grounding pad 252 of the paddle card 25 for optimal transmission performance. The pair of latches 24 is transversely jointed together by a transverse bridge 241 which is located between the two rows of contacts 23.

Figure 11:
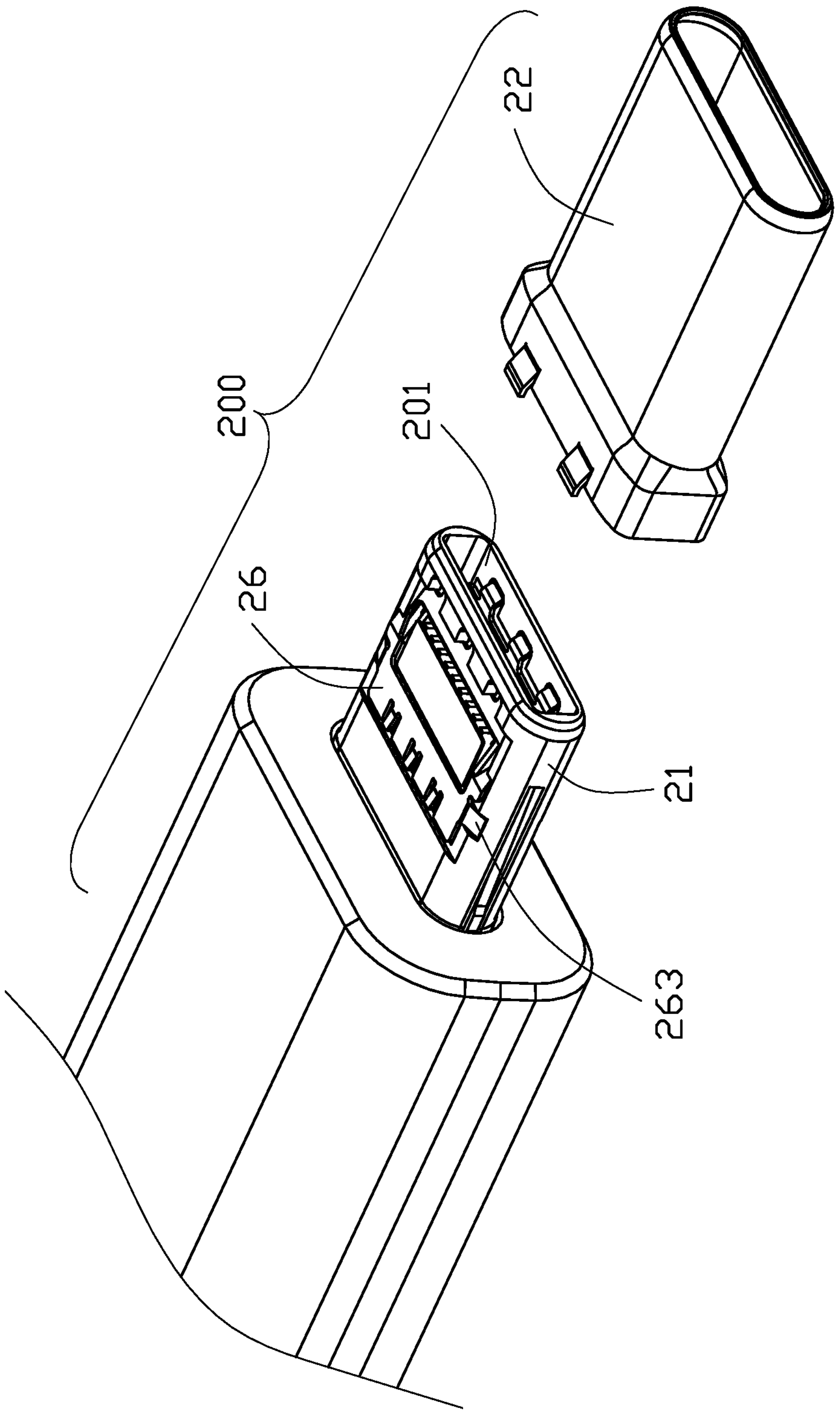
FIG. 11 is an enlarged exploded perspective view of the plug connector of FIG. 8.

As shown in FIGS. 11-12, the insulative housing 21 of the plug connector 200 has a capsular front contour with the rectangular receiving cavity 201 therein and enclosed in a metallic shell 22. Opposite upper and lower rows of contacts 23 are disposed in the housing with corresponding contacting sections 231 extending into the receiving cavity 201. A pair of upper and lower EMI (Electro-Magnetic Interference) plates 26 are enclosed in the shell 22, and each of the EMI plates 26 is sandwiched between the shell 22 and the housing 21 and includes a front resilient region 261 extending inwardly toward the receiving cavity 201 and in front of the contacting sections 231, a rear abutting region 262 to abut against the shell 22, and a pair of side retention regions 263 retainably engaged within corresponding side portions of the housing 21. The shell 22 of the plug connector includes a pair of bent tags (not shown) mechanically and electrically connected to the corresponding grounding pads of the paddle card 25 for EMI.

FIGS. 13-27 show a second embodiment of a plug connector 400 mated with a receptacle connector 300 mounted in the notch 92 of the printed circuit board 900, which is similar to the first embodiment as shown in FIGS. 1-12 with some different which will be described hereinafter.

Figure 16:
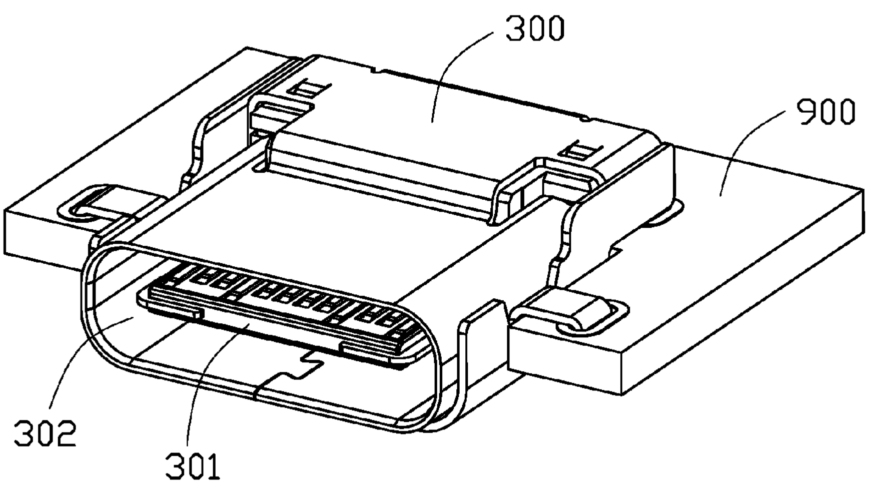
FIG. 16 is a front perspective view of the receptacle connector on the printed circuit board of FIG. 13.
Figure 17:
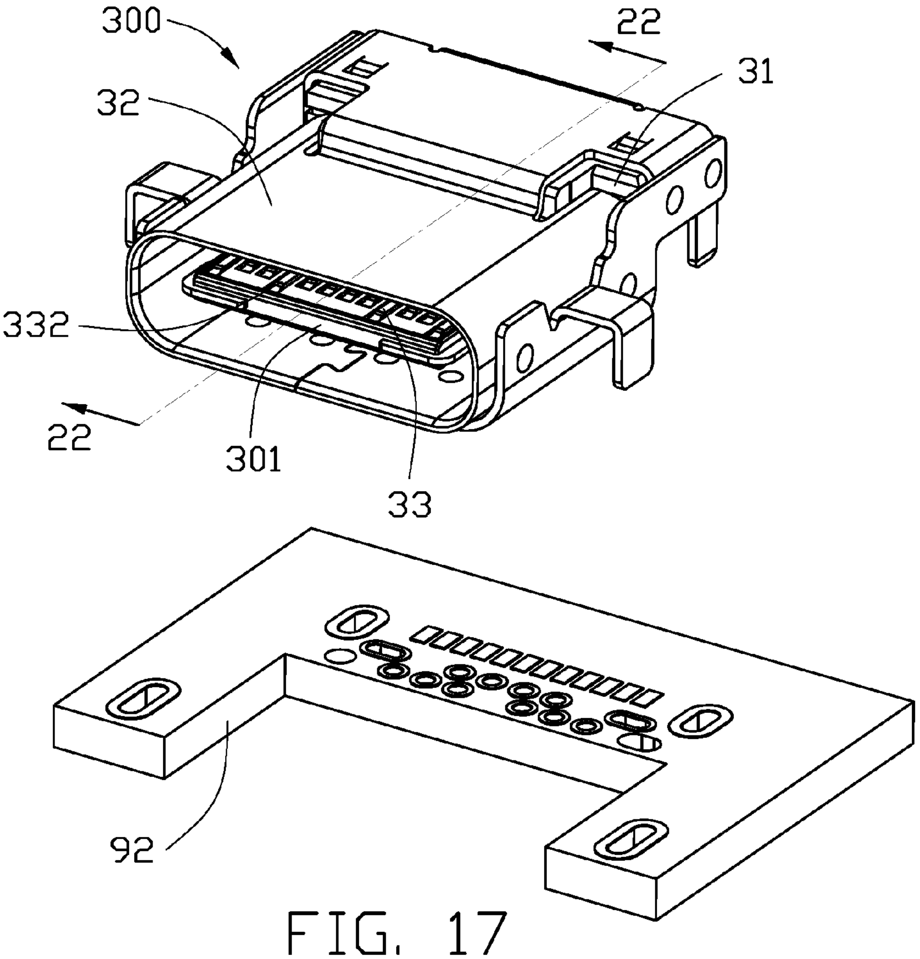
FIG. 17 is a front perspective view of the receptacle connector spaced from the printed circuit board of FIG. 13.
Figure 18:
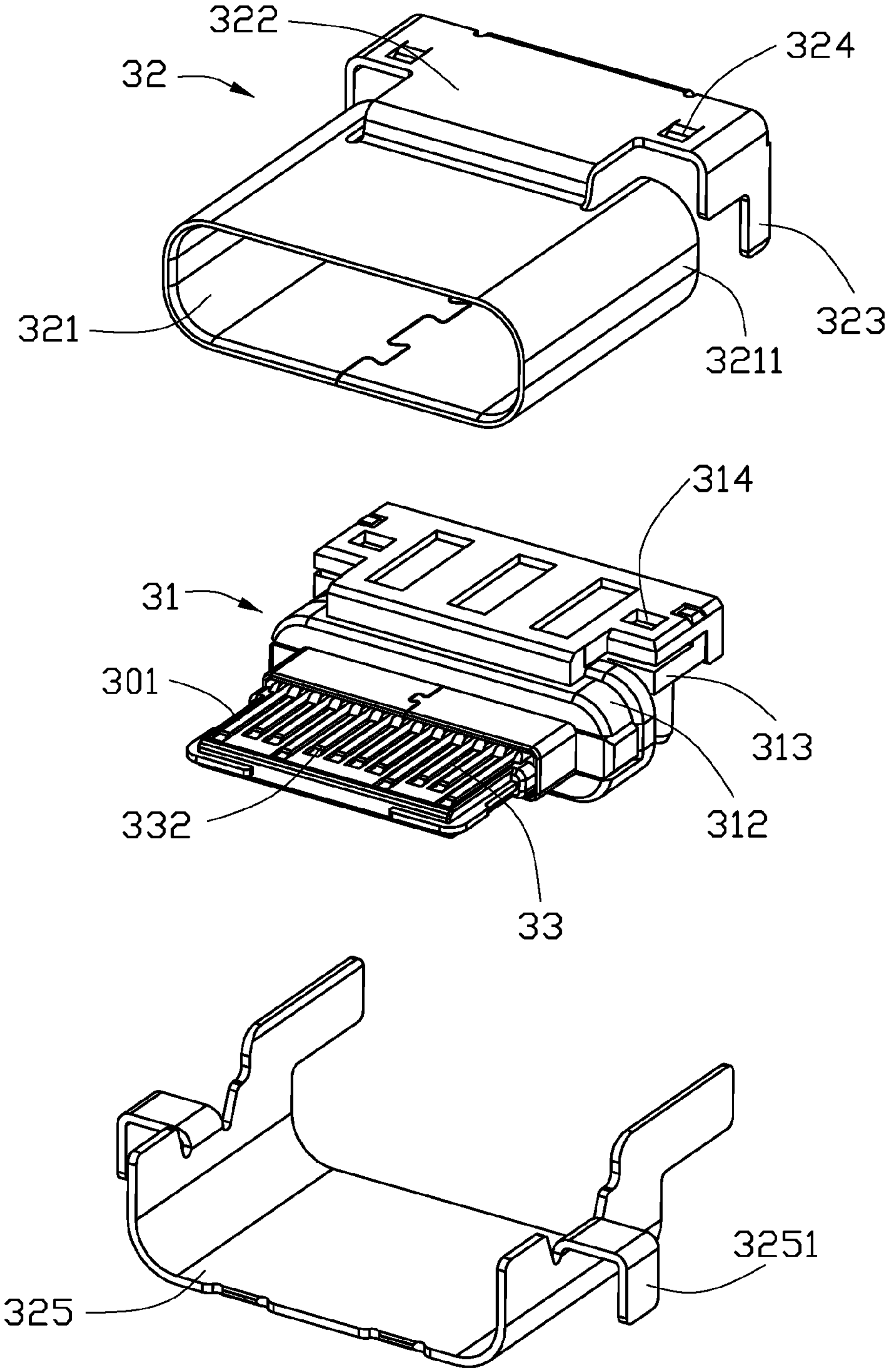
FIG. 18 is a front partially exploded perspective view of the receptacle connector of FIG. 13.

Referring to FIGS. 16-17, the receptacle connector 300 includes an insulative housing/contact seat 31 with a mating tongue 301 forwardly extending in a capsular mating cavity 302 of a metallic shell 32 which encloses the housing 31. Opposite upper and lower rows of contacts 33 are disposed in the housing 31 with corresponding contacting sections 332 exposed upon opposite surfaces of the mating tongue 301 in a diagonally symmetrical arrangement mechanically and electrically so as to allow a so-called flappable insertion of the plug connector 400 thereinto. Combination with FIG. 19, a step structure 311 is formed around a root of the mating tongue 301. A one piece metallic EMI collar 35 includes a loop structure 351 intimately surrounding the step structure 311.

Referring to FIGS. 18(A)-18(B), the insulating housing 31 further includes a retaining base 312 of a capsular shape, the mating tongue 301 extending forward from the retaining base 312 and a rear mounting portion 313 extending rearward from a top edge of the retaining base 312. The step structure 311 is disposed at a joint of the mating tongue and the retaining base. The metallic shell 32 includes a capsular main portion 321 surrounding the mating tongue 301 to define said mating cavity 302 with a rear edge 3211 being retained on the retaining base 312, and a rear top portion 322 extending rearward and covering on the rear mounting portion 313 of the insulating housing. The metallic shell 32 further includes a pair of mounting legs 323 extending downwards from lateral sides of the rear top portion 322 for mounting to the printed circuit board 900 and a pair of locking tabs 324 received in the recesses 314 of the rear top portion 313 after the metallic shell 32 is rearwardly assembled to the housing 31 in a front-to-back direction. A metallic bracket 325 is soldered under the shell 32 and forms a pair of supporting legs 3251 mounted to the printed circuit board 900 for supporting the receptacle connector 300 within the notch 92 of the printed circuit board.

Figure 20A:
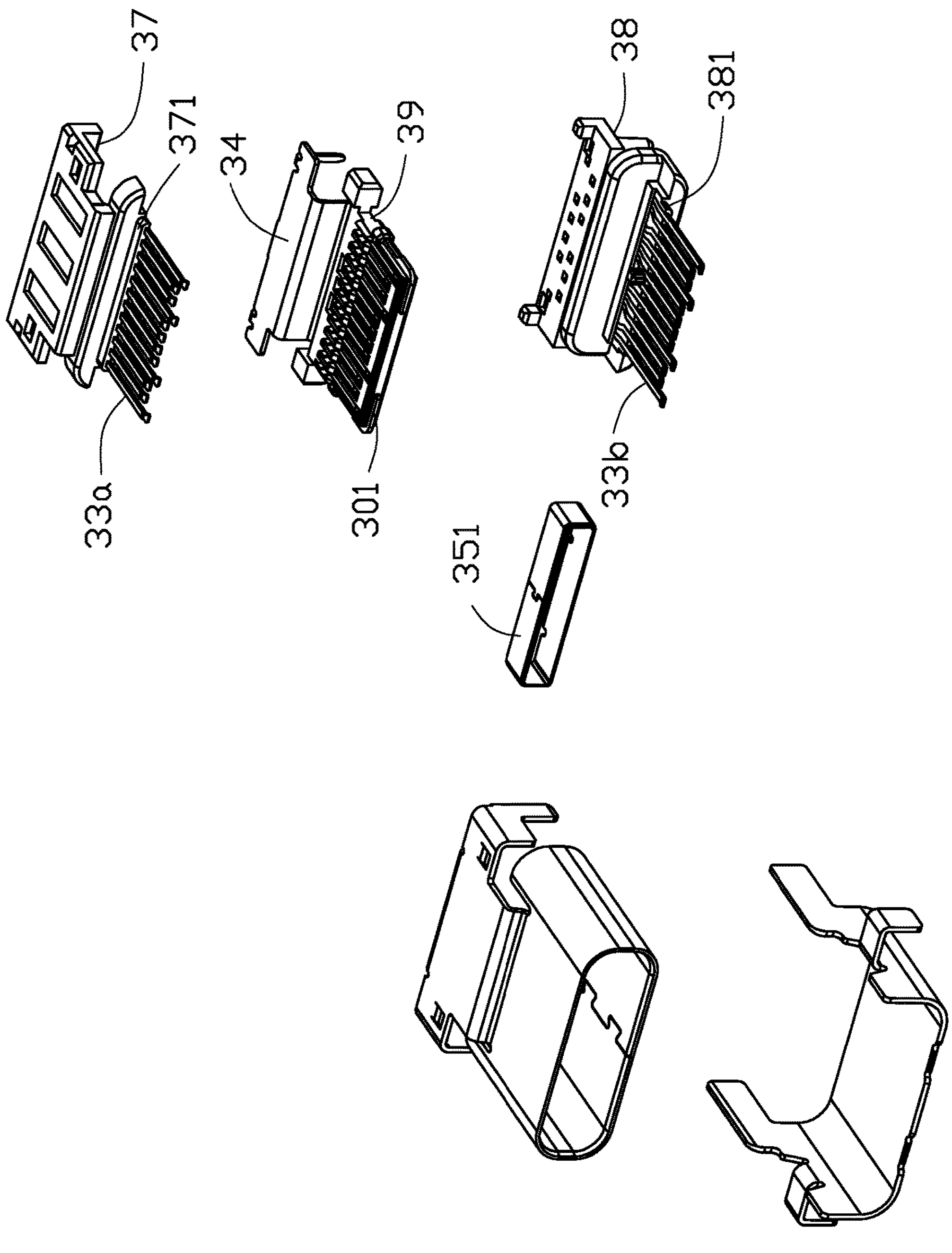
FIG. 20(A) is a front partially exploded perspective view of the receptacle connector of FIG. 13.
Figure 20B:
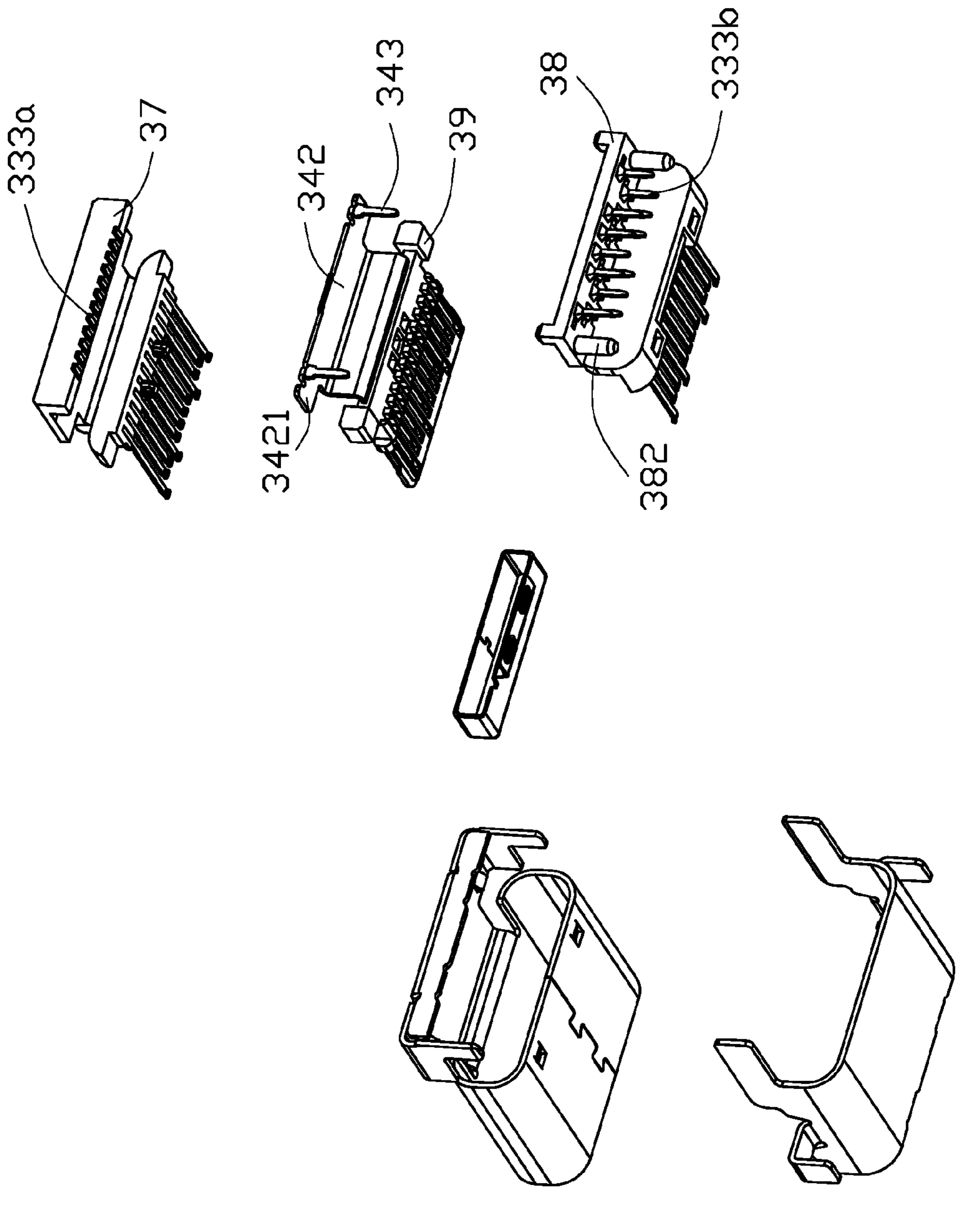
FIG. 20(B) is a rear partially exploded perspective view of the receptacle connector of FIG. 13.

As best shown in FIG. 20(A)-20(B), the insulating housing 31 is composed of the upper piece 37 and a lower piece 38 commonly sandwiching therebetween a middle piece 39 which forms the mating tongue 301. The upper row contacts 33*a* are associated with the upper piece 37, the lower row contacts 33*b* associated with a lower piece 38 and the shielding plate 34 is associated with the middle piece 39 via an insert molding process wherein the contacting sections

332 of the upper row contacts 33*a* and those of the lower rows contacts 33*b* are seated upon opposite upper surface and lower surface of the mating tongue 301, respectively, as mentioned before. A rear portion of the step structure 312 is removed to, as best shown in FIG. 19, have a front edge region 371 of the upper piece 37 and the front edge region 381 of the lower piece 38 sandwiched between the middle piece 39 and the loop structure 351 of the EMI collar 35 so as to enhance the strength during mating under some bending.

In this embodiment, the shielding plate 34 defines a rear portion 342 extending from the mating tongue 301, a vertical middle portion 349 connecting with the front portion 341 and the rear portion, and a pair of mounting legs 343 bending downwards from the rear edge of the rear portion 342 so as to efficiently separate the upper row contacts 33*a* and the lower row contacts 33*b* from each other wherein the upper row contacts 33*a* form the surface mount type tail sections 333*a* while the lower row contacts 33*b* form the through hole type tail sections 333*b*. The lower piece 38 includes a pair of mounting posts 382 for mounting the housing 31 to the printed circuit board 900. The rear portion 342 of the shielding plate further extend a pair of lateral wings 3421 from opposite sides of the rear portion 342, the pair of lateral wings 3421 are disposed in the base of the insulative housing.

Figure 21A:
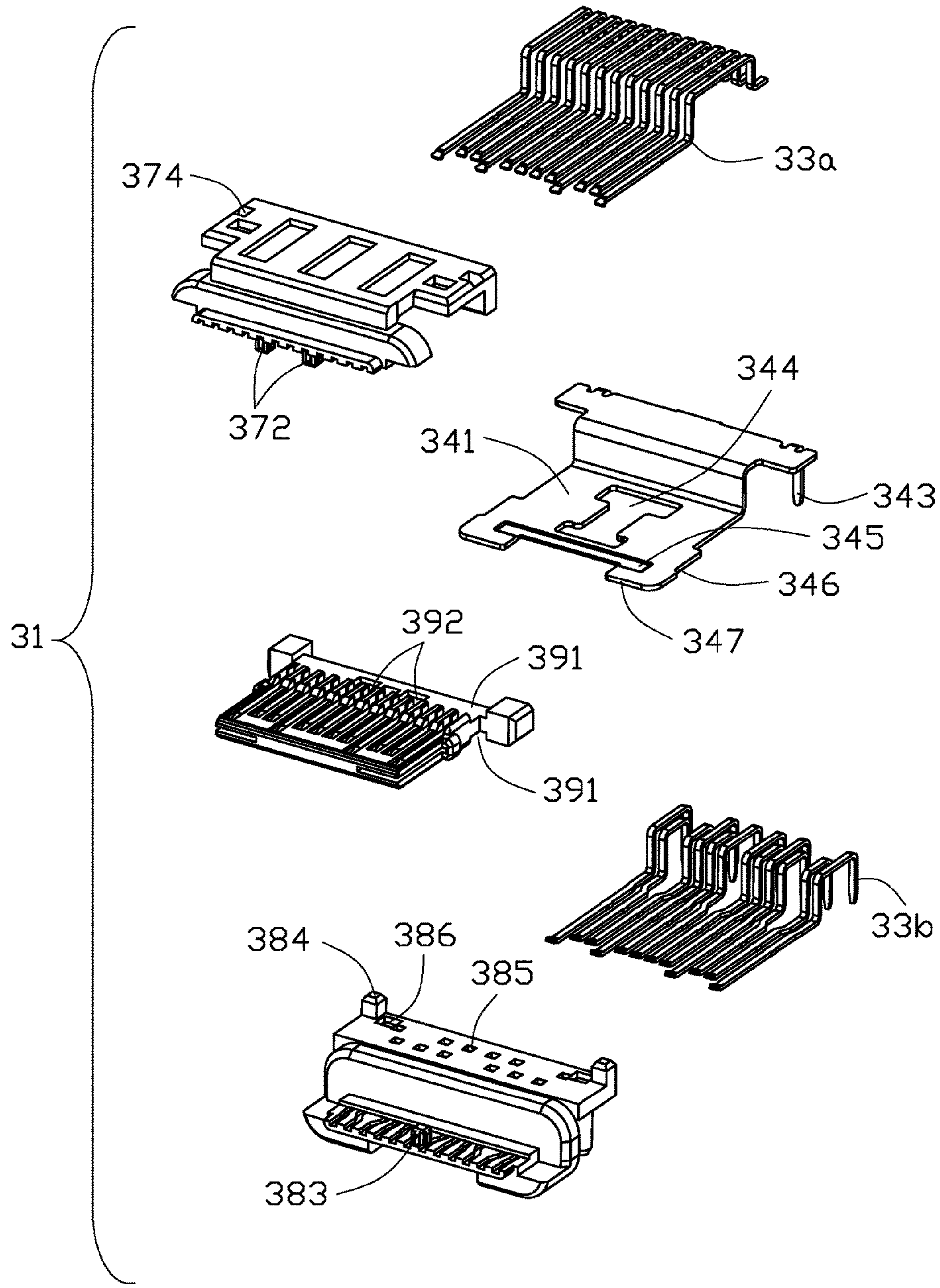
FIG. 21(A) is a front partially exploded perspective view of the receptacle connector of FIG. 13 to show the housing and the contacts thereof.
Figure 21B:
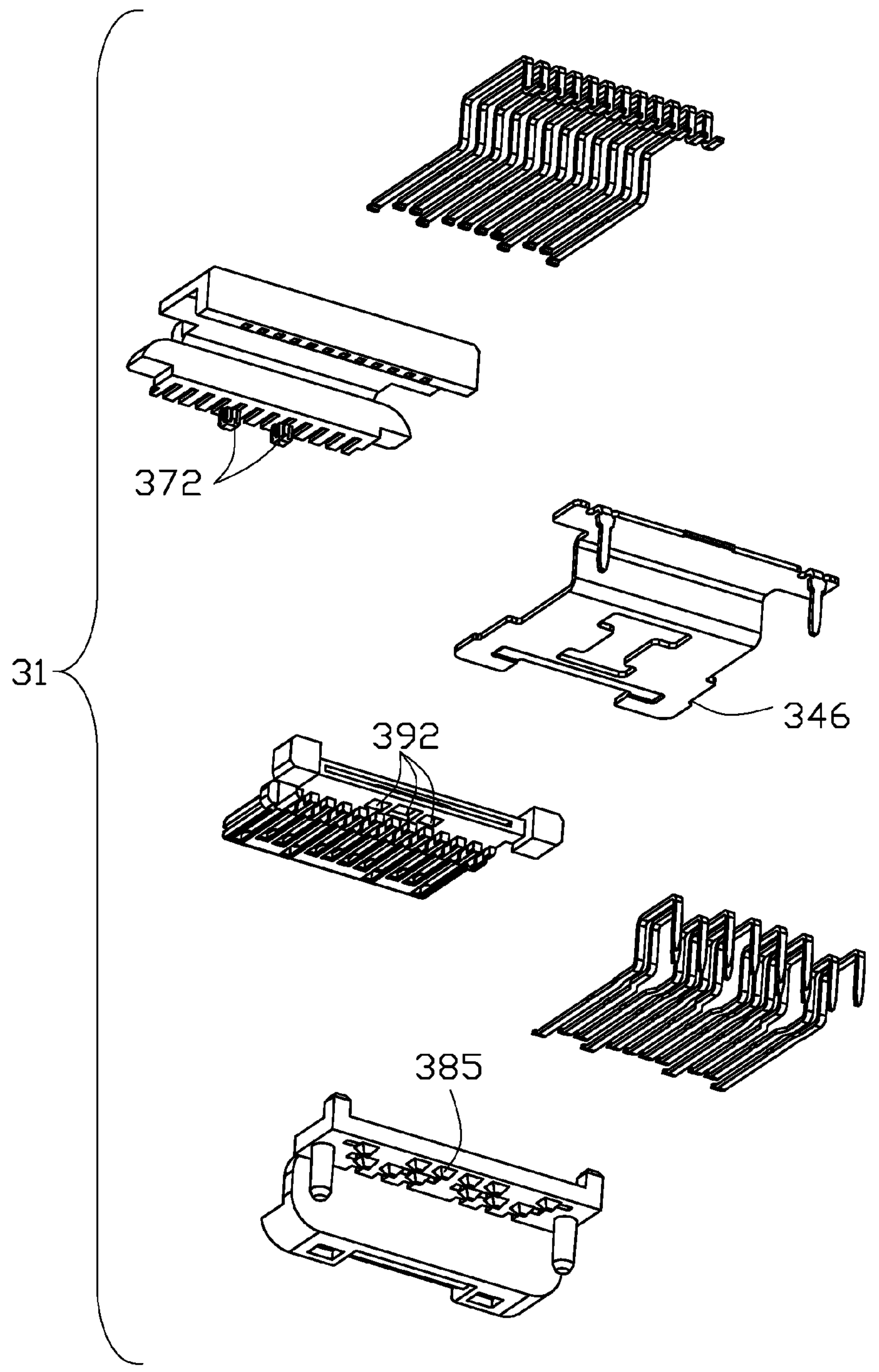
FIG. 21(B) is a rear partially exploded perspective view of the receptacle connector of FIG. 13 to show the housing and the contacts thereof.
Figure 22:
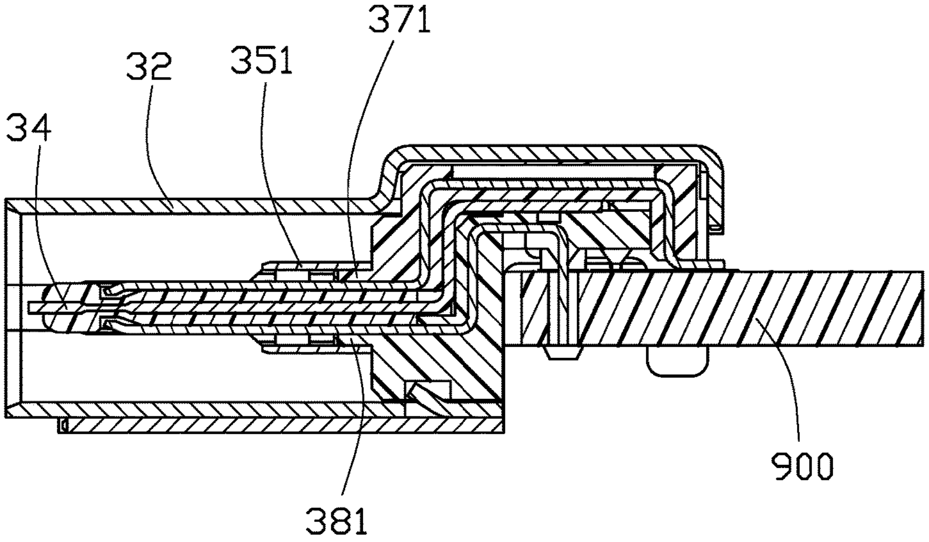
FIG. 22 is a cross-sectional view of the receptacle connector on the printed circuit board of FIG. 13.
Figure 23:
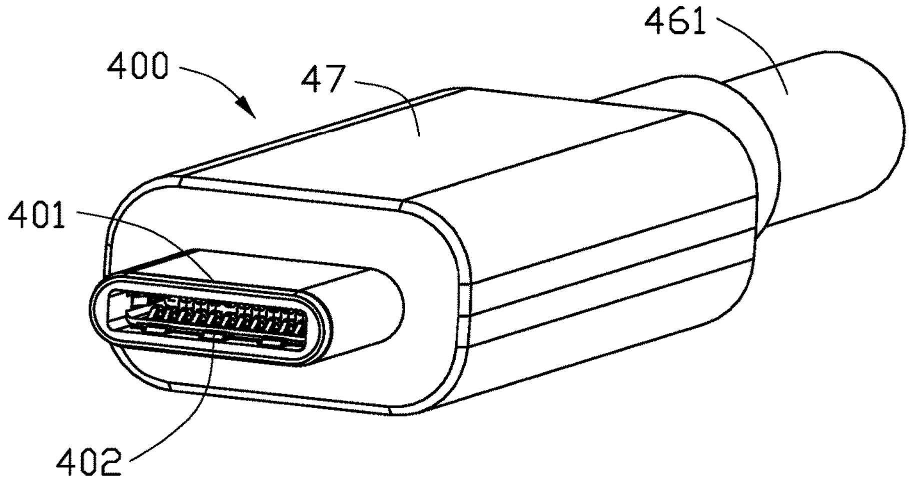
FIG. 23 is a front assembled perspective view of the plug connector of FIG. 13.
Figure 24A:
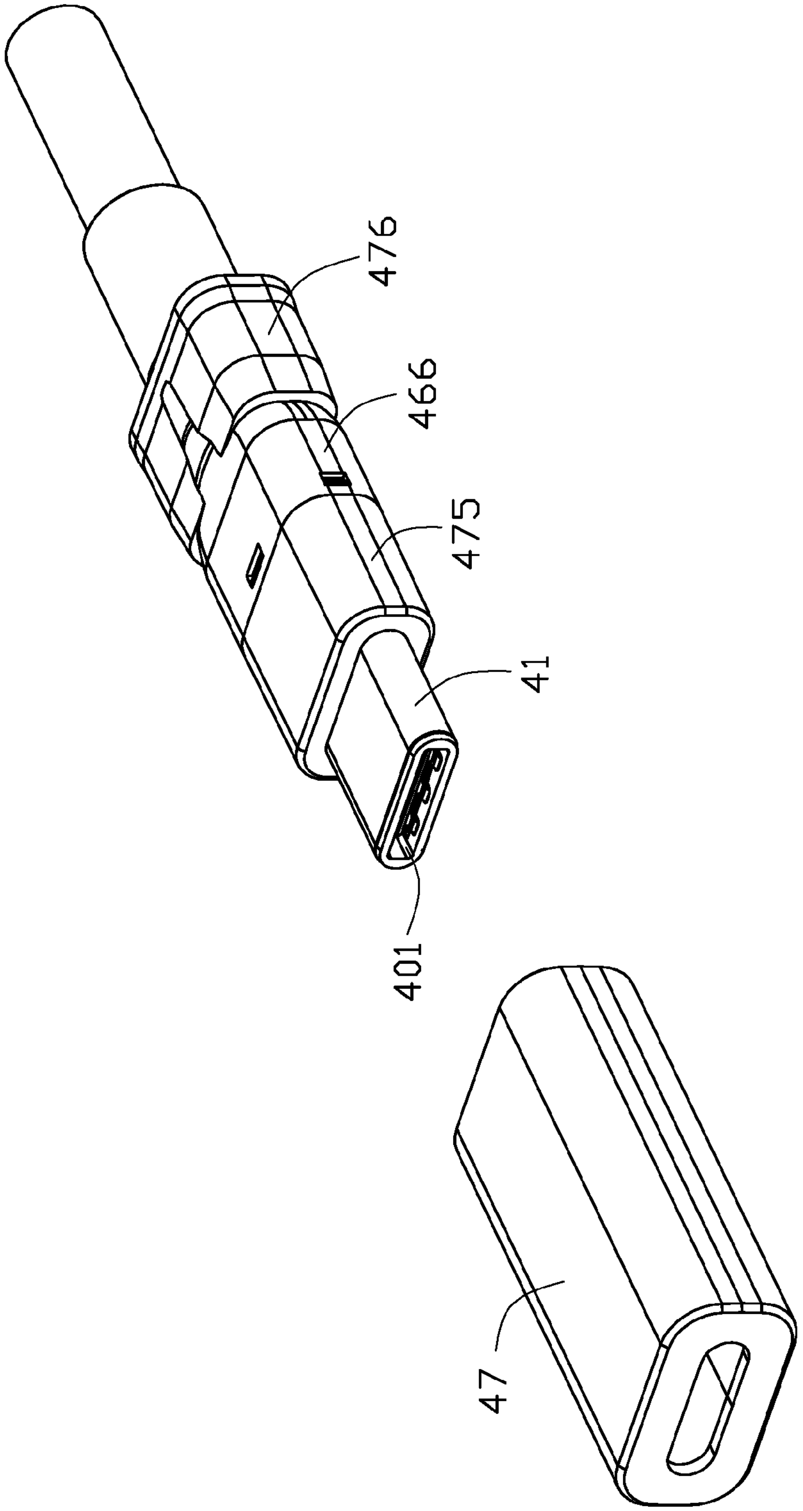
FIG. 24(A) is a front partially exploded perspective view of the plug connector of FIG. 13 wherein the cover is removed away from the remainder.
Figure 24B:
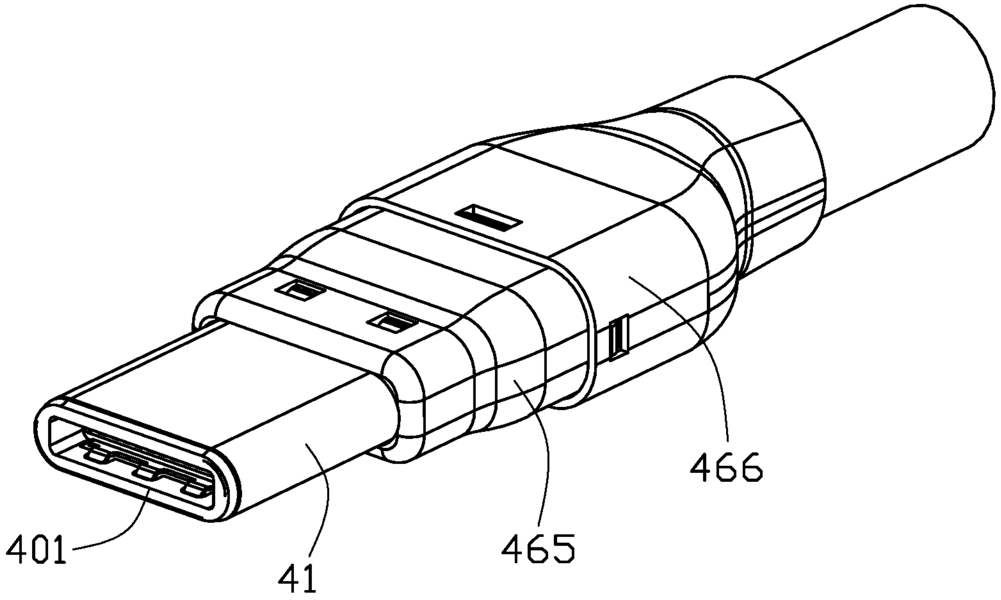
FIG. 24(B) is a front partially exploded perspective view of the plug connector of FIG. 23(A) wherein the front and rear over-moldings have been further removed.
Figure 25:
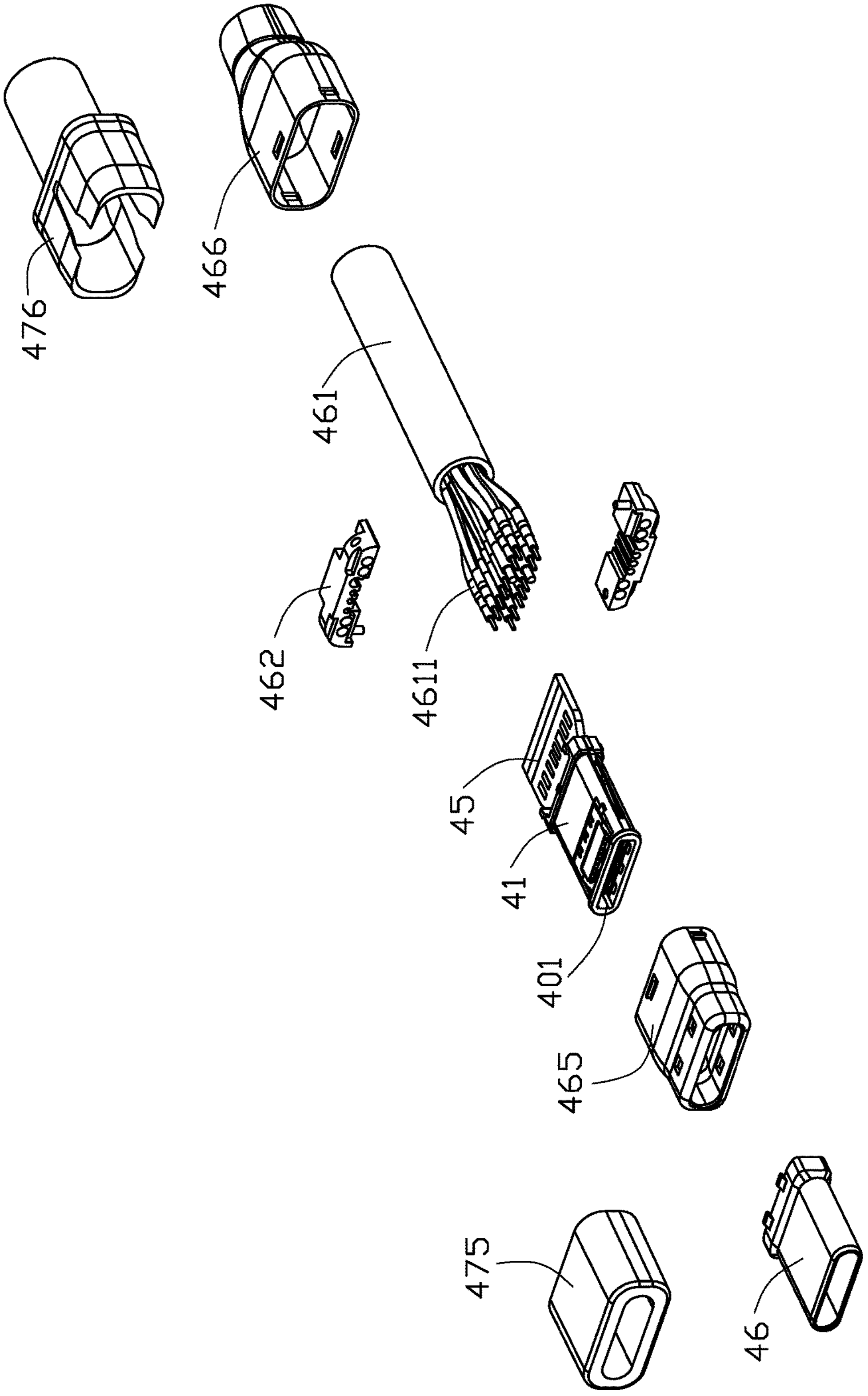
FIG. 25 is a front partially exploded perspective view of the plug connector of FIG. 13 without the cover thereof.
Figure 26:
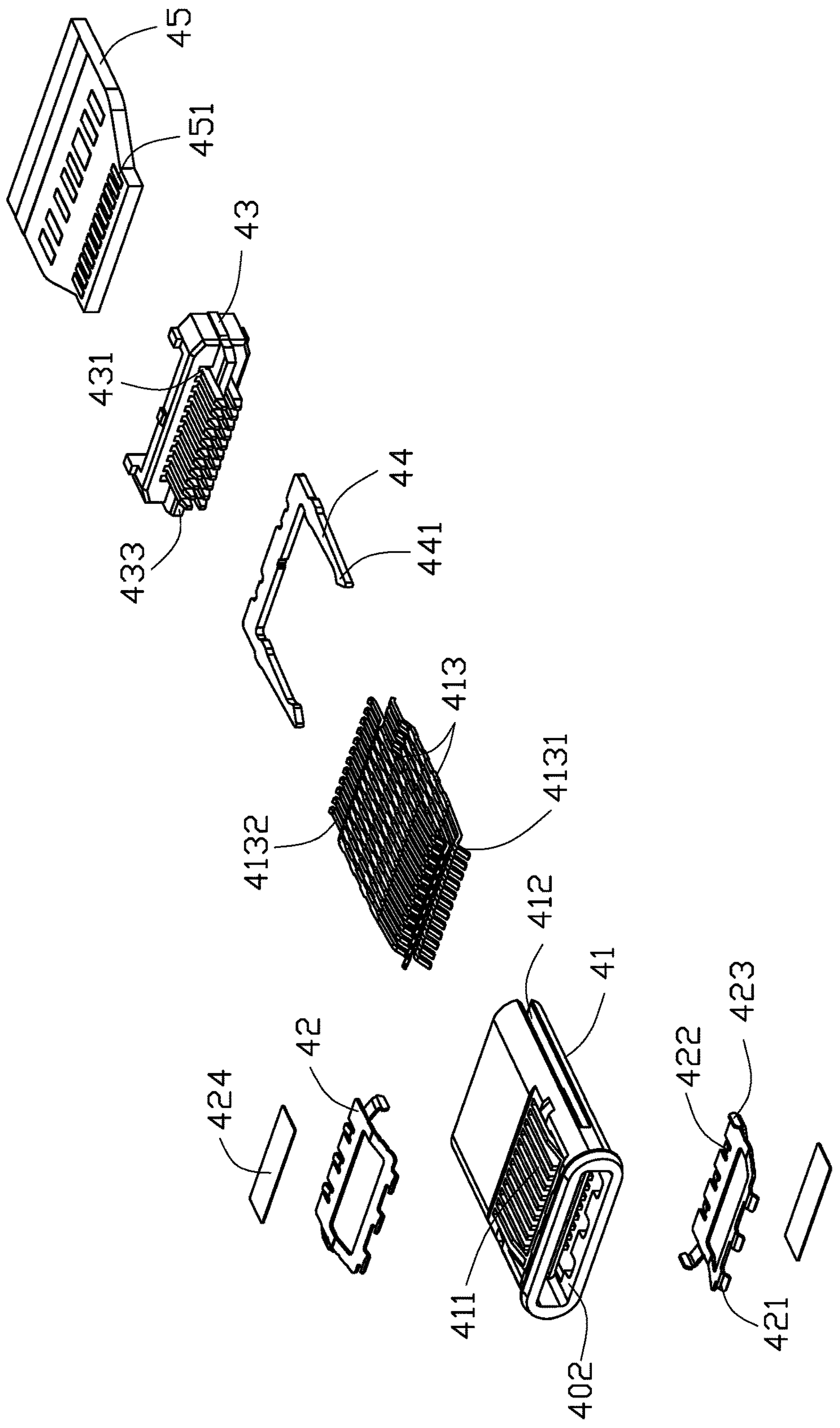
FIG. 26 is a front partially exploded perspective view of the plug connector of FIG. 24(A) by removal of additional parts therefrom.

Referring to FIGS. 21(A)-21(B), in this embodiment, the shielding plate 34 defines an opening 344 and a thinner area 345 at a front portion 341 for both securing and impedance consideration. Notably, the shielding plate 34 forms a front edge section 347 extending forwardly beyond a front edge of the mating tongue 301 for anti-mismating consideration, and a pair of lateral edge sections 346 for locking with a latch 44 of the plug connector 400 (illustrated later).

Figure 19:
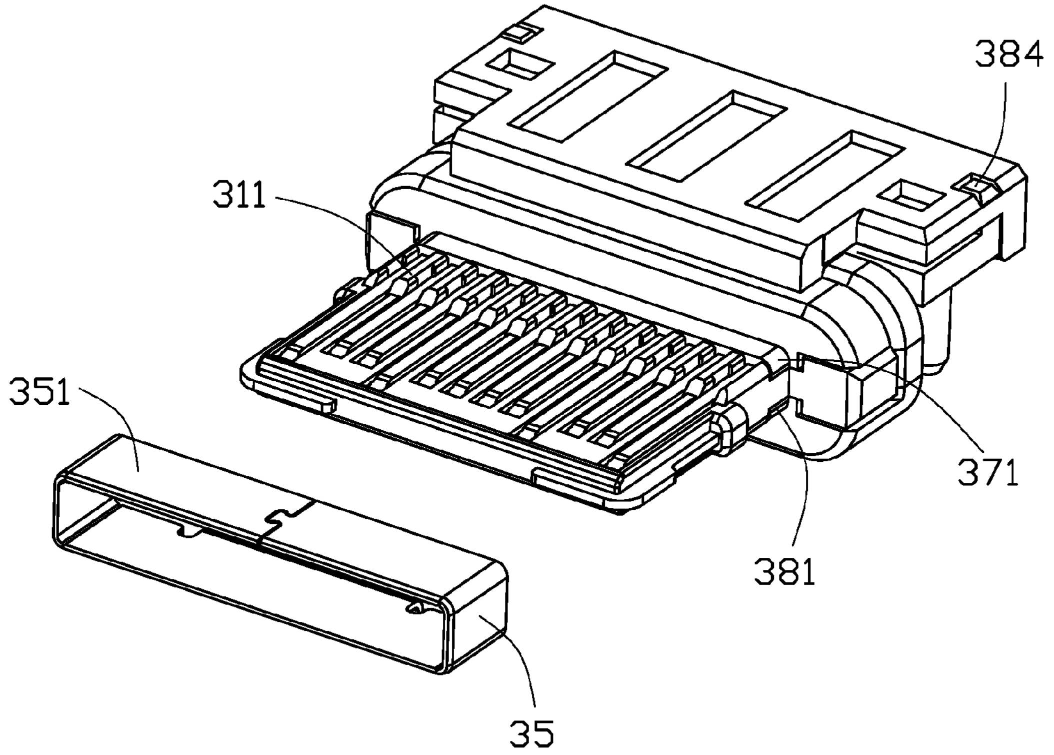
FIG. 19 is a front partially exploded perspective view of the receptacle connector of FIG. 13 without the shield thereof.

The middle piece 39 forms a pair of recesses 391 to respectively receive the front edge region 371, 381 of the upper and lower pieces 37, 38 as labeled in FIG. 20(A) and holes 392 defined in the recesses 391 to respectively receive corresponding protrusion posts 372 of the upper piece 37 for securing the upper piece 37 and the middle piece 39 therebetween in a stacked manner wherein the lower piece 38 further forms a pair of upward locating posts 384 received within the corresponding recesses 374 in the upper piece 37, combination with FIG. 19. In this embodiment, the lower piece 38 defines a plurality of through holes 385 and 386 to receive the tail sections 333*b* of the lower row contacts 33*b* and the mounting legs 343 of the shielding plate 34 to extend therethough as an alignment spacer. In brief, the shielding plate 34 is essentially multifunctional to perform shielding, grounding, reinforcing, anti-mis-mating and locking.

Figure 27:
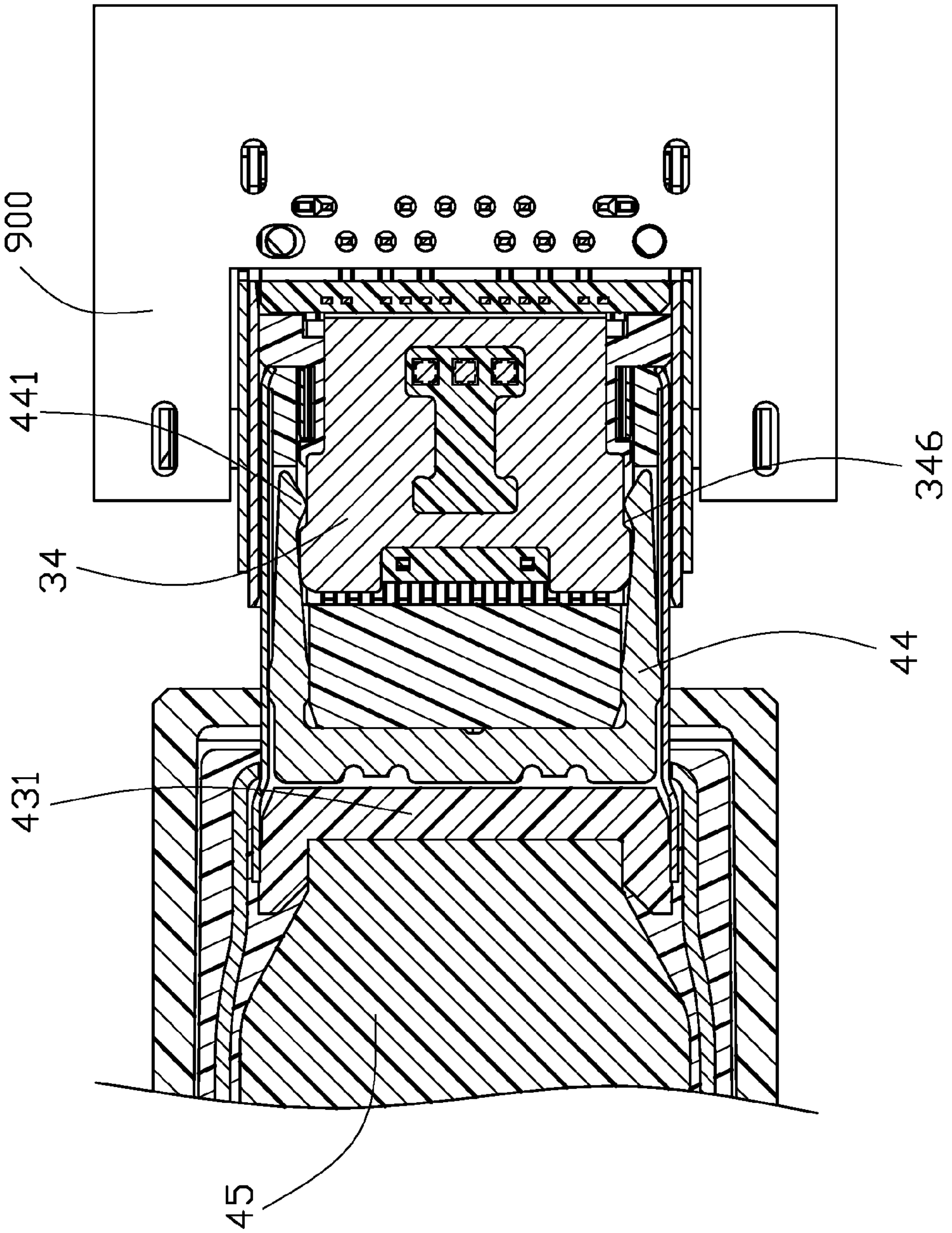
FIG. 27 is a cross-sectional view of the mated plug connector and receptacle connector of FIG. 13.

Referring to FIGS. 23-26(B) and further FIG. 27, the plug connector 400 includes a mating end 401 with a rectangular cavity 402, a cable 461 extending rearwards and a molded insulative cover 47 around the mating end 401 and the cable 461.

Combination with FIG. 26(A)-26(B), the plug connector 400 includes an insulative housing 41 having a capsular front contour with the rectangular receiving cavity 402 therein and enclosed in a metallic shell 46. Opposite upper and lower rows of contacts 413 are disposed in the corresponding passageways 411 of the housing with corresponding contacting sections 4131 extending into the receiving cavity 402. A pair of upper and lower EMI (Electro-Magnetic Interference) spring plates 42 are enclosed in the shell, and each of the EMI spring plates 42 is sandwiched between the shell 16 and the housing 41 and includes a front resilient region 421 extending inwardly toward the receiving cavity

402 and in front of the contacting sections 4131, a rear abutting region 422 to abut against the shell 16, and a pair of side retention regions 423 retainably engaged within corresponding side portions of the housing 41. The front resilient region 421 is in a form of slant-inwardly tabs extending therefrom. The rear abutting regions 422 is in a from of a plurality of slant-outwardly tabs splitting therefrom. A pair of insulative tapes 424 are disposed upon two opposite sides of the housing 21 so as to isolate the contacting section 4131 from the shell 46. A spacer 43 is located behind the housing and defines a plurality of passages 431 through which the tail sections 4132 of the contacts 413 rearwardly extend. A recessed region is formed in a rear face of the spacer 43 to receive a front edge region of a paddle card 45 wherein the tail sections 4132 of the contacts 413 extending through the corresponding passages 431, are soldered upon the corresponding pads 451. The spacer 43 forms a forward extending blade 433 with a pair of forward protrusions on two faces in the vertical direction to be commonly inserted into a back side of the housing 41 wherein the blade 433 is essentially received in the side slots 412 of the housing 41. A U-shaped metallic latch 44 received in the side slots 412 of the housing 41 with a pair of locking heads 441 extending into the two opposite lateral sides of the receiving cavity 401 to lock with the lateral edge sections 346 of the shielding plate 34 of the receptacle connector 300 during mating. Understandably, the latch 44 is restrained by the blade 433, the slots 13 and an interior rear face of the housing 41.

Referring to FIG. 24(A)-27, a cable 461 behind the paddle card 45, encloses a plurality of wires 4611 regulated by a pair of organizer 462 to be soldered upon a rear region of the paddle card 45. An auxiliary rear shell 465 grasps the shell 46 to shield the paddle card 45, and a clipper 466 grasps the cable 461 behind the paddle card 45. Opposite front overcoat 475 and rear overcoat 476 are overmolded upon the rear shell 465 and the clipper 446, respectively. Finally, the cover 47 essentially fully covers the clipper 466, the front overcoat 475 and the rear overcoat 476. During mating, the mating tongue 301 is received in the receiving cavity 401 with the corresponding contacting sections 322 of the contacts 32 of the receptacle connector 300 connected to the contacting sections 4131 of the contacts 413 of the plug connector 400 wherein the latch 44 is locked with the shielding plate 34, and the front resilient region 421 of the spring plate 42 contacts the collar 35.

Figure 28:
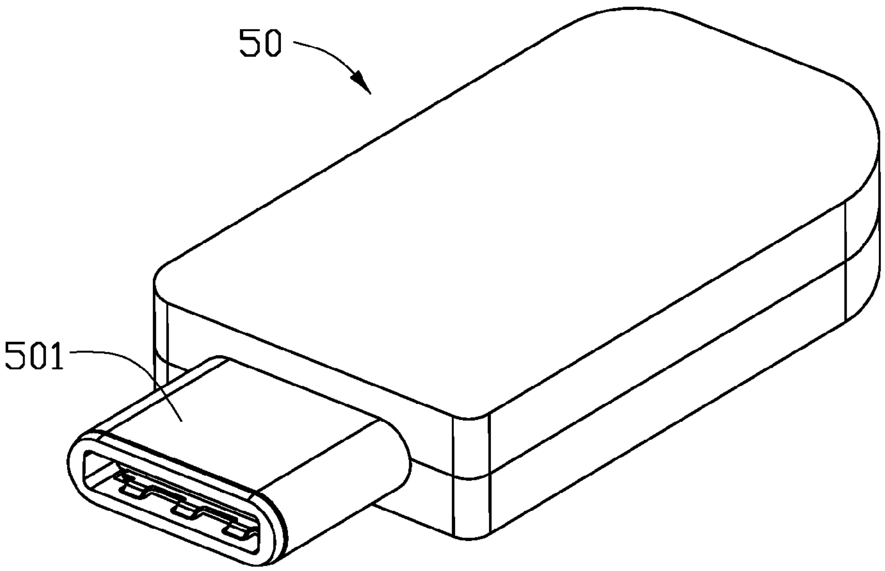
FIG. 28 shows a portable hard disk equipped with an interface of the plug connector according to the invention.
Figure 29A:
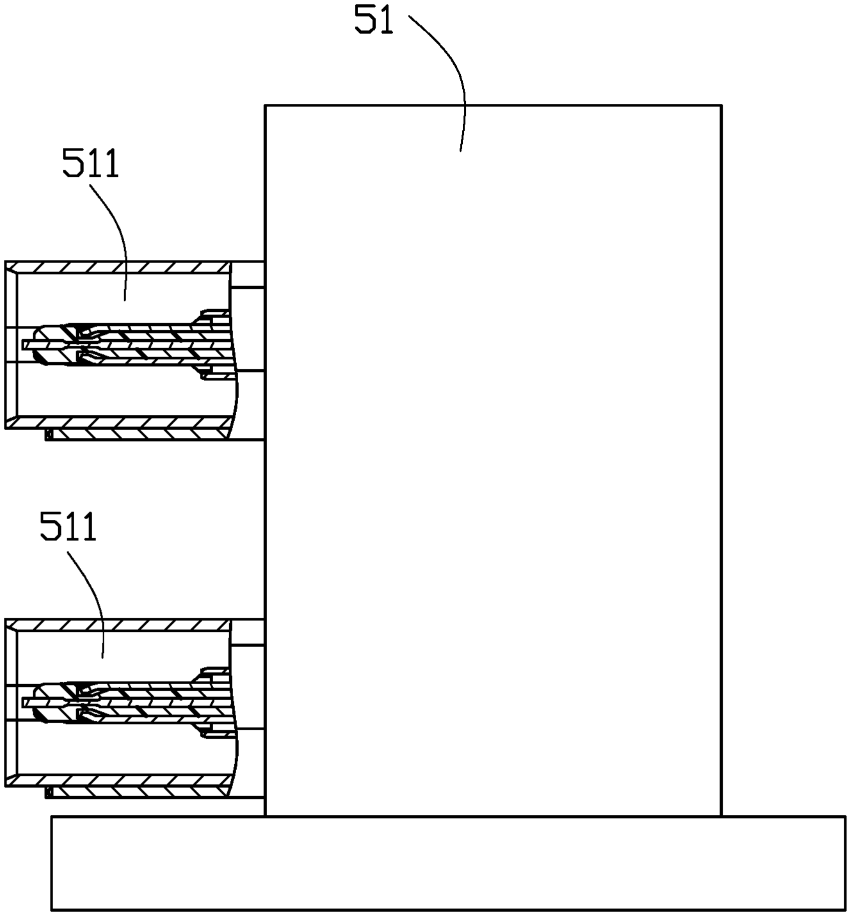
FIG. 29(A) shows a dual port connector assembly having one unitary housing equipped with a pair of stacked receptacle connector units in the vertical direction according to the invention.
Figure 29B:
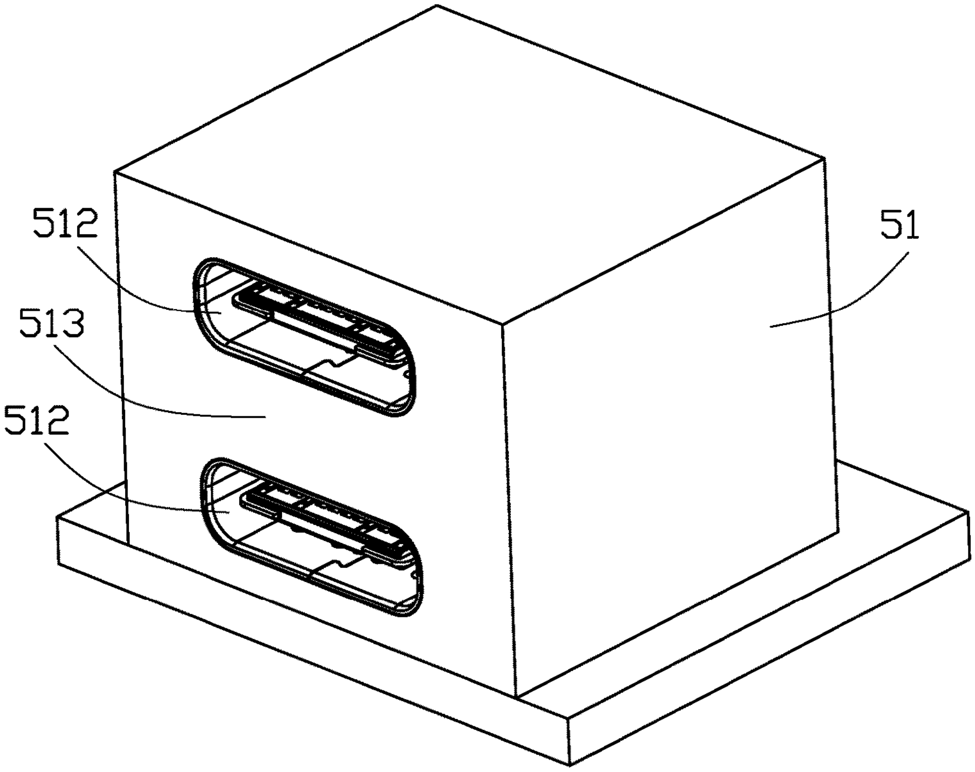
FIG. 29(B) shows a dual port connector assembly having one unitary housing equipped with a pair of stacked receptacle connector units in the vertical direction according to the invention.
Figure 30A:
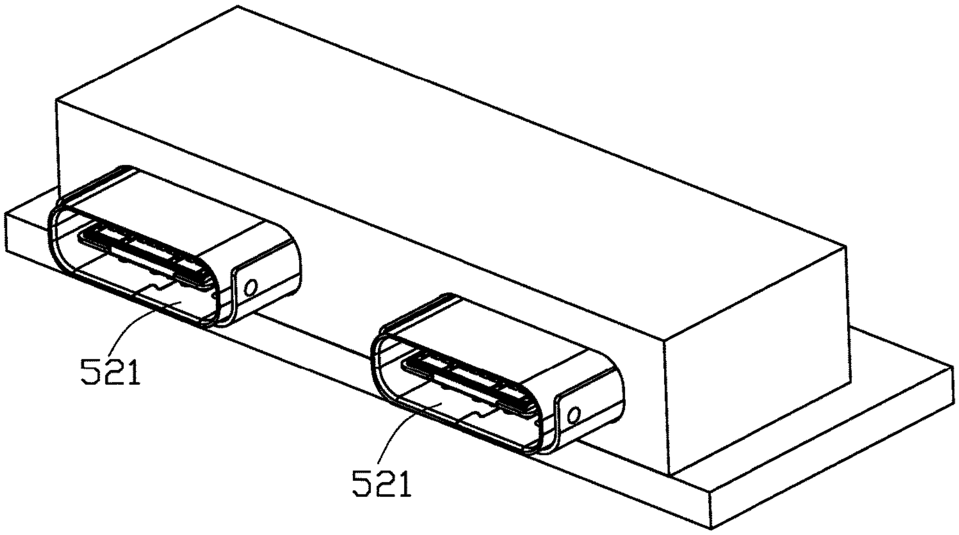
FIG. 30(A) shows a dual port connector assembly having one unitary housing equipped with a pair of side by side receptacle connector units in the transverse direction according to the invention.
Figure 30B:
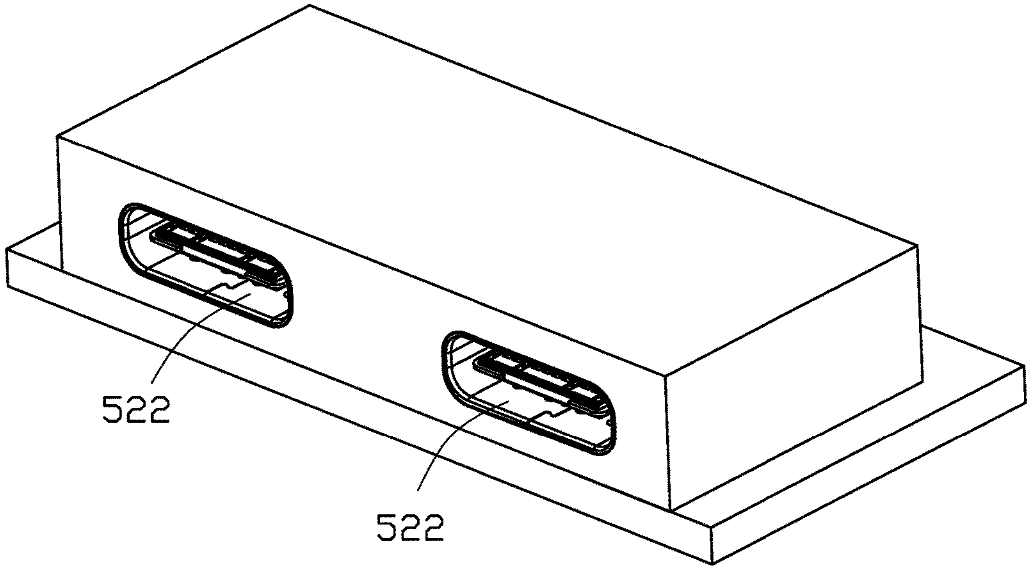
FIG. 30(B) shows a dual port connector assembly having one unitary housing equipped with a pair of side by side receptacle connector units in the transverse direction according to the invention.
Figure 31:
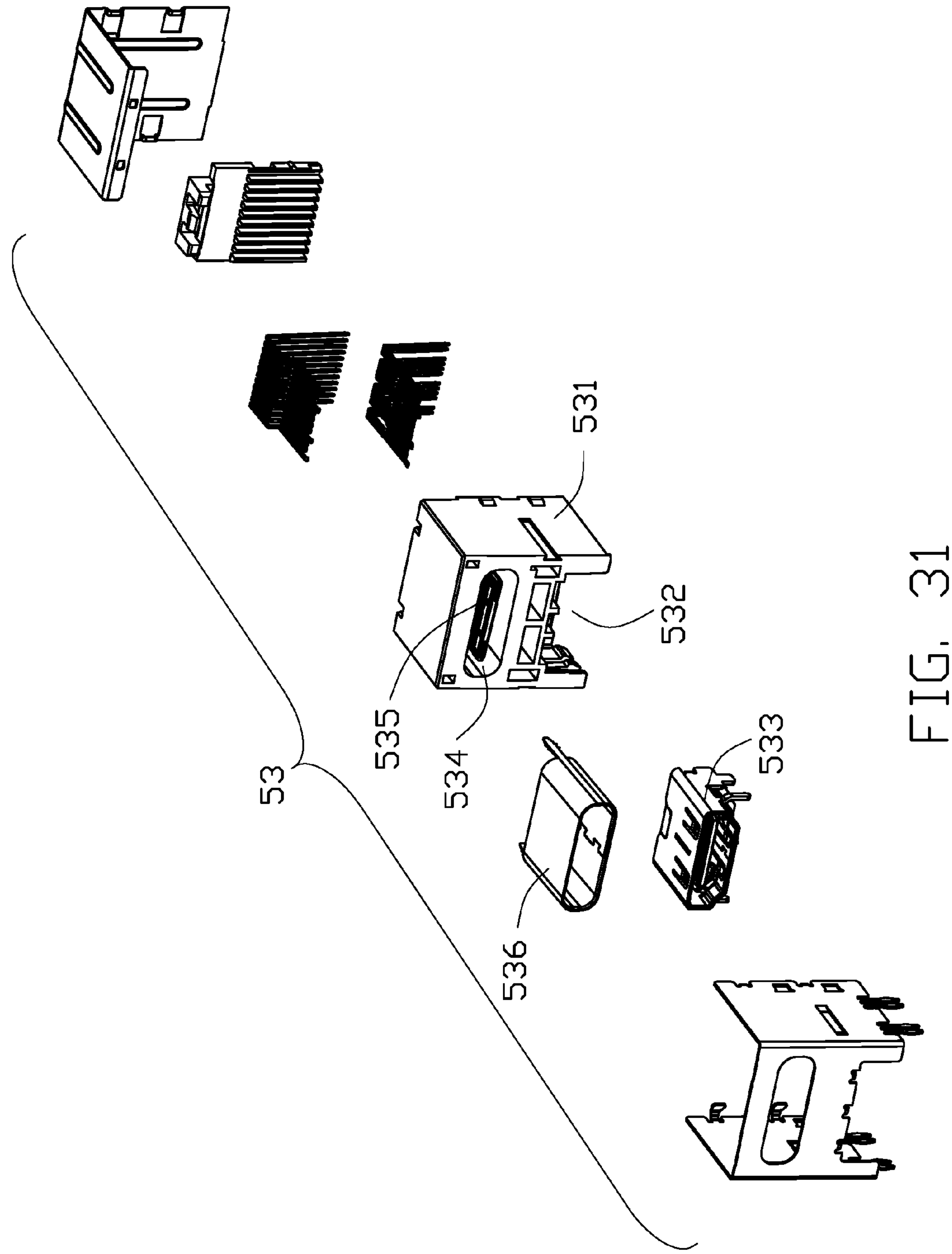
FIG. 31 shows a dual port connector assembly having one upstanding housing frame equipped with a pair of receptacle connector units in the vertical direction according to the invention.
Figure 32:
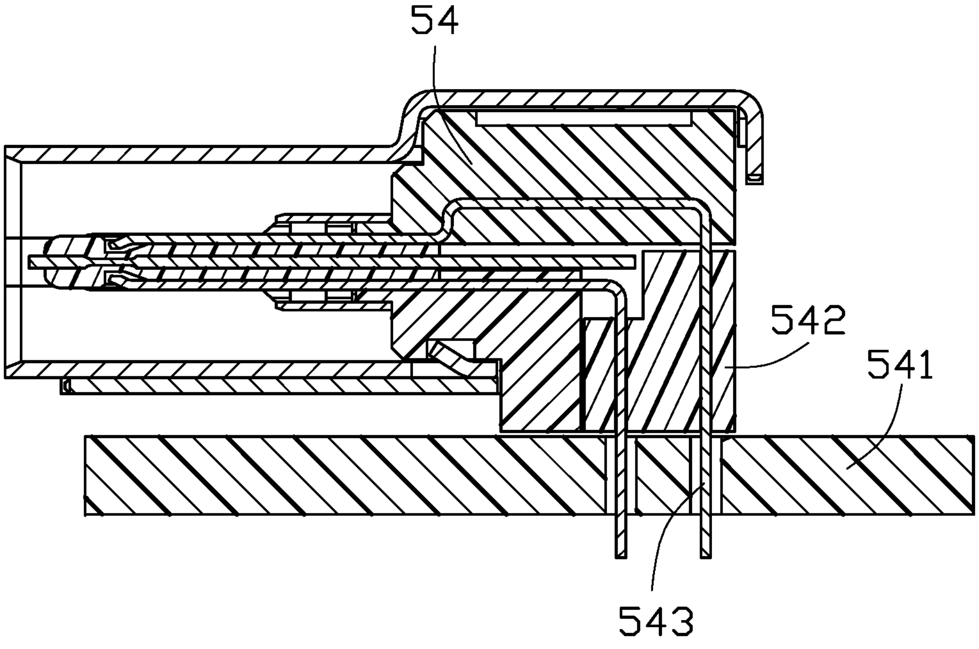
FIG. 32 shows a receptacle connector according to the invention.
Figure 33A:
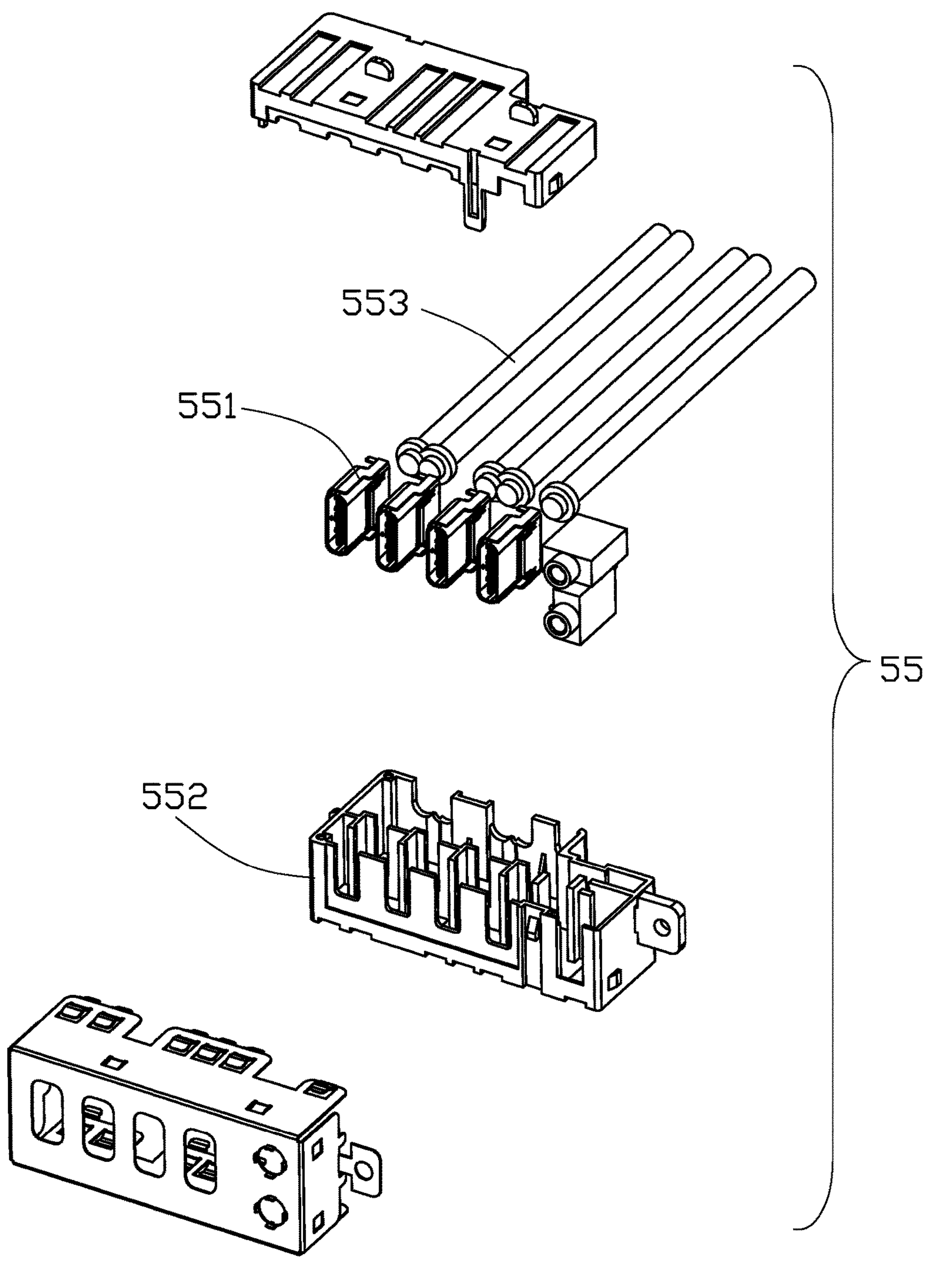
FIG. 33(A) shows a receptacle connector cable assembly according to the invention.
Figure 33B:
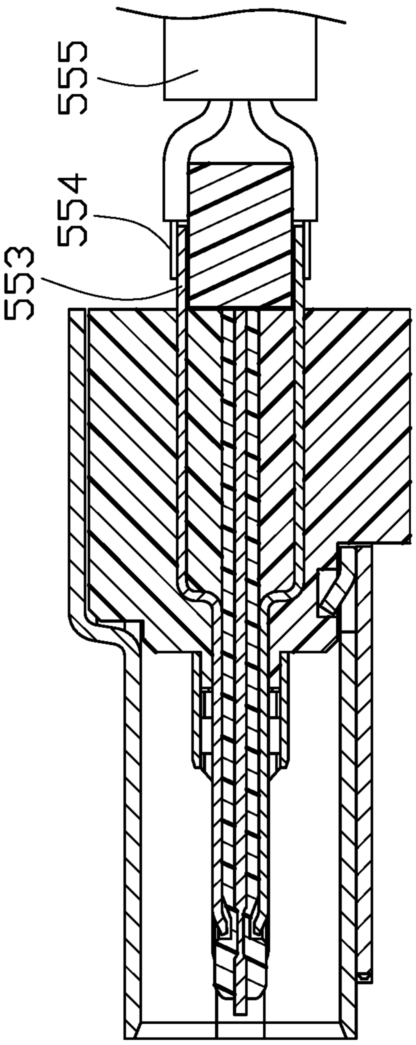
FIG. 33(B) shows a receptacle connector assembly according to the invention.

FIG. 28 shows a portable hard disk 50 equipped with an interface 501 of the plug connector as shown in the first or the second embodiment according to the invention, while the contact tails are mounted to an internal printed circuit board (not shown) therein. FIG. 29(A) shows a connector kit 51 with two spaced receptacle connectors according to the invention, stacked upon each other and integrally retained by a same housing wherein the mating ports 511 of the two receptacle connectors spaced from each other in the vertical direction with separation. FIG. 29(B) shows a connector kit 51 similar to that in FIG. 29(A) but with the two mating ports 512 are separated from each other via a partition wall 513 of the housing and each mating port 512 is hidden behind a front face of the housing. FIGS. 30(A) and 30(B) show the two connectors 521/522 similar to those in FIGS. 29(A) and 29(B) except in a side-by-side arrangement instead of a stacked manner. FIG. 31 shows a connector assembly 53 with a common housing 531 having a lower space 532 to receive an independent receptacle connector 533 and an upper space 534 configured compliantly with the mating cavity to receive the corresponding plug of the invention wherein the mating tongue 535 is optionally integrally formed with the whole housing and the shield 536 is rearwardly assembled into the upper space 534. FIG. 32 shows a receptacle connector 54 of the invention mounted upon the printed circuit board 541 with the spacer 542 to align the corresponding tail sections 543 of the contacts. FIGS. 33(A) and 33(B) show a front I/O cable assembly 55 wherein the receptacle connectors 551 of the invention retained in the bracket 552 have the corresponding tail sections 553 of the contacts linked to the wires 554 of the cables 555 which extend rearward out of the bracket 552.

Figure 34A:
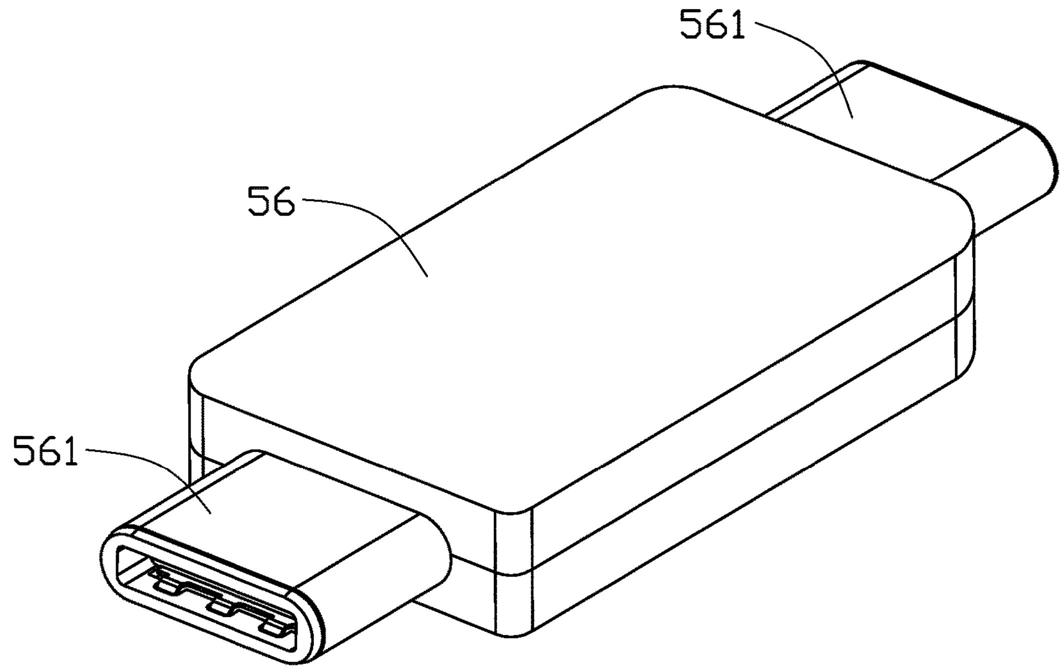
FIG. 34(A) shows an adaptor connector assembly according to the invention wherein both two opposite ports are of the plug type interface while electrically connected via an internal printed circuit board.
Figure 34B:
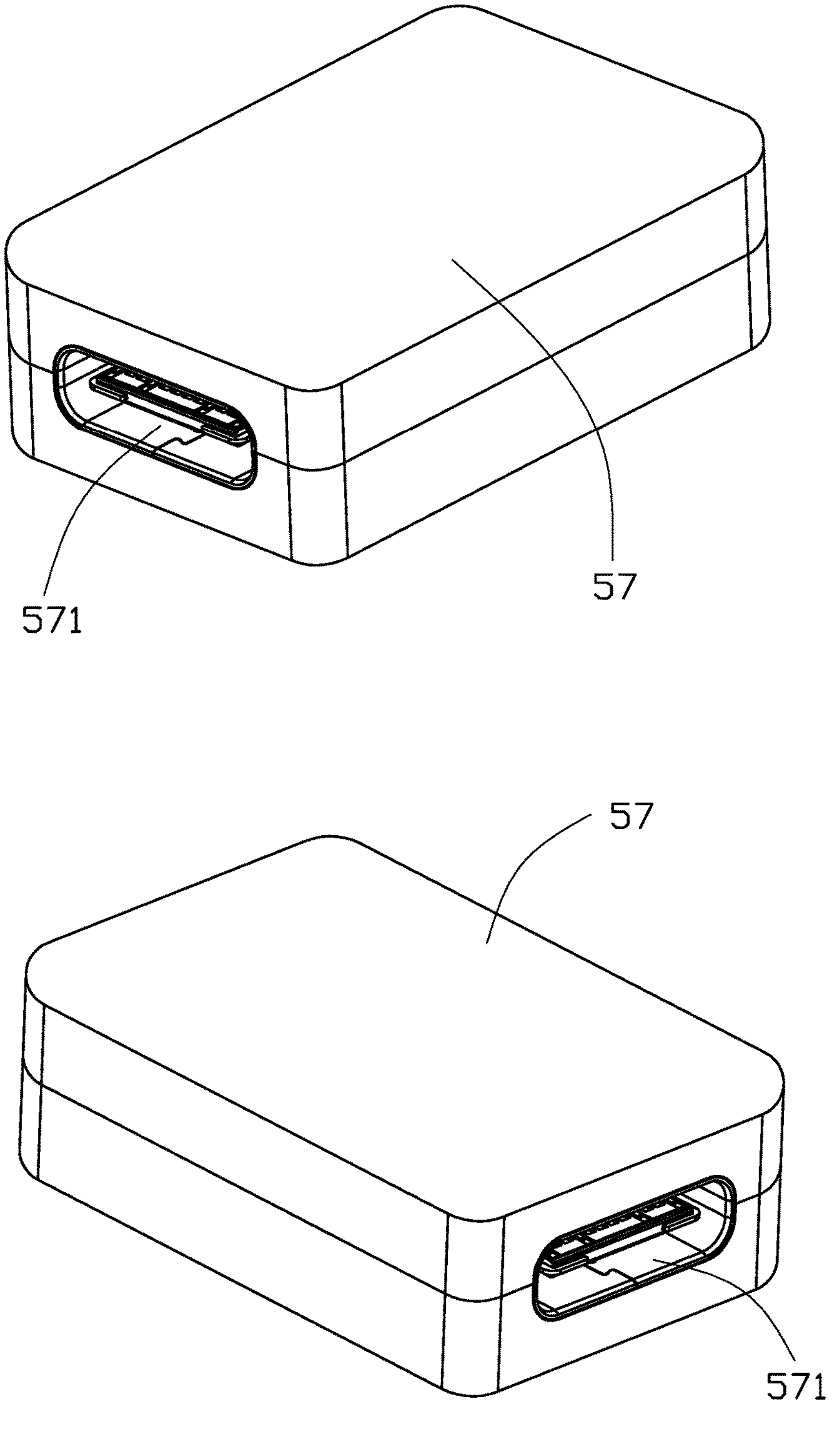
FIG. 34(B) shows an adaptor connector assembly according to the invention wherein both two opposite ports are of the receptacle type interface while electrically connected via an internal printed circuit board.
Figure 35:
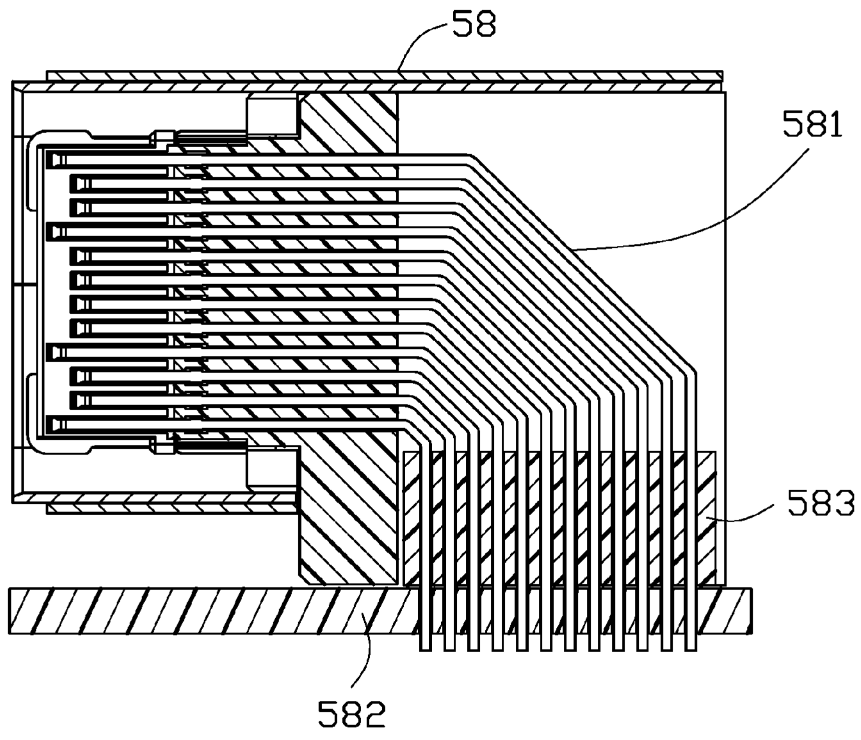
FIG. 35 shows a receptacle connector according to another embodiment of the invention.
Figure 36:
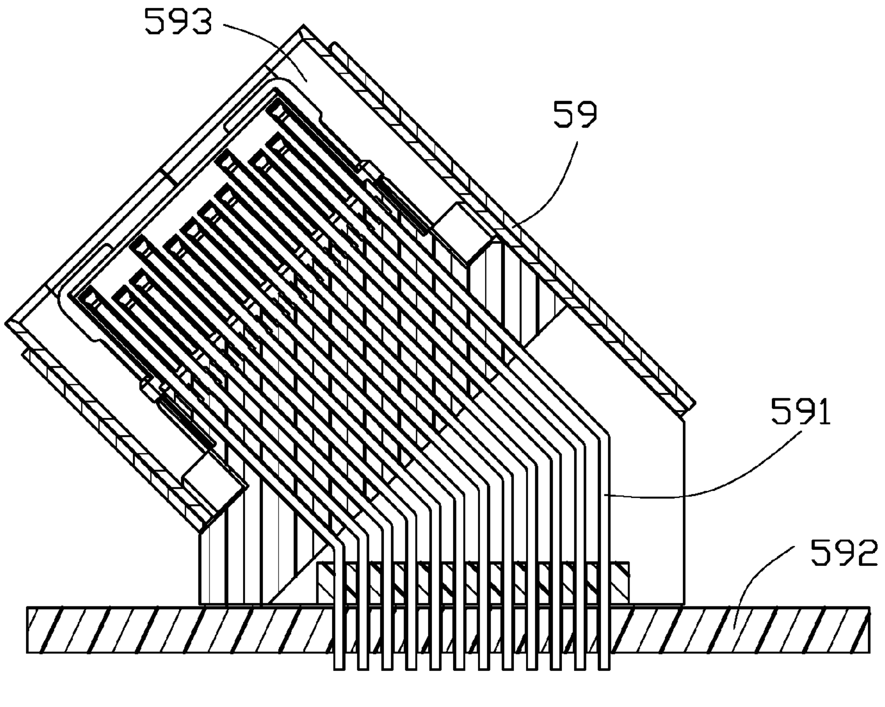
FIG. 36 shows a receptacle connector according to another embodiment of the invention.

FIG. 34(A) shows the adaptor 56 equipped with the interface of the plug connector 561 according to the invention wherein the internal linking between the two opposite mating ports may be via an internal printed circuit board (not shown). FIG. 34(B) shows the adaptor 57 similar to that in FIG. 34(A) except that the mating ports is of the recessed type receptacle connector 571. FIG. 35 shows a receptacle connector 58 according to another embodiment of the invention wherein each row contacts 581 are arranged side by side in a vertical plane and mounted upon the printed circuit board 582 via assistance of the spacer 583. FIG. 36 shows a receptacle connector 59 according to another embodiment of the invention wherein each row contacts 591 are arranged side by side in a vertical plane and mounted upon the printed circuit board 592 while the mating port 593 extends upwardly and obliquely.

Figure 37:
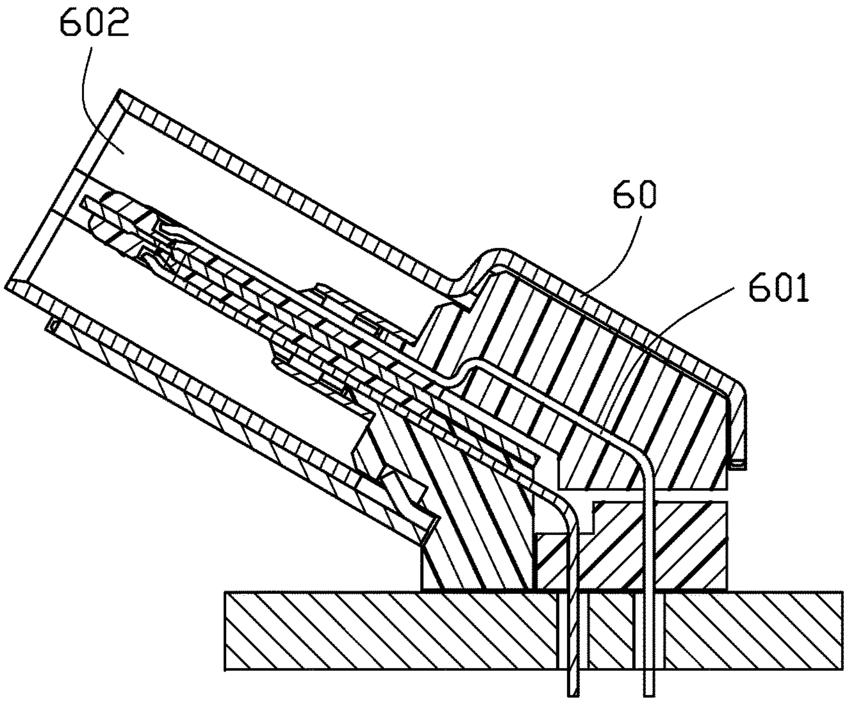
FIG. 37 shows a receptacle connector according to another embodiment of the invention.
Figure 38:
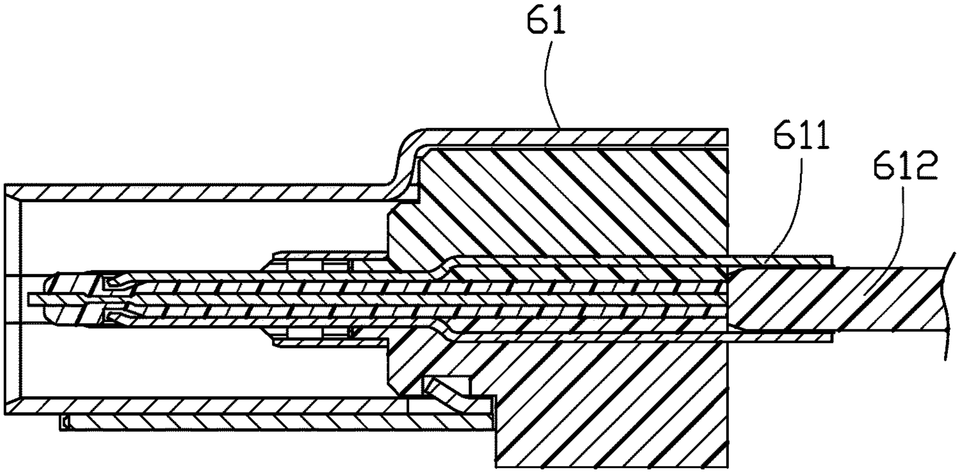
FIG. 38 shows a receptacle connector according to another embodiment of the invention.
Figure 39:
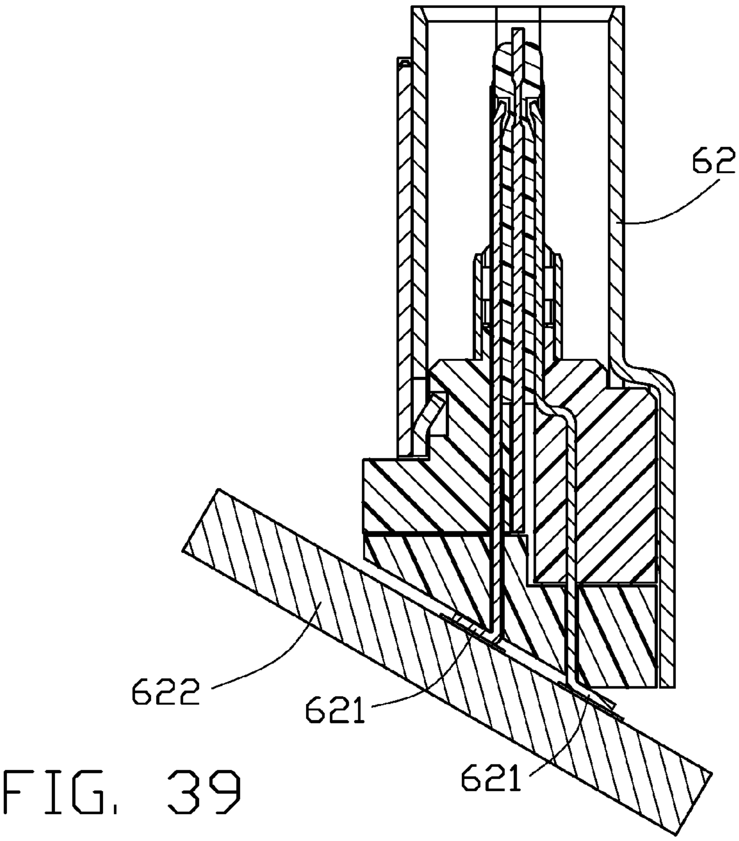
FIG. 39 shows a receptacle connector according to another embodiment of the invention.
Figure 40:
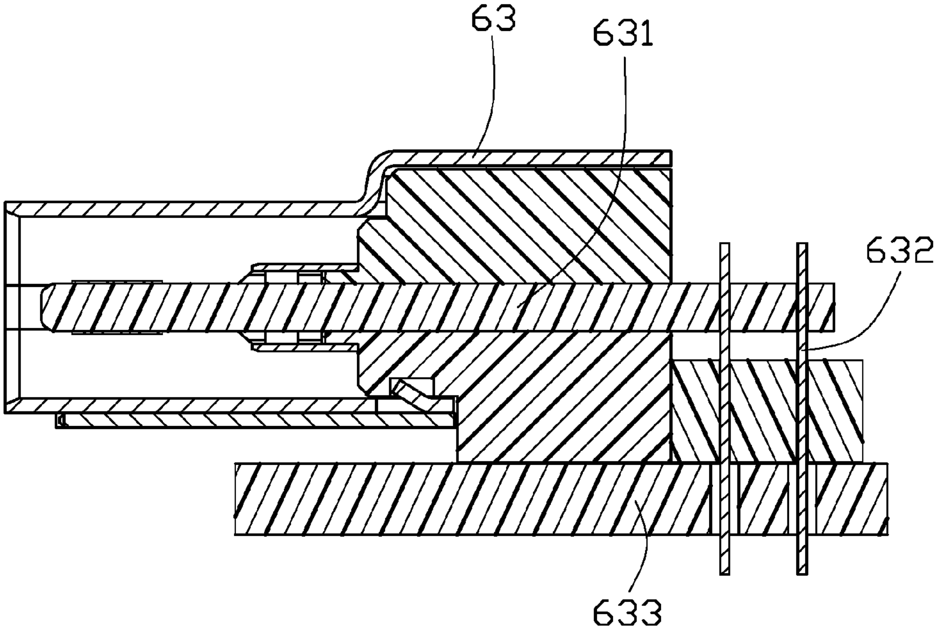
FIG. 40 shows a receptacle connector according to another embodiment of the invention.

FIG. 37 shows a receptacle connector 60 according to another embodiment of the invention wherein each row contacts 601 are arranged in a transverse direction perpendicular to a vertical plane while the mating port 602 extends upwardly and obliquely. FIG. 38 shows a receptacle connector 61 according to another embodiment of the invention wherein each row contacts are arranged in a transverse direction and the tail sections 611 of the two row contacts commonly sandwich the printed circuit board 612. FIG. 39 shows a receptacle connector 62 according to another embodiment of the invention wherein each row contacts are arranged in a transverse direction and the tail sections 621 of the two row contacts are surface mounted upon an obliquely extending printed circuit board 622. FIG. 40 shows a receptacle connector 63 according to another embodiment of the invention wherein the mating tongue is made by a printed circuit board which can be an internal PCB 631 adapted to connect to the mother board 633 via other contacts 632.

Figure 41:
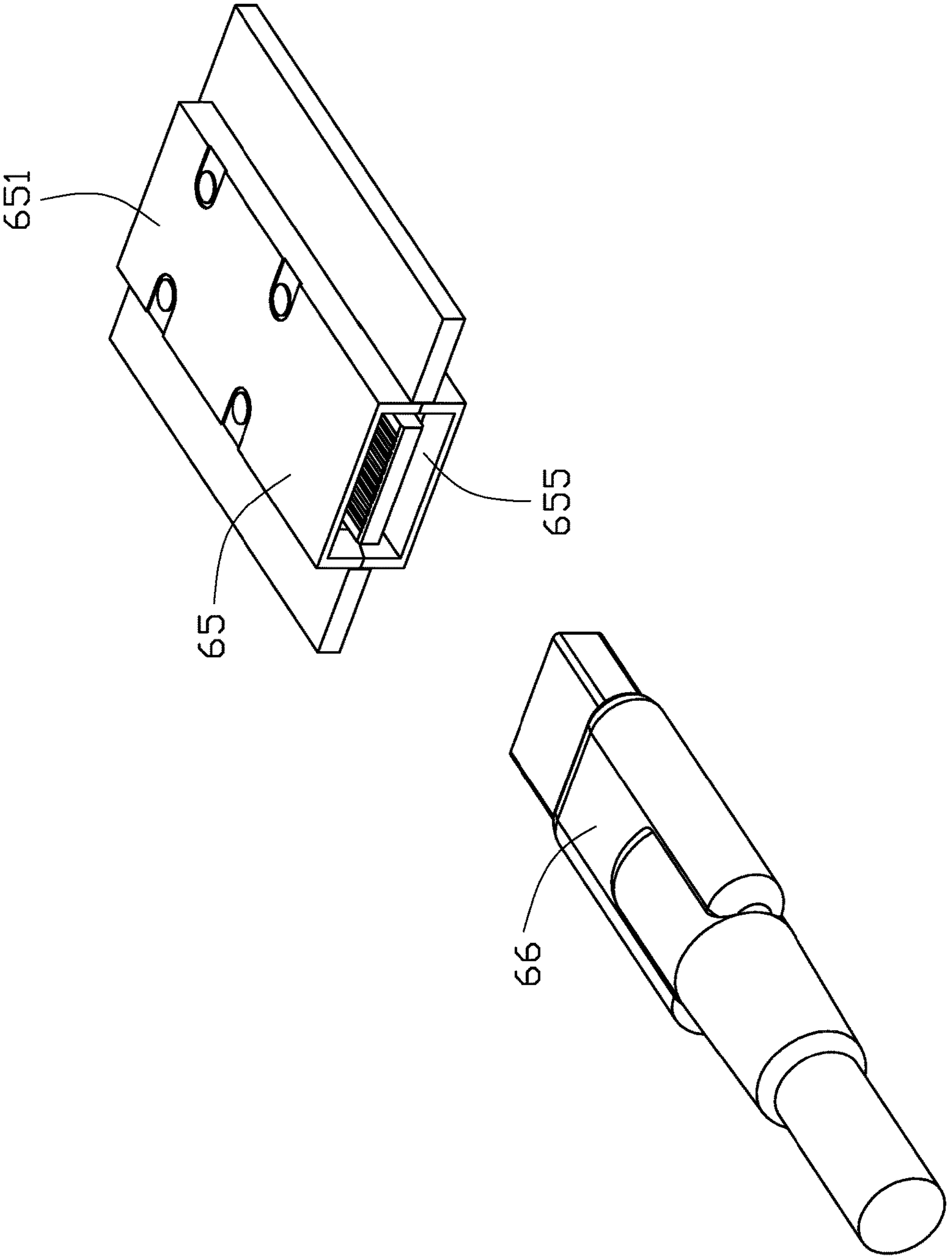
FIG. 41 is a perspective view of the plug connector and the receptacle connector according to a third embodiment of the instant invention.
Figure 42:
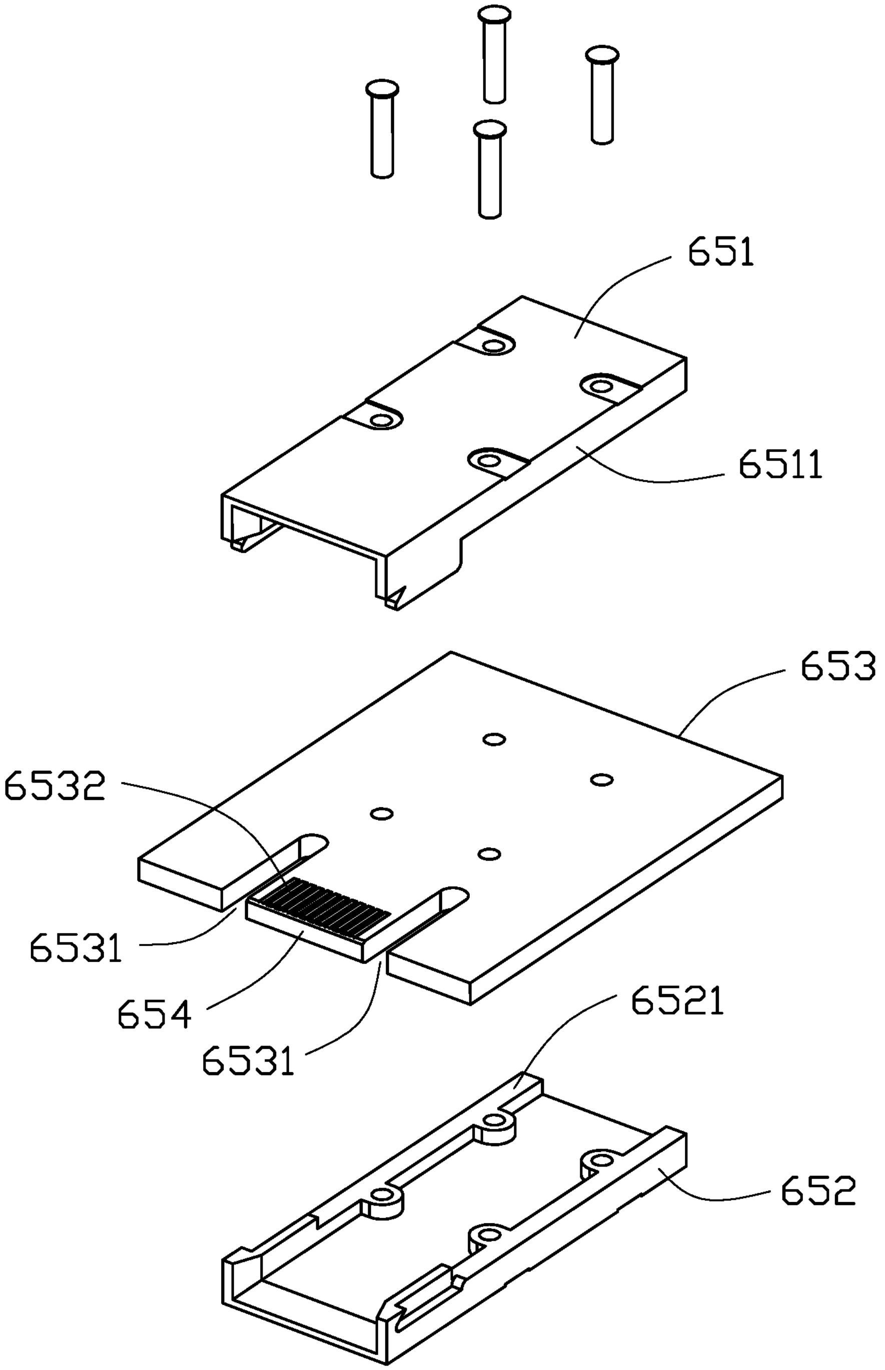
FIG. 42 is an exploded perspective view of the receptacle connector of FIG. 41.
Figure 43:
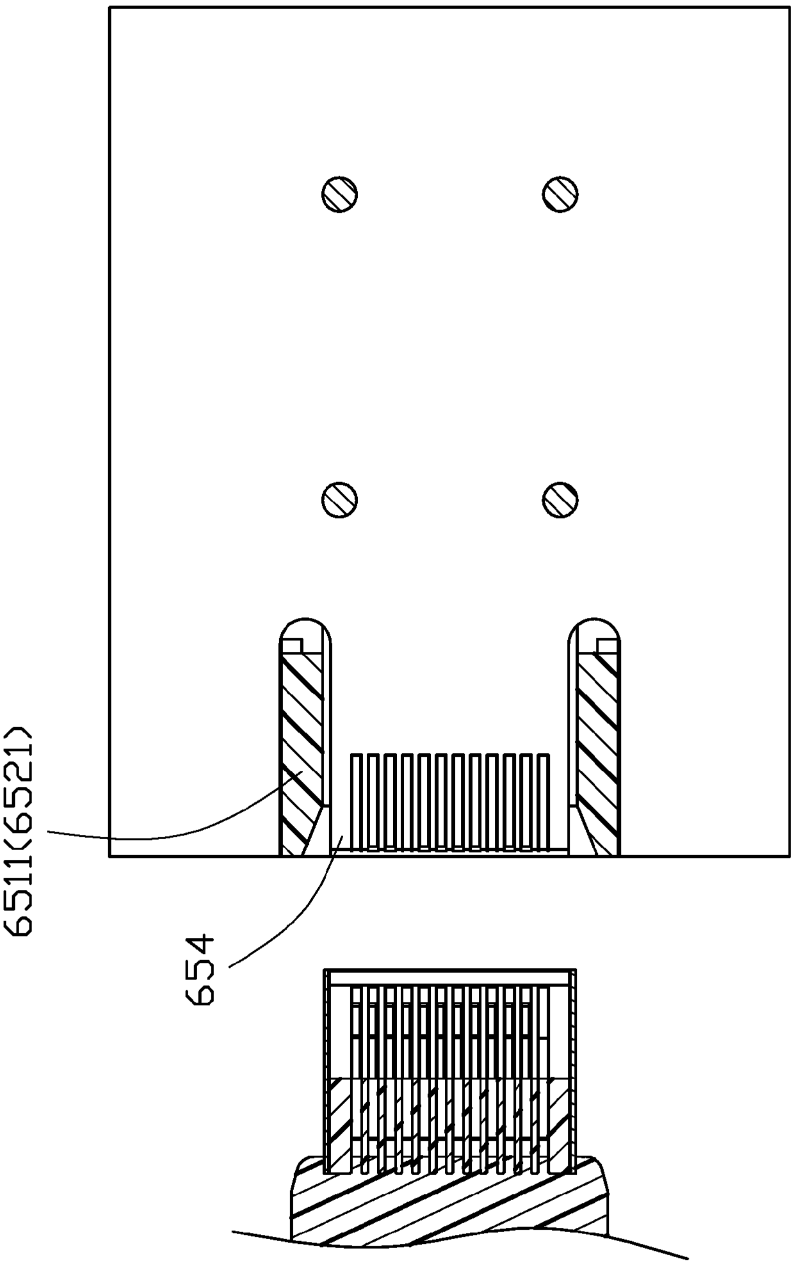
FIG. 43 is an illustration cross-sectional view of the plug connector and the receptacle connector of FIG. 41 in a ready-to-mate condition.
Figure 44:
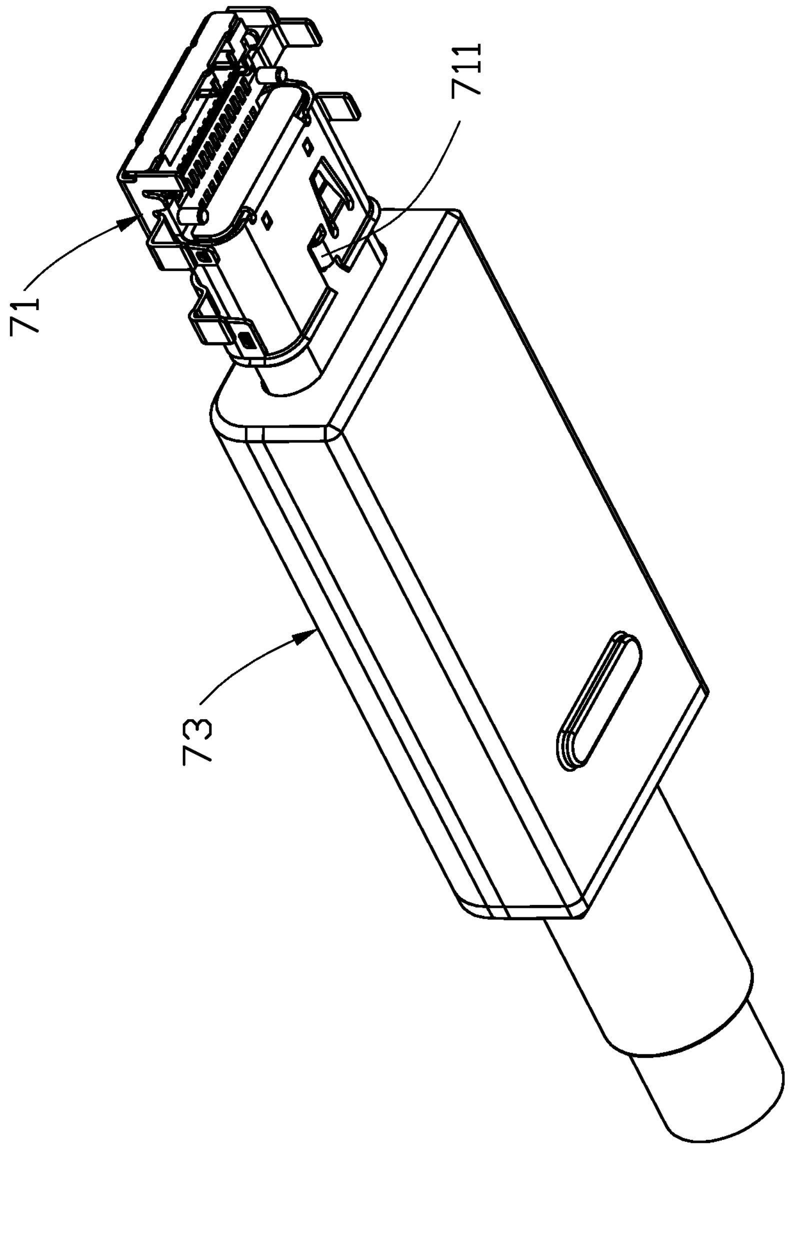
FIG. 44 is a front assembled perspective view of a receptacle connector and a complementary plug connector mated with each other of a fourth embodiment of the invention.
Figure 45:
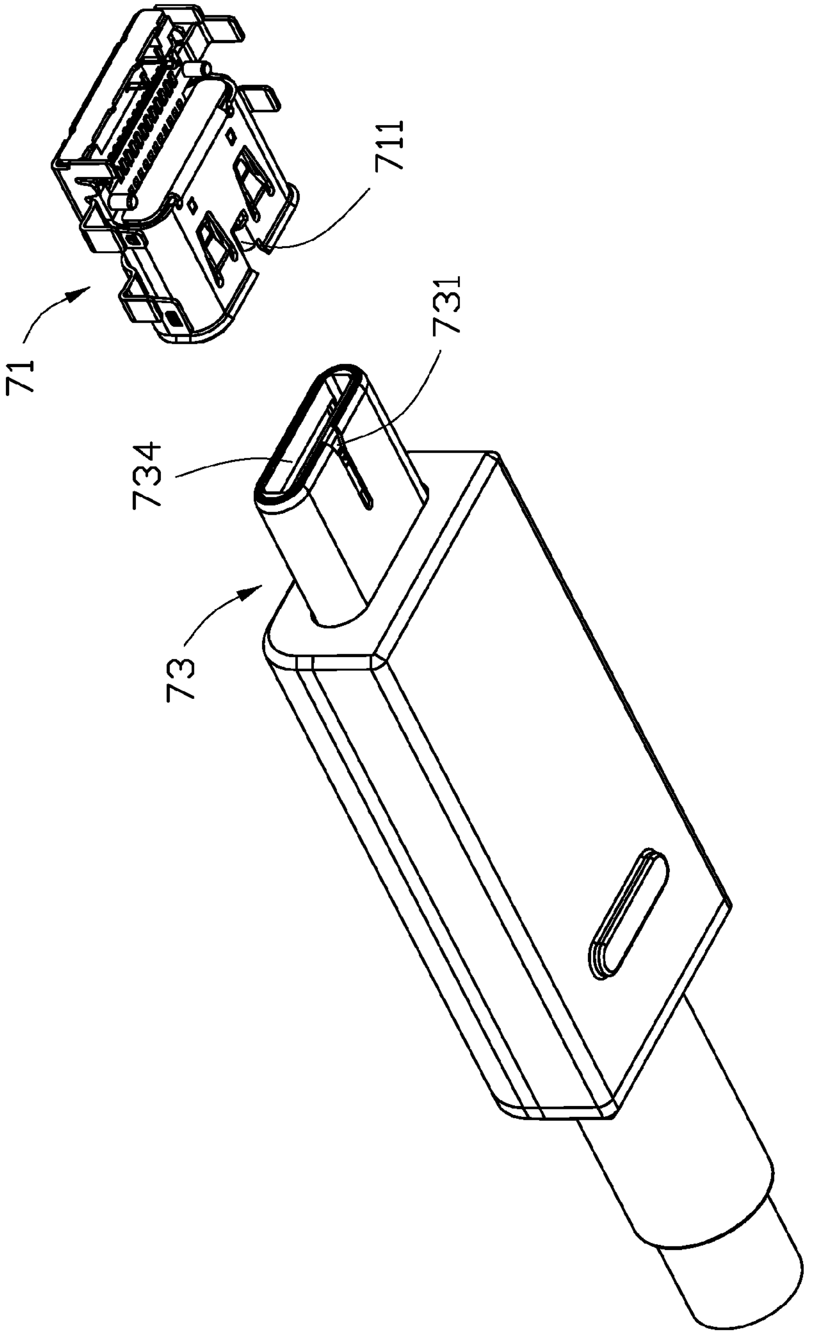
FIG. 45 is a front disassembled perspective view of the receptacle connector and the plug connector of FIG. 44.
Figure 46:
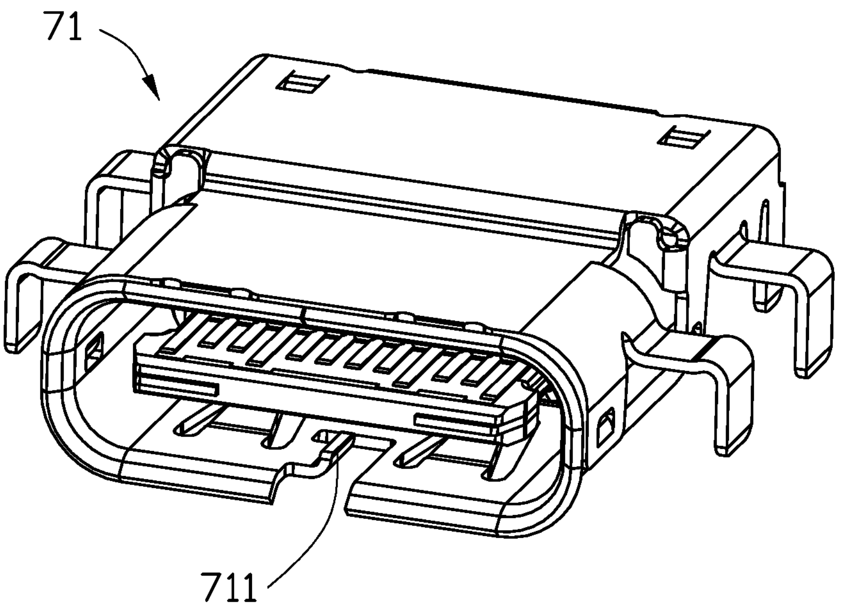
FIG. 46 is a front perspective view of the receptacle connector of FIG. 45.
Figure 47:
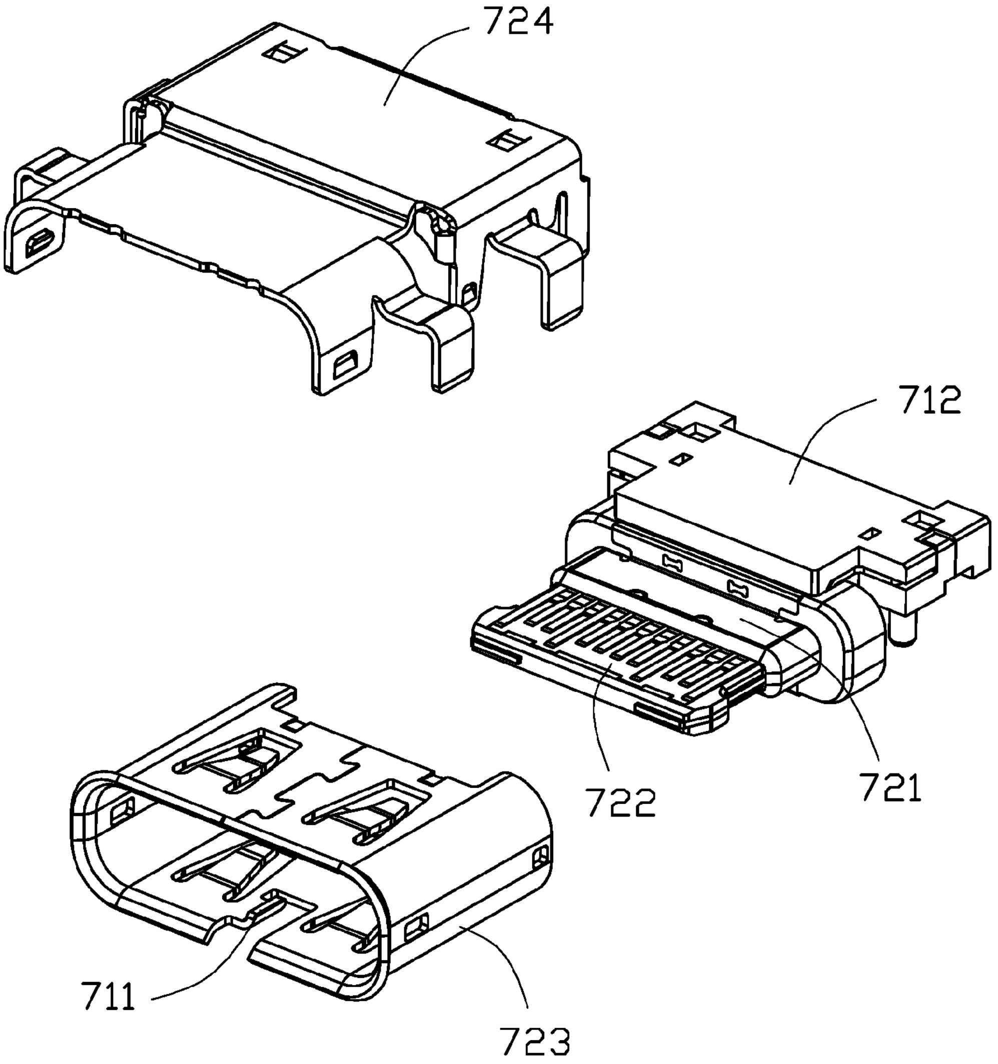
FIG. 47 is a front exploded perspective view of the receptacle connector of FIG. 46.
Figure 48:
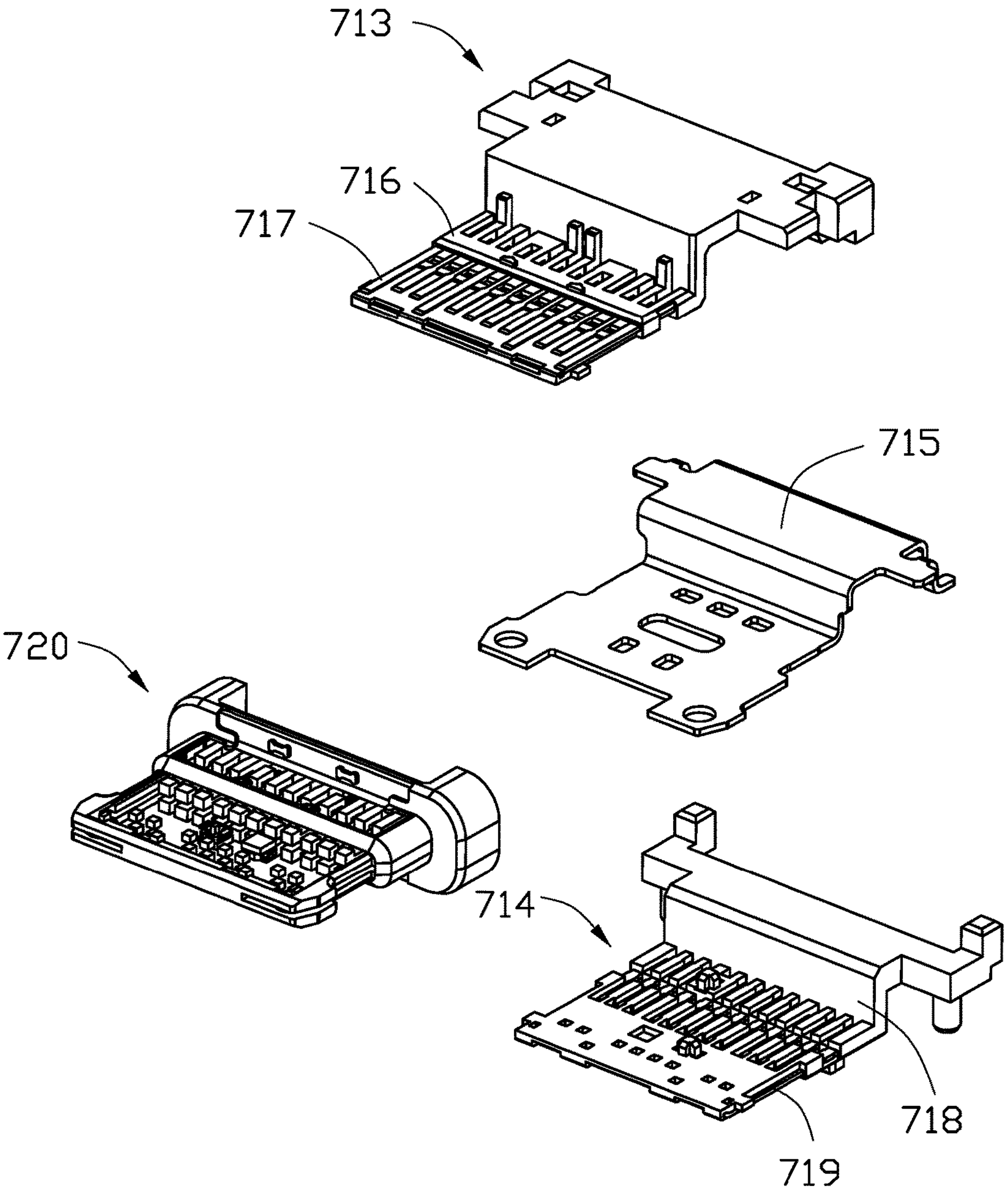
FIG. 48 is a further front exploded perspective view of a part of the receptacle connector of FIG. 47.

Referring to FIGS. 41-43 showing a third embodiment of the invention, the receptacle connector 65 includes a housing essentially composed of a straddle mounting upper housing 651 and a straddle mounting lower housing 652 commonly sandwiching therebetween a printed circuit board 653 which is essentially a mother board of a mobile device. A front edge region of the printed circuit board 653 defines a pair of cutouts/slots 6531 to form a mating tongue 654 therebetween. A plurality of circuit pads 6532 are formed on a front region of the mating tongue 650. The upper housing 651 and the lower housing 652 include two side walls 6511, 6521 extending into the corresponding slots 6531 to commonly form a mating port 655 in which the mating tongue 654 forwardly extends. The mating port of the plug connector 66 is mated with the mating port 655 wherein the center slot of the plug connector 66 receives the mating tongue 654, and the two opposite side wall of the housing of the plug connector 66 is received in the corresponding slots 6531, respectively. Understandably, the contact assignment of all embodiments above also allows the plug connector to be upside down mated with the receptacle connector in a flippable way.

Referring to FIGS. 44-50 showing a fourth embodiment of the invention, a customized receptacle connector 71 is inserted with a customized plug connector 72. The new feature of the embodiment is to forms an identification protrusion 729 in the customized receptacle connector and a slot 721 in a one primary wall of the customized plug connector to receive the protrusion 711 during mating. Understandably, if a flippable mating is desired, another notch may be formed in another primary wall opposite to the existing slot 721.

The customized receptacle connector 71 includes a terminal module 712 essentially composed of the upper part 713, a lower part 714 and a middle part 715 sandwiched therebetween wherein the upper part 713 includes an upper insulator 716 with integrally formed upper contacts 717 via a first stage insert molding process, the lower part 714 includes a lower insulator 718 with integrally formed lower contacts 719 via another first stage insert molding process, and the middle part 715 is shielding plate positioned between the upper part 713 and the lower part 714 and integrally formed with a middle insulator 720 which further binds the upper part 713 and the lower part 714. Similar to the embodiments disclosed in the aforementioned applications, the shielding plate 715 forms a pair of lateral locking edges. A pair of collars 721 is attached to a root of the mating tongue 722. A metallic shield 723 encloses and secures to the terminal module 712. A metallic bracket 724 is secured to the shield 723 to mount the receptacle connector 71 upon the printed circuit board. The identification protrusion 711 is formed around a front opening of the mating cavity which is formed by the shield 723 and receives the mating tongue 722 therein.

Figure 49:
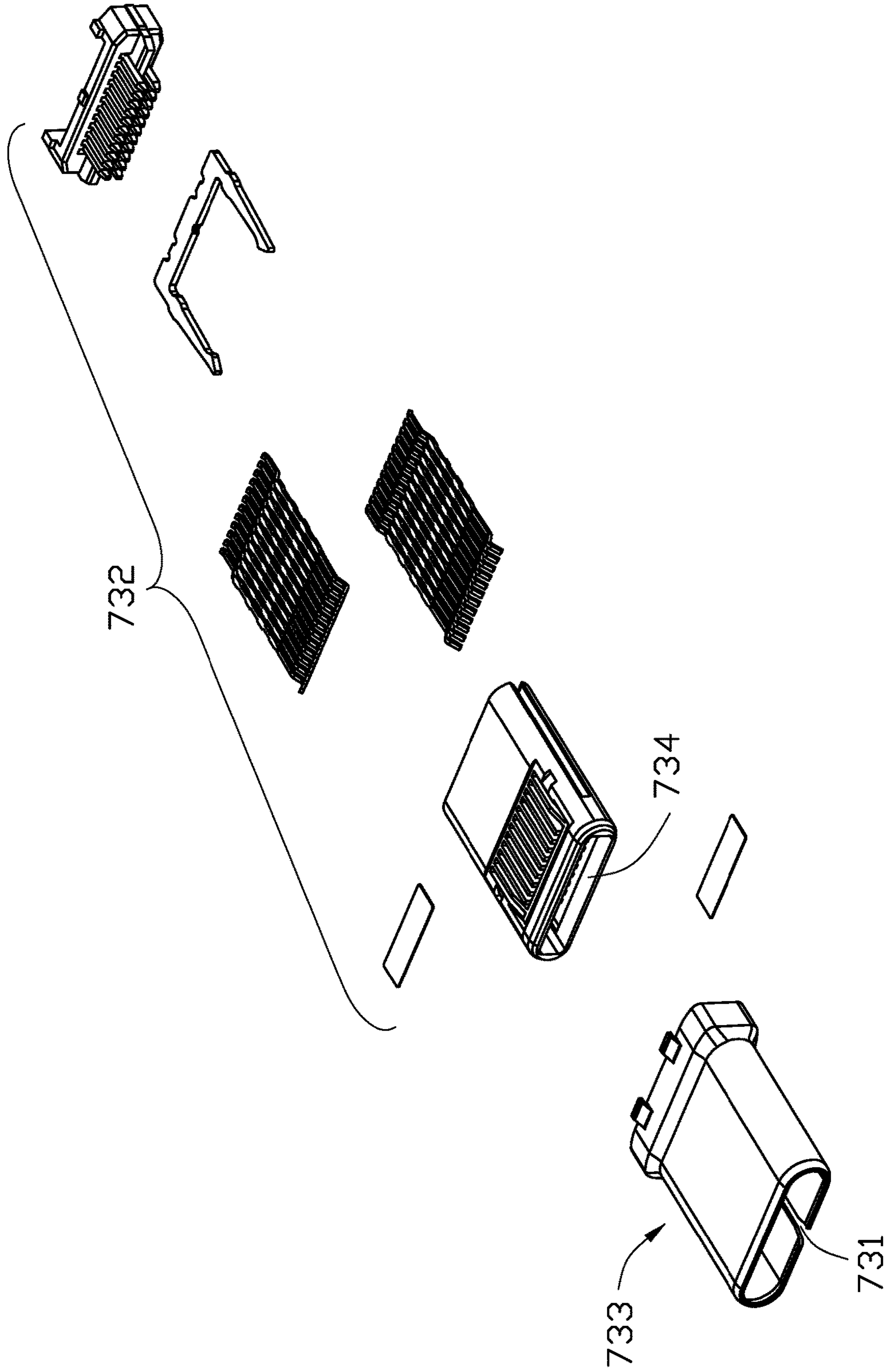
FIG. 49 is a front exploded perspective view of part of the plug connector of FIG. 46.
Figure 50:
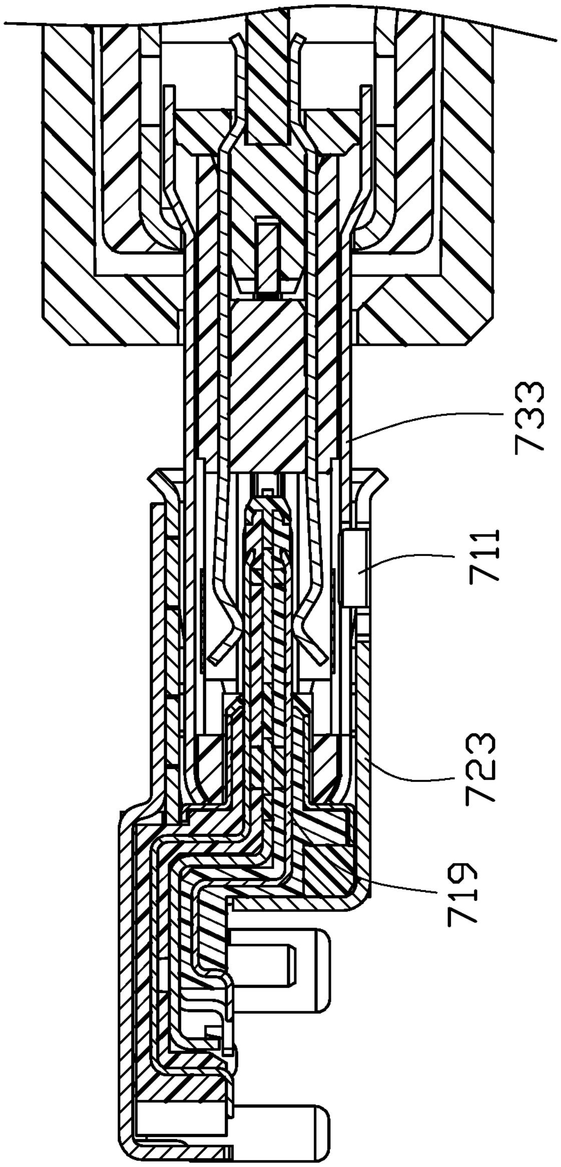
FIG. 50 is a cross-sectional view of the assembled receptacle connector and plug connector of FIG. 44.
Figure 51:
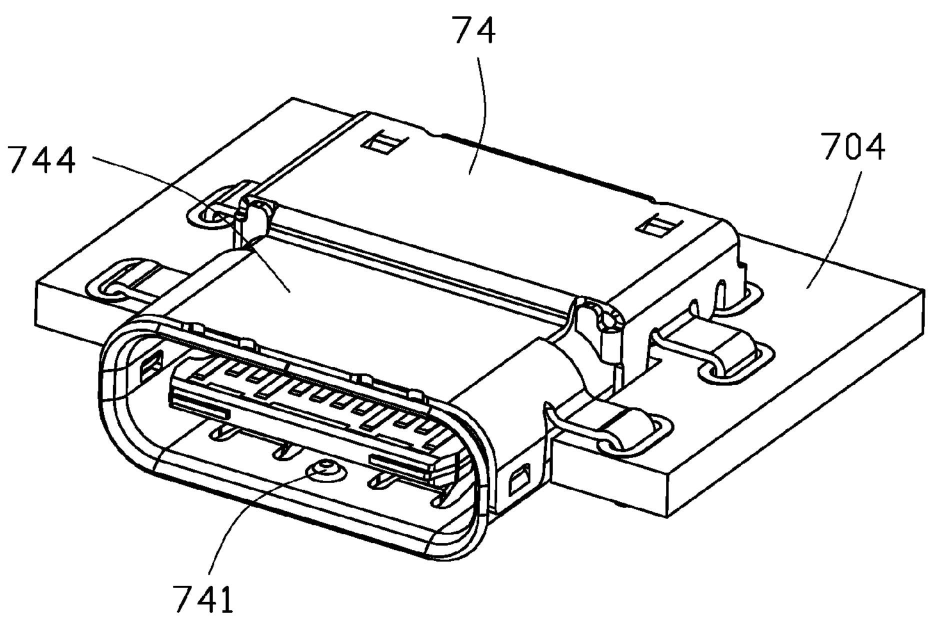
FIG. 51 is a front and top perspective view of a receptacle connector of another embodiment according to the invention.
Figure 52:
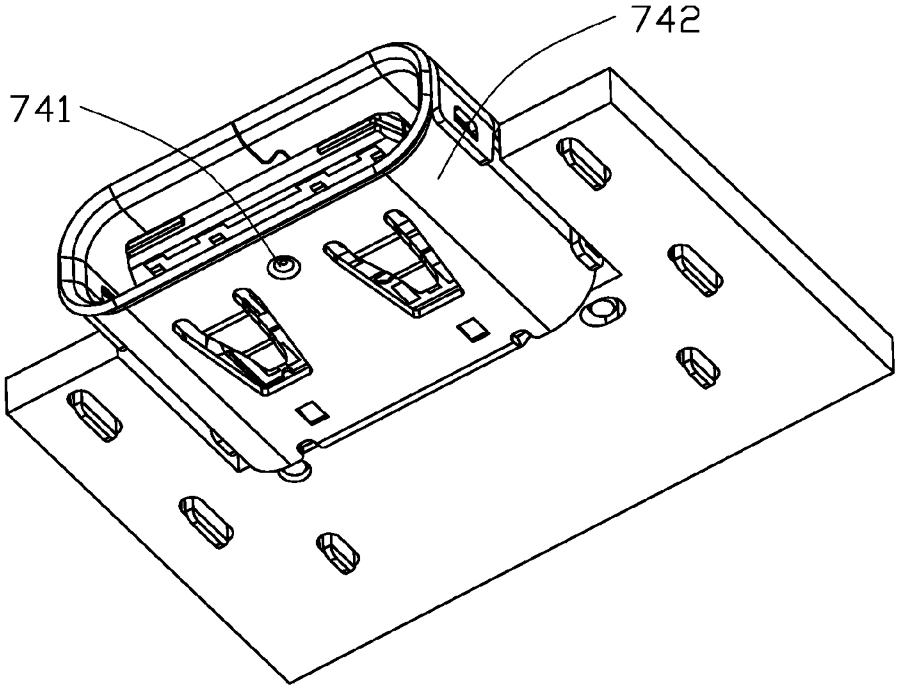
FIG. 52 is a front and bottom perspective view of receptacle connector of FIG. 51.
Figure 53:
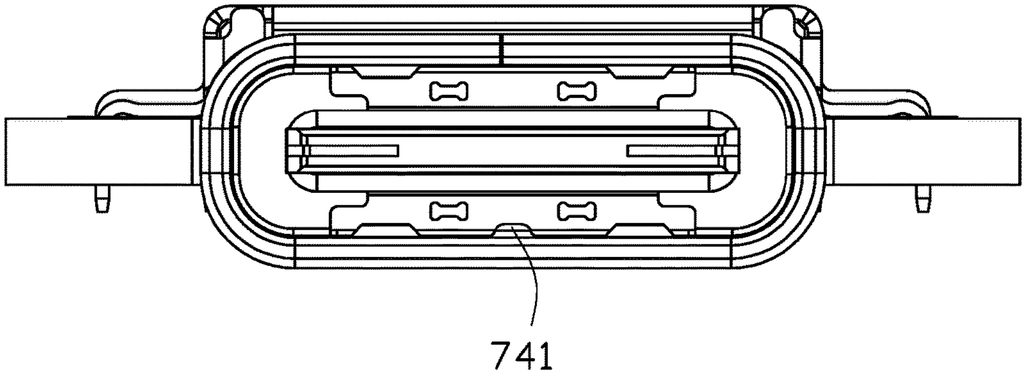
FIG. 53 is a front view of the receptacle connector of FIG. 51.
Figure 54:
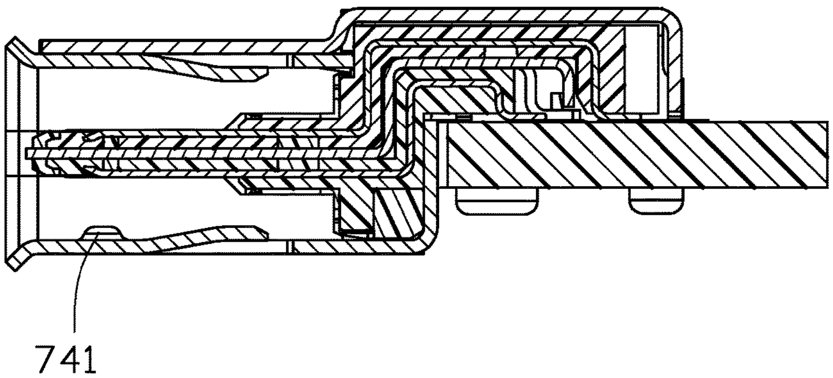
FIG. 54 is a cross-sectional view of the receptacle connector mounted upon the printed circuit board of FIG. 51.
Figure 55:
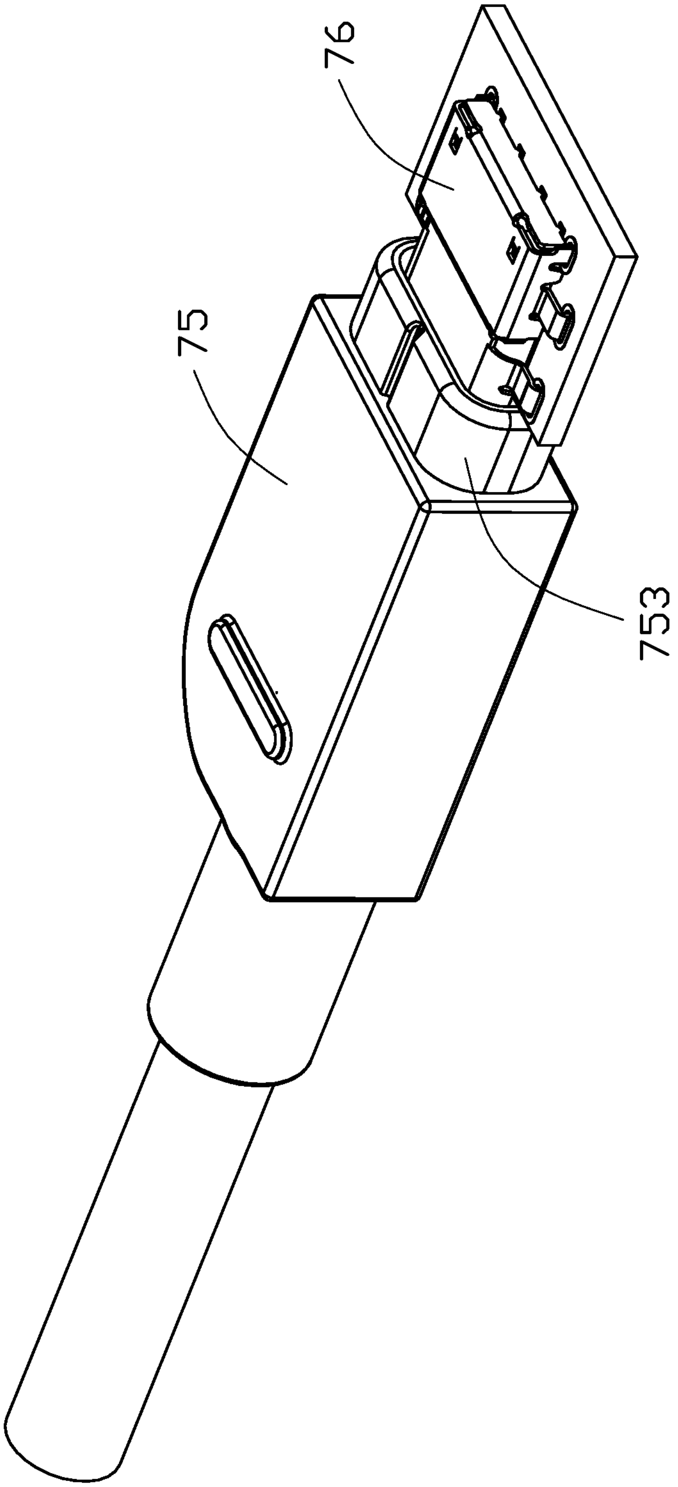
FIG. 55 is an assembled perspective view of the plug connector and the receptacle connector according to another embodiment of the invention.
Figure 56:
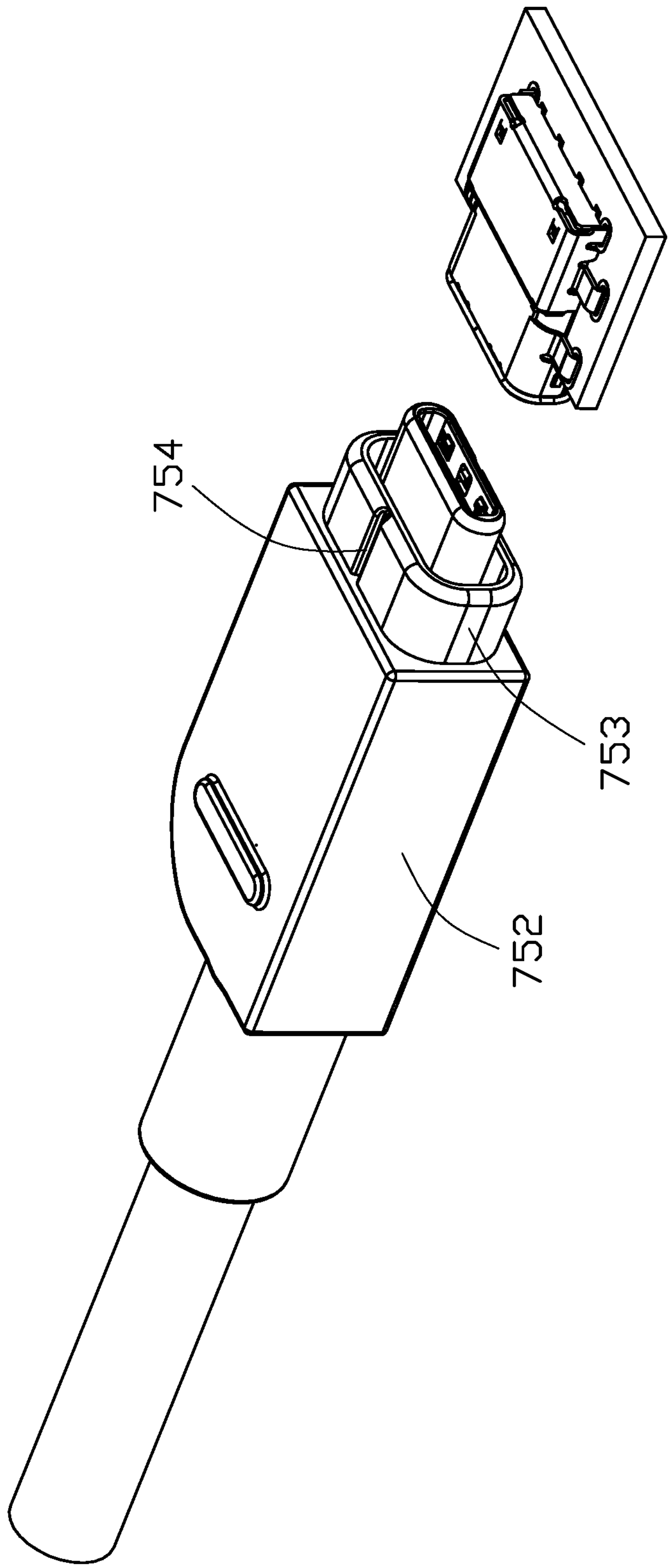
FIG. 56 is a disassembled perspective view of the plug connector and the receptacle connector mounted upon the printed circuit board of FIG. 55.
Figure 57:
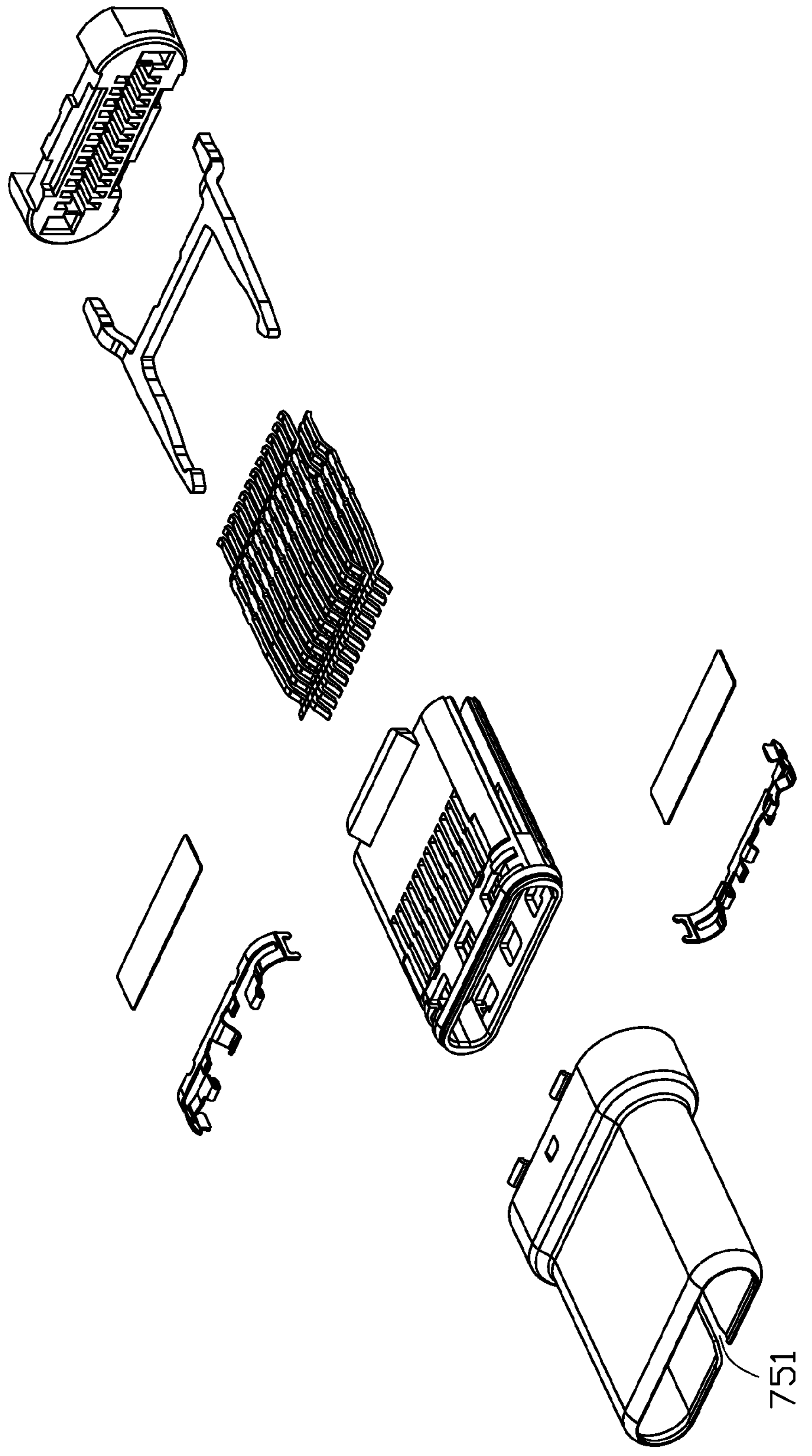
FIG. 57 is a front perspective view of part of the plug connector of FIG. 56.
Figure 58:
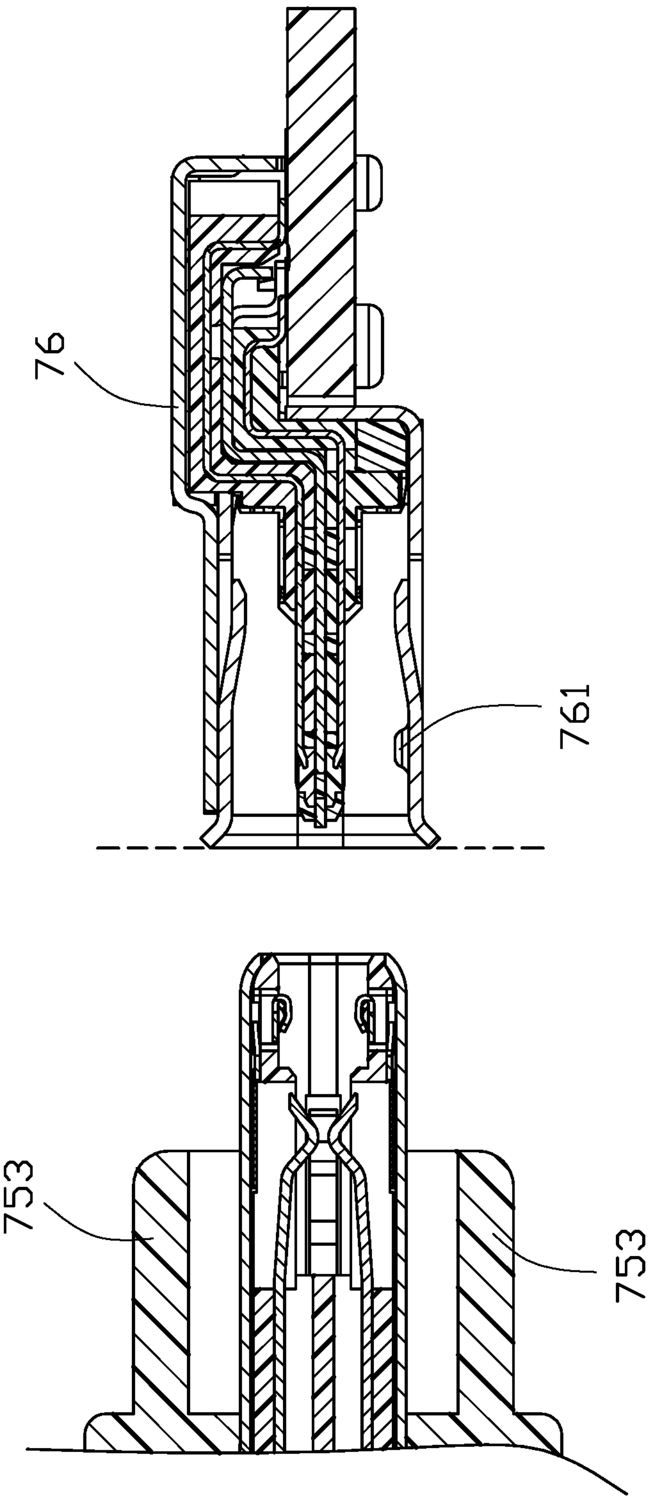
FIG. 58 is a cross-section view of the disassembled plug connector and receptacle connector of FIG. 55.
Figure 59:
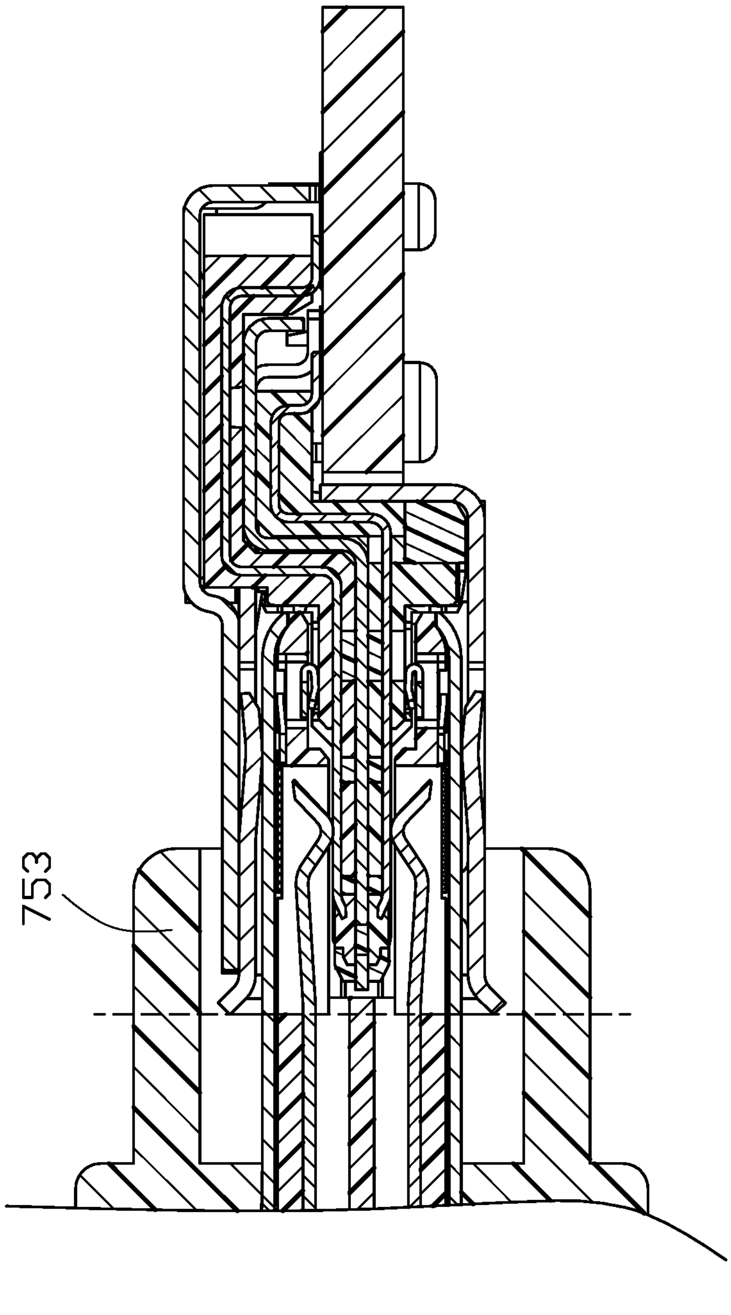
FIG. 59 is a cross-sectional view of the assembled plug connector and receptacle connector of FIG. 56.

Correspondingly, referring to FIG. 49, the customized plug connector 250 includes an insulative housing 732 enclosed within a metallic shell 733 to be commonly received within the mating cavity of the receptacle connector 71. The insulative housing 732 forms a receiving cavity 734 to receive the mating tongue 722 therein. The elements loading in the housing such as two rows of contacts, a U-shaped metallic latch are same to aforementioned first or embodiments, therefore the description of them are omitted. The slot 731 is in a one primary/long wall of the shell 733 to receive the protrusion 711 of the shield 723 of the receptacle connector 71 during mating. Differently, the regular/standard plug connector which is not equipped with the slot 731 in the shell as disclosed in the first or the second embodiments of the instant invention, can not be incautiously inserted into the featured receptacle connector 71 of this embodiment even if the rough contour and dimension of the mating interface of these two embodiments are essentially same with each other except existence of the slot 731, thus achieving an anti-mismating function. Oppositely, the customized plug connector 73 may be optionally inserted into the regular receptacle connector as disclosed in the first or the second embodiment of the instant invention, thus allowing "one way" variable mating of the plug connector 73 to diversify mating applications among the standard type connector mating and non-standard but related type connector mating.

FIGS. 51-54 show another embodiment of the customized receptacle connector very similar to the previous embodiment except the identification protrusion structure. In this embodiment, the customized receptacle connector 74 is mounted upon the printed circuit board 704. The shield 742 forms a lump-like or dimple-like identification protrusion 741 in stead of the tab-like identification protrusion 731 shown in the previous embodiment. Understandably, the lump-like protrusion 741 via the deforming process may keep completeness of the shield 742, compared with the tab-lie protrusion 731 which is split from the shield 723 with a gap therebetween. As mentioned earlier, the protrusion 731/741 may be formed on the top wall of the shield 723/742 instead of on the bottom wall thereof. Under such a situation, the identification protrusion may be formed by the bracket 724/744 when the corresponding position of the shield leaves an enough space for allowing such an identification protrusion formed on the shield to extend therethrough into the mating cavity. It is also noted that in this embodiment the identification protrusion is essentially immovable. Anyhow, in other embodiments, such an identification protrusion may be formed at a distal end of the spring arm unitarily formed on either the shield or the bracket, and the corresponding non-standard or customized plug connector may be formed with a slot or other guiding surfaces to eventually outwardly deflect such an identification protrusion when fully mated while the standard plug connector lacking such a slot or guiding surfaces may not outwardly deflect such an identification protrusion but being stopped thereby.

It is noted that the customized plug connector 73 disclosed in the previous embodiment may be improperly inserted into the standard/regular receptacle connector disclosed in the first embodiment, unless the customized plug connector 73 is intentionally designed to mate with both the standard receptacle connector and the customized receptacle connector. To avoid this situation, the customized plug may be equipped with some features for not mating with the standard receptacle connector.

FIGS. 55-59 show an embodiment of the customized plug connector 75 for mating with the customized receptacle connector 76 mounted upon the printed circuit board and having the identification protrusion 761 on the shield. Similar to what is disclosed in the previous embodiment, the shield of plug connector 75 defines a slot 751 in the front edge region thereof. Different from that in the previous embodiment, the outer jacket 752 further forms a forwardly protruding ring structure 753 to enclose a front section of the corresponding receptacle connector 76. Understandably, the receptacle connector 76 is generally located behind a wall (as shown in the dashed line in FIGS. 58 and 59) of the case, and such a wall with the customized receptacle connector 76 behind may be equipped with an opening to allow said ring structure 753 to extend during mating. In opposite, the wall with the standard receptacle connector behind lacks such an opening so as not to allow the customized plug connector 75 to be fully inserted into the mating cavity of the standard receptacle connector. On the other hand, the standard plug connector as shown in the first embodiment without such a ring structure thereof may be fully inserted into the corresponding standard receptacle connector behind such a wall. Notably, the slot 754 formed in the ring structure 753 is for an orientation purpose when the plug connector 75 is not intended to be flippable with regard to the receptacle connector 76.

Figure 60:
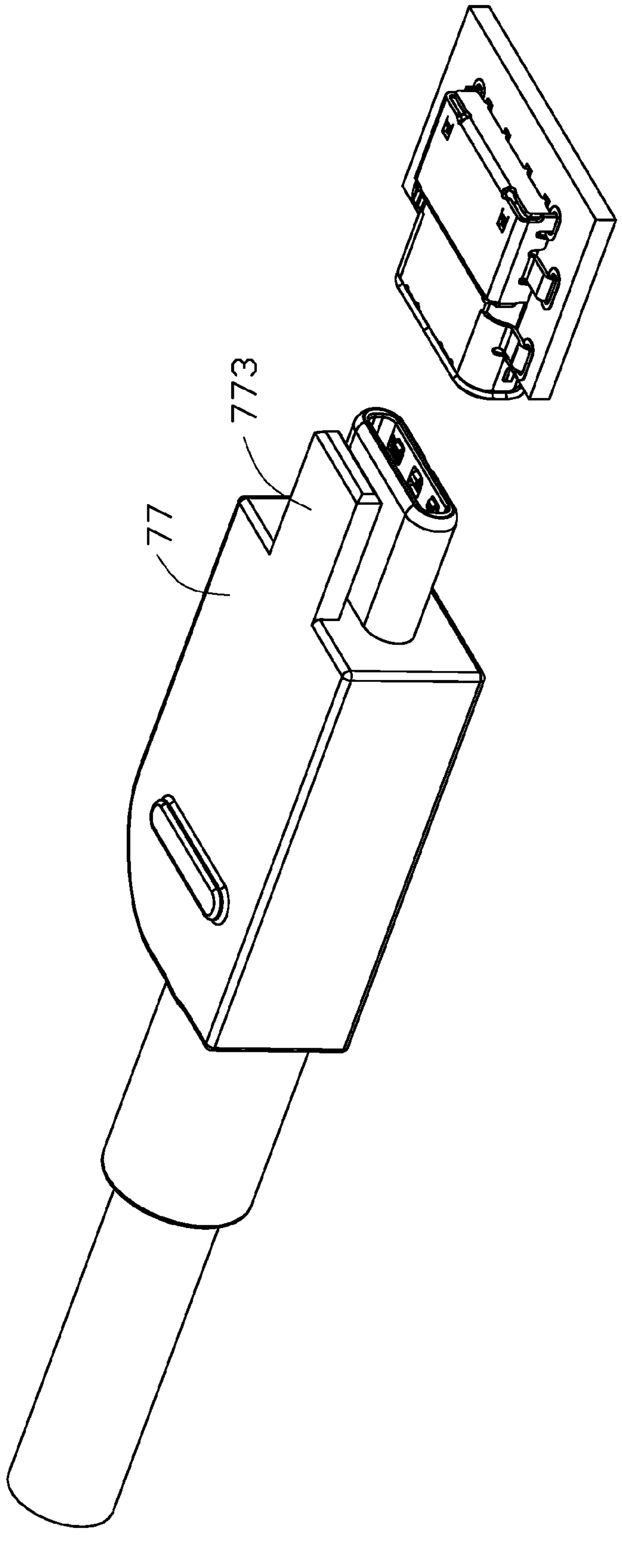
FIG. 60 is a disassembled perspective view of the plug connector and the receptacle connector according to another embodiment of the invention.
Figure 61:
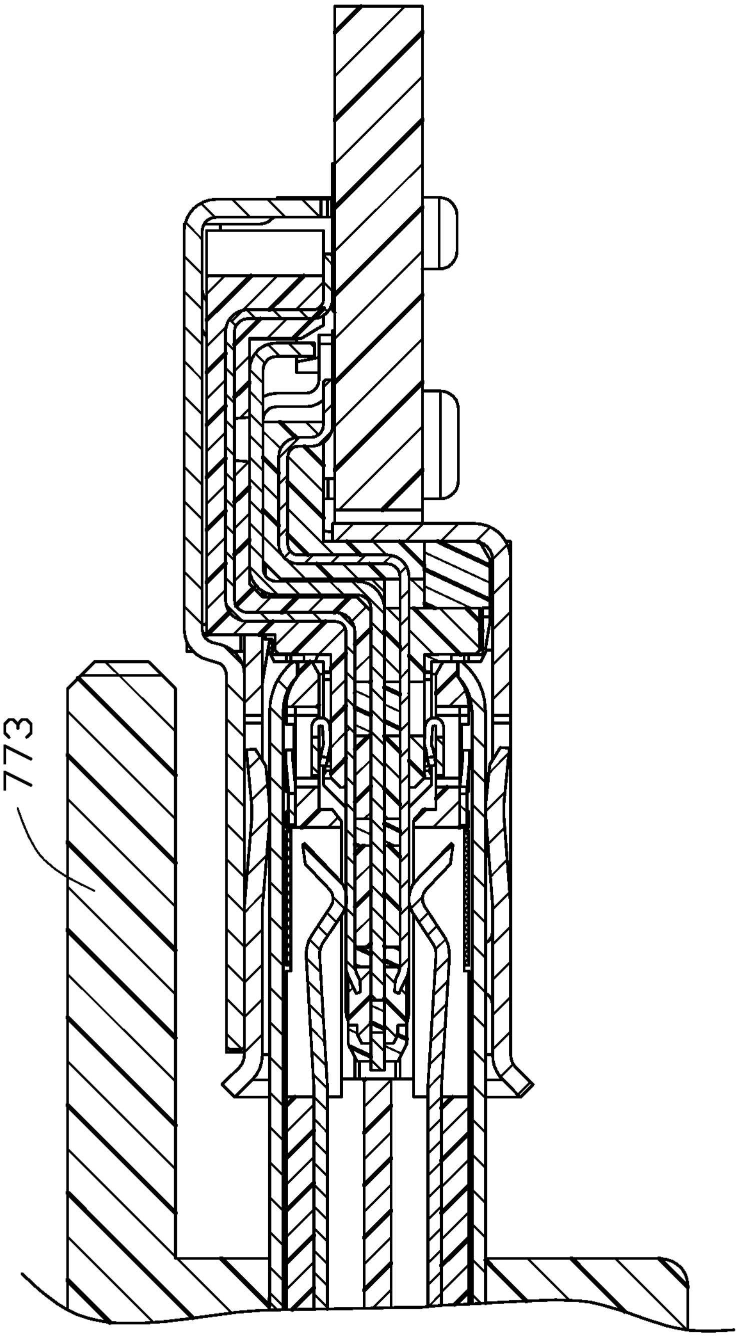
FIG. 61 is a cross-sectional view of the assembled plug connector and receptacle connector of FIG. 60.

FIGS. 60-61 show another embodiment of the plug connector 77 almost fully same with the plug connector 75 except the ring structure 753 is replaced with a protruding plate 773. Understandably, the wall of the case requires the opening only corresponding to the protruding plate 773. In this embodiment, the protruding plate 773 also is function as the orientation means to guide mating between the plug connector and the receptacle connector.

Figure 62:
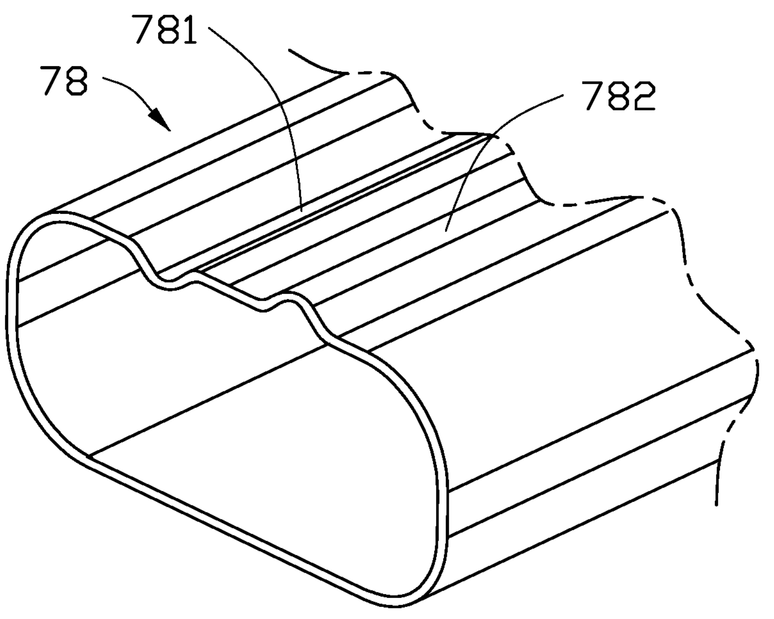
FIG. 62 is a perspective view of the shell of the plug connector of another embodiment of the invention.
Figure 63:
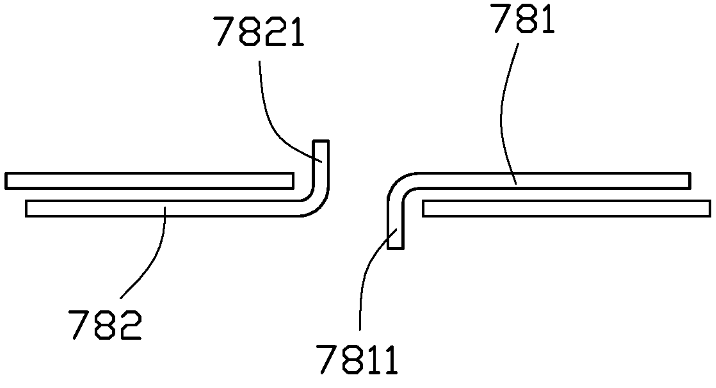
FIG. 63 is a cross-sectional view of the shell of the plug connector of another embodiment of the invention.
Figure 64:
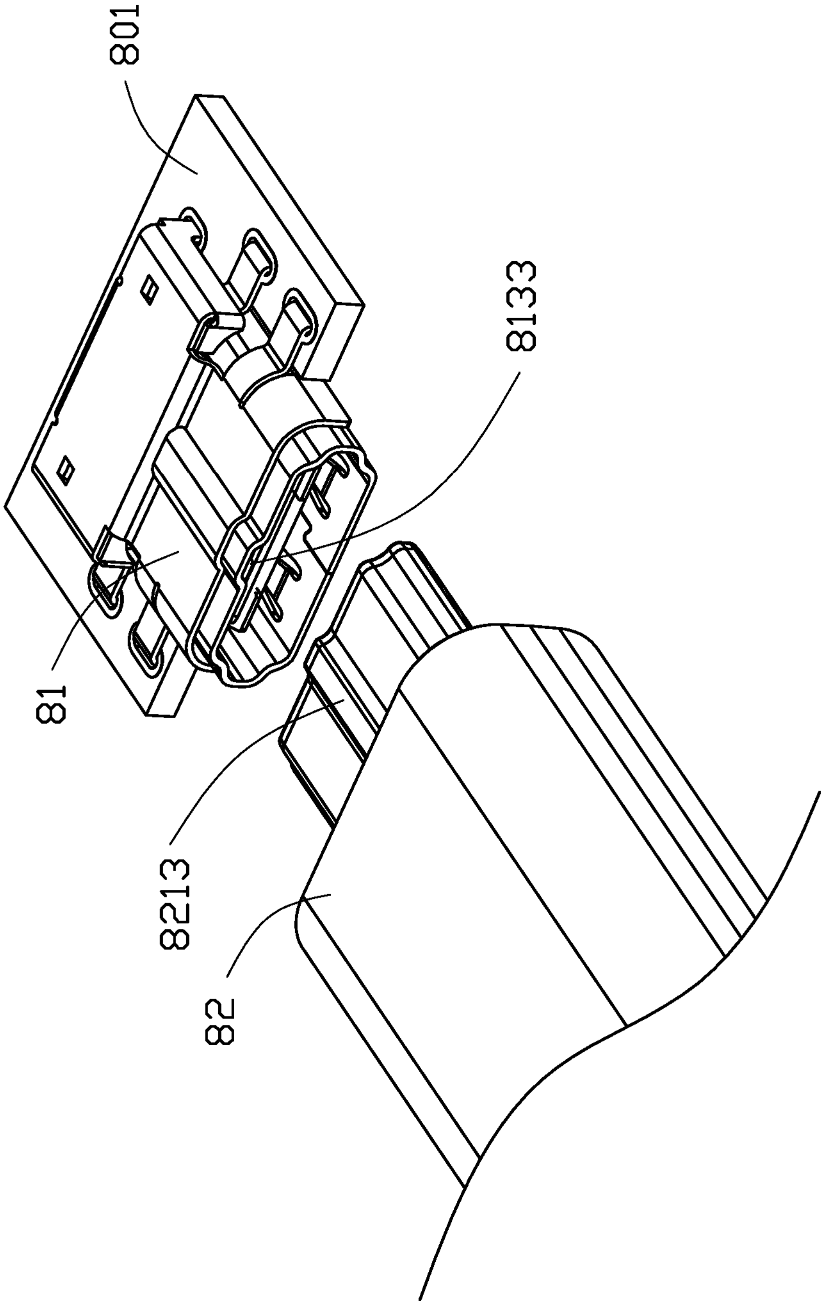
FIG. 64 is a perspective view of a plug connector and a receptacle connector of a fifth embodiment of the invention.
Figure 65:
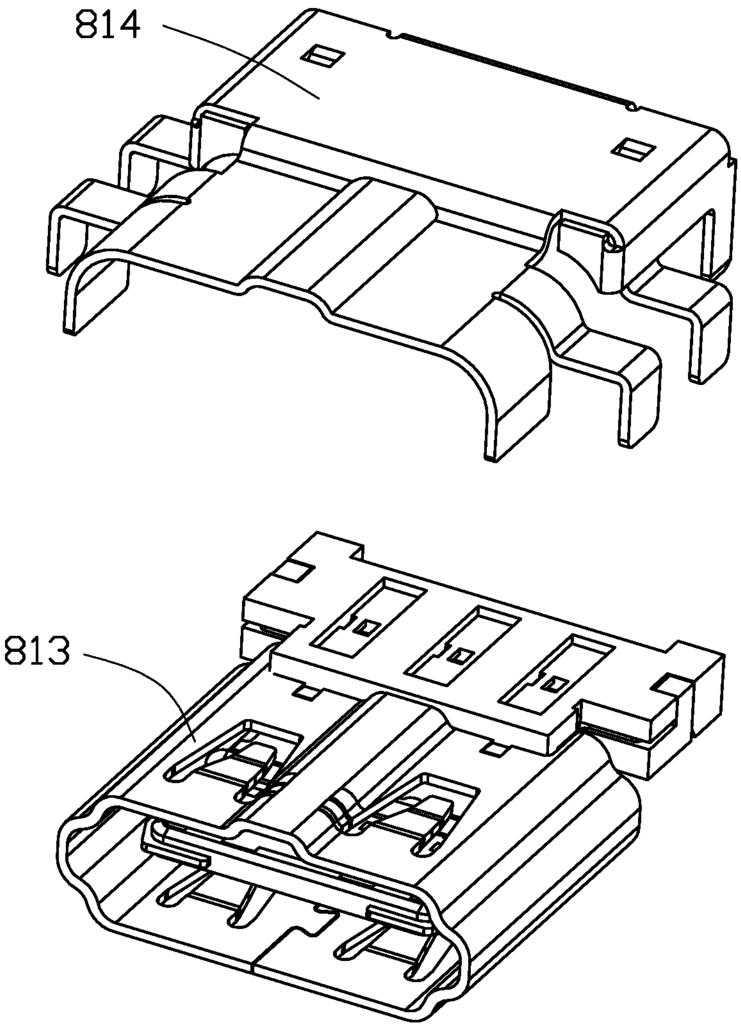
FIG. 65 is an exploded perspective view of the receptacle connector of FIG. 64.
Figure 66:
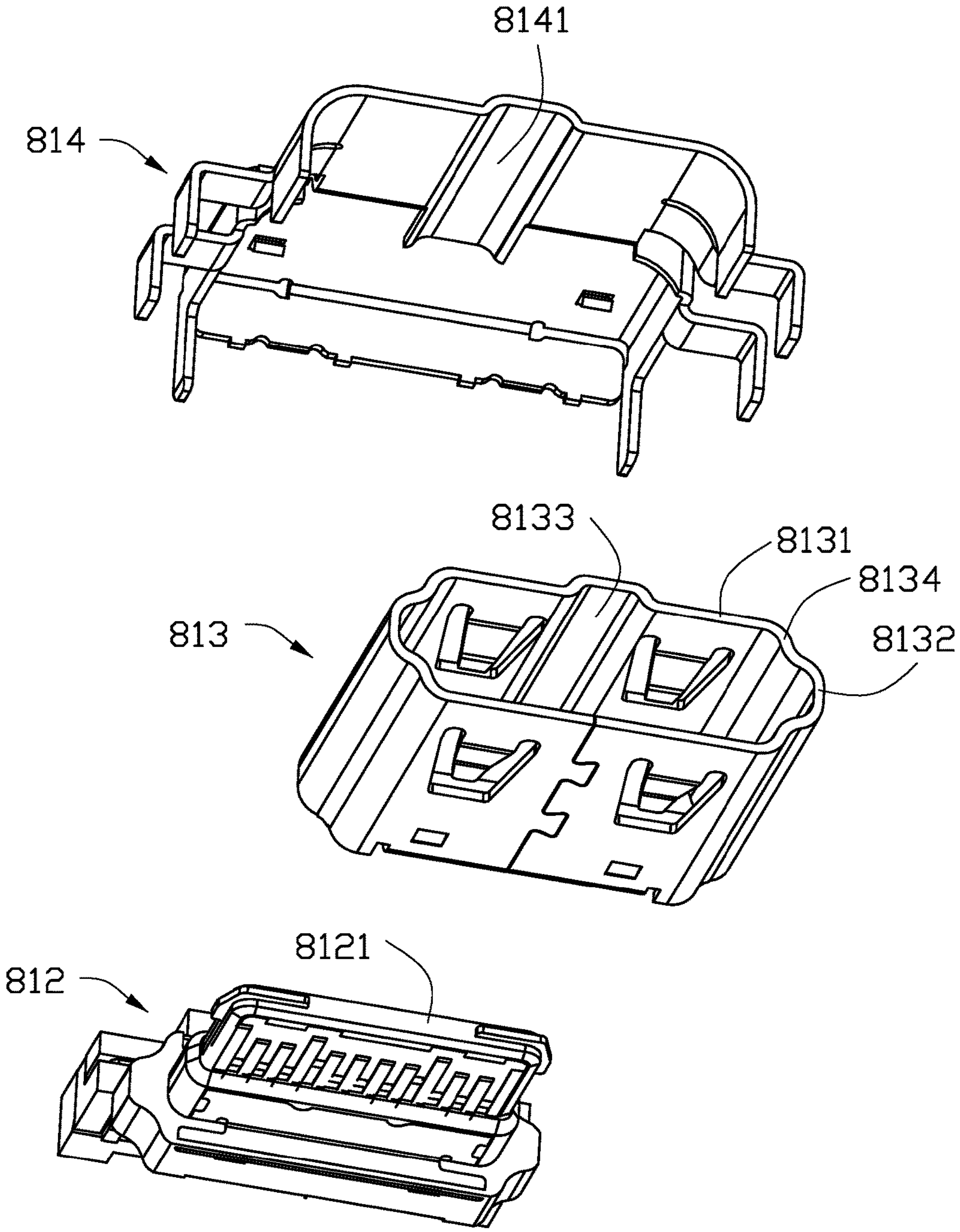
FIG. 66 is a further exploded perspective view of the receptacle connector of FIG. 65.
Figure 67:
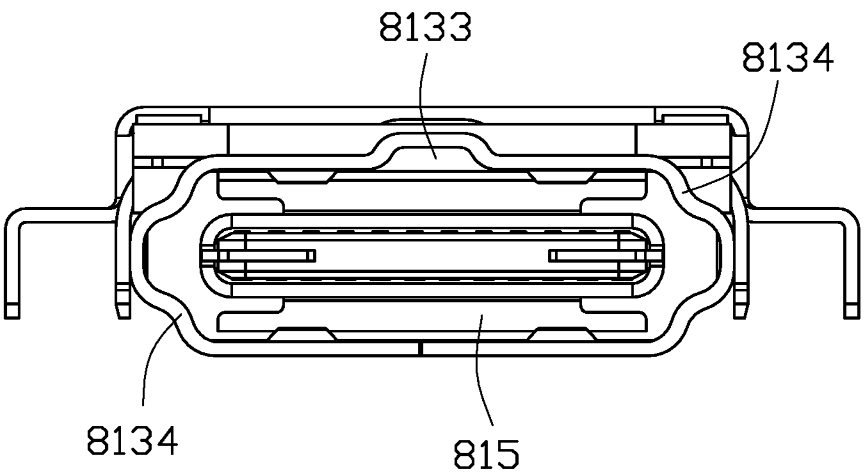
FIG. 67 is a front side view of the receptacle connector of FIG. 64.
Figure 70:
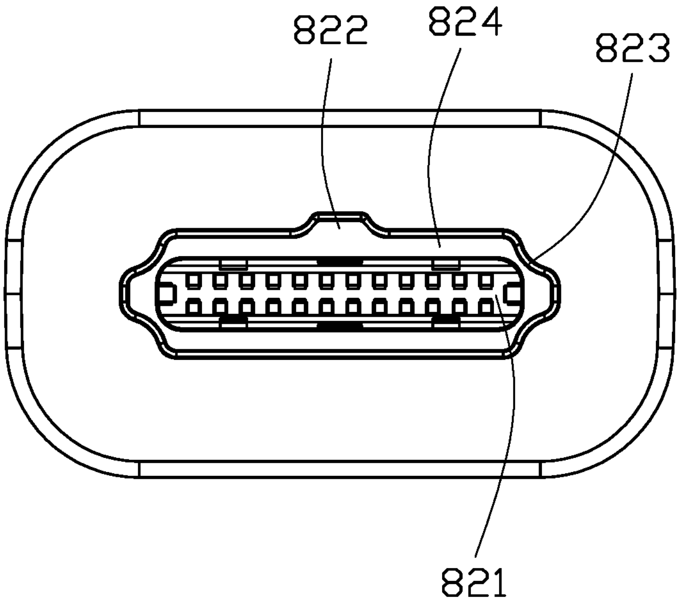
FIG. 70 is a front side view of the plug connector of FIG. 64.
Figure 68:
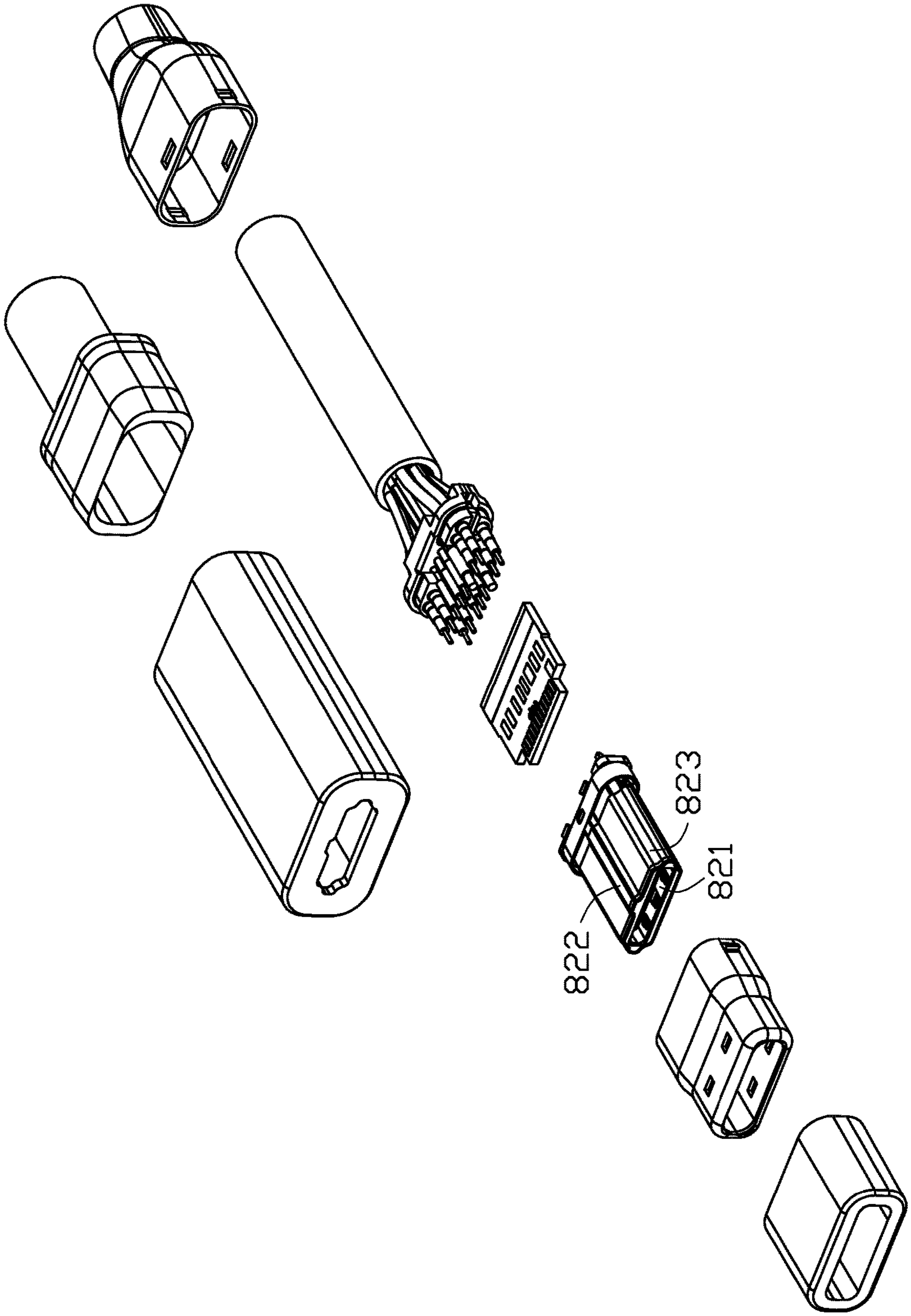
FIG. 68 is a front exploded perspective view of the plug connector of FIG. 64.
Figure 69:
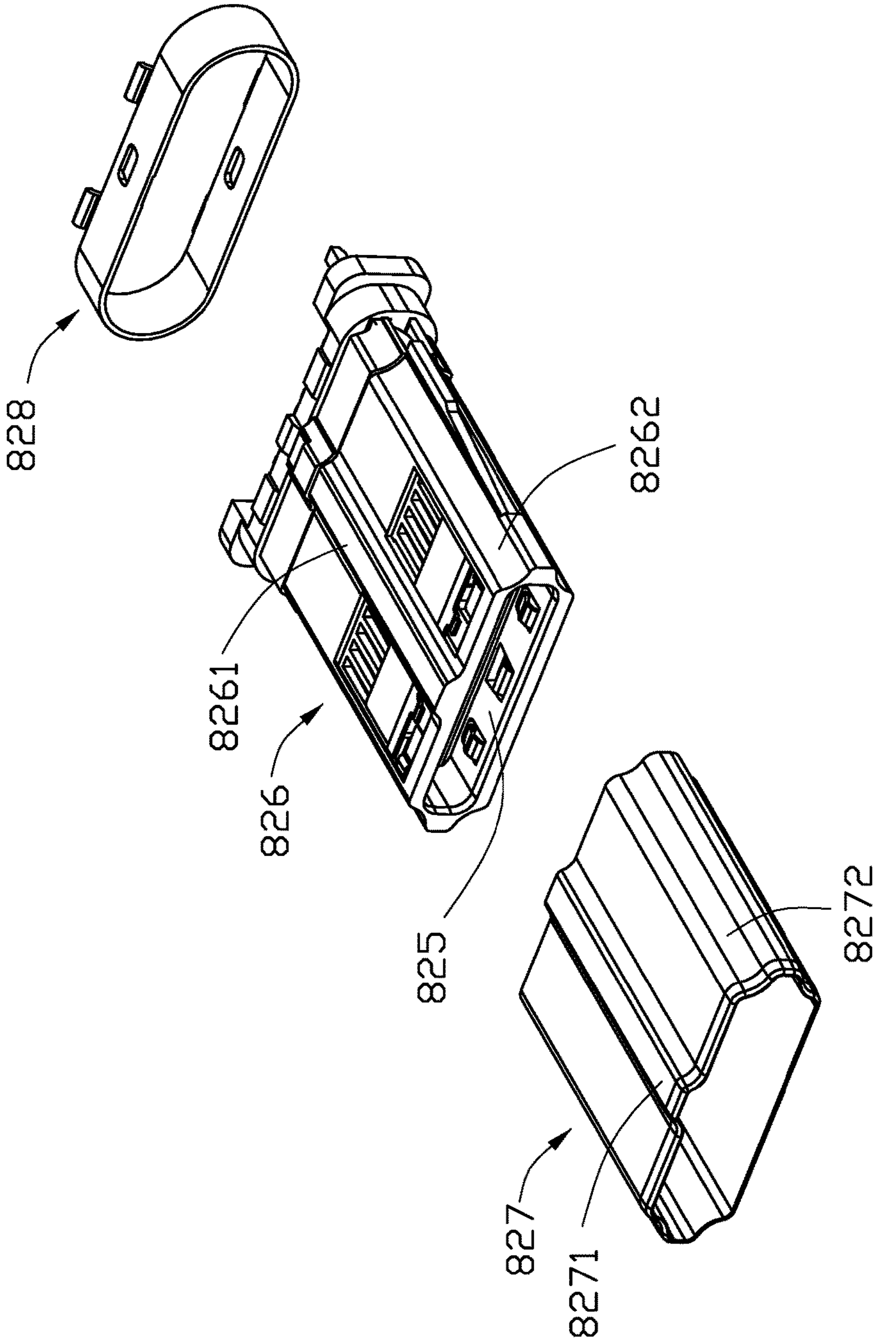
FIG. 69 is a further exploded perspective view of the plug connector of FIG. 68.

Understandably, the previous embodiment may not only allow the customized plug connector to be mated with the corresponding customized receptacle but also preclude the standard plug connector from being inserted into the customized receptacle connector and the customized plug connector from being inserted into the standard receptacle connector. Anyhow, the previous embodiment requires to alter the outer jacket of the customized plug connector. FIGS. 62 and 63 show other approaches wherein the shell 78 of the customized plug connector can unitarily form a recess 781 and a protrusion 782, and the customized receptacle connector may also form the similar structures correspondingly for coupling. Because the recess and the protrusion are simultaneously formed on the shield of the customized receptacle connector and the customized plug connector, the standard plug connector and standard receptacle connector can no longer mis-mated therewith. FIG. 62 also shows the similar concept to implement the same function within a limited space, wherein the top wall 781 of the shield of the outer receptacle connector has a downward tab 7811 split from the shield, the top wall 782 of the shield of the inner plug connector has an upward tab 7821 split from the shield.

FIGS. 64-72 show a fifth embodiment of a customized plug connector 82 for mating with a customized receptacle connector 81 mounted upon the printed circuit board 801. The two connectors have identification features on the mating ports, which will be described hereinafter.

The customized receptacle connector 81 includes a terminal seat 812 with two rows of terminals and a shielding plate embedded in the terminal seat which is similar to the aforementioned first, second or fourth embodiment, and a shell member which includes a metallic shell 813 and a metallic bracket 814. The metallic shell 813 is retained on a base of the terminal seat 811 and encloses a mating tongue 8121 to define a mating cavity 815 among the mating tongue 8121 and the metallic shell 813. The bracket 814 covers on the top wall 8131 and the sidewalls 8132 of the metallic shell 813 with a plurality of mounting legs. Different from aforementioned fourth embodiments, the metallic shell 813 is deformed and the contour is different from that of the first or second embodiment. The metallic shell 813 defines a protruding recess 8133 away from the top wall 8131 while no protruding recess on the bottom wall, and the four recessing sides 8134 at the four corners of the top wall, bottom wall and the side walls 8132 towards the mating cavity 815. The protruding recess 8133 and recessing sides 8134 extend from a front edge through a rear edge of the shielding shell 813. Compared with the customized receptacle connector of the fourth embodiments wherein the outline of the customized receptacle connector 71/74 keep a rough same contour and dimension of the mating interface to the standard USB Type-C receptacle connector with a protruding tab into the mating cavity, the metallic shell 813 of this embodiment is deformed with a different contour so as to achieve an anti-mismating function. The bracket 814 is complying with the metallic shell 813 and also defines a protruding recess 8141 on the top wall while the side walls have no recessing sides.

The customized plug connector 82 defines a receiving cavity 821, a protrusion 822 on a top wall 824 thereof, and four outlet recesses 823 at the four corners of the mating port thereof. When the customized plug connector 82 is inserted into the customized receptacle connector 81, the protrusion 822 is inserted and received in the protruding recess 8133 and the four outlet recesses 823 are complied with the insides of the recessing sides 8134 of the shell 813 of the customized receptacle connector 81. The protrusion 822 of the customize plug connector 82 do not allow it to be fully inserted into the standard receptacle connector such as shown in the first or second embodiment, and at the same time the recessing sides 8134 of the customize receptacle connector 81 do not allow the standard plug connector such as shown in the first or second embodiments to be inserted into the customize receptacle connector 81. Understandably, this embodiment may not only allow the customized plug connector to be mated with the corresponding customized receptacle but also preclude the standard plug connector from being inserted into the customized receptacle connector and the customized plug connector from being inserted into the standard receptacle connector.

The plug head of the customized plug connector 82 includes an insulative housing 826 with terminals and other elements similar to the aforementioned embodiments, a metallic shell 827 and a metallic ring 828. The insulative housing 826 defines the receiving cavity 825 opening forwards and defined among the top wall, a bottom wall and two opposite side walls. The contour of the insulative housing 826 has a sub-protrusion 8261 and sub-side recess 8262. The contour of the shell also has sub-protrusion 8271 and sub-side recess 8272. The contour of the shell 827 is fitly enclose the insulative housing and commonly form the protrusion 822 and side recesses 823 of the customized plug connector 81. In this embodiment, the protruding recess also is function as the orientation means to guide mating between the customized plug connector and the customized receptacle connector. If a flipped mating is need, the bottom wall of the shielding shell of the customized receptacle connector also can equipment with another protruding recess.

However, the disclosure is illustrative only, changes may be made in detail, especially in matter of shape, size, and arrangement of parts within the principles of the invention.

What is claimed is:

1. A receptacle connector adapted for mating with a plug connector, comprising:

an insulative housing defining a base and a mating tongue extending from the base with a thickened step structure formed around a root of the mating tongue near to the base;

two rows of plate contacts disposed in the insulative housing with contacting sections exposed upon the mating tongue and in front of the step structure and categorized with signal contacts, power contacts and grounding contacts;

a metallic shielding plate disposed within a middle level of the mating tongue;

wherein the shielding plate defines a pair of immoveable and un-deflectable lateral edge sections in front of the step structure, and each lateral edge section protrudes beyond a corresponding side portion of the mating tongue in a transverse direction and is configured to be adapted to be locked with a latch of the plug connector in the transverse direction.

2. The receptacle connector as clamed in claim 1, wherein the shielding plate comprises a front portion located in the mating tongue, a rear portion located in the base, the rear portion defines a pair of lateral wings located in the base and protruding laterally than the front portion.

3. The receptacle connector as claimed in claim 1, wherein a leg extends from the corresponding wing of the shielding plate.

4. The receptacle connector as claimed in claim 3, wherein the leg of the shielding plate is located at an outer side of a leg of a grounding contact, the two legs sharing a same conductive grounding region of a printed circuit board on which the connector is mounted.

5. The receptacle connector as claimed in claim 1, further comprising a metallic shell and a connector kit, wherein the metallic shell encloses the insulative housing to define a mating cavity in which mating tongue is disposed, the electrical connector is received in the connector kit and the connector kit forms a front face which is essentially flush with a front edge of the shell in the transverse direction for lateral protection the shell.

6. The receptacle connector as claimed in claim 1, further comprising a metallic shell and a connector kit, wherein the metallic shell encloses the insulative housing to define a mating cavity in which a mating tongue is disposed, the electrical connector is received in the connector kit and a front edge of the shell protrudes forward from a front face of the connector kit.

7. The receptacle connector as claimed in claim 1, wherein the contacts are mounted to a printed circuit board on which the insulative housing is generally seated, and the mating tongue extends in a vertical plane with regard to the printed circuit board in a vertical direction perpendicular to the transverse direction.

8. The receptacle connector as claimed in claim 1, wherein the contacts are mounted to a printed circuit board on which the insulative housing is generally seated, and the mating tongue extends along a plane which is oblique to another plane defined by extension of said printed circuit board.

9. The receptacle connector as claimed in claim 1, further comprising a spacer to align tails of the contacts with regard to a mounting region of a printed circuit board on which the housing is generally seated.

10. The receptacle connector as claimed in claim 1, wherein the mating tongue is made by an internal circuit board.

11. The receptacle connector as claimed in claim 1, wherein the receptacle connector comprises a one piece collar intimately surrounding the step structure.

12. The receptacle connector as claimed in claim 1, wherein the receptacle connector comprises a shell surrounding the insulative housing and the mating tongue protruding in the shell to commonly define a mating cavity thereamong, the shell defines an identification protrusion into the mating cavity.

13. The receptacle connector as claimed in claim 1, wherein the receptacle connector comprises a shell surrounding the insulative housing and the mating tongue protruding to the shell to commonly define a mating cavity thereamong, the shell includes a top wall, a bottom wall and two side walls, the shell further defines a protruding recess away from the top wall thereof while no protruding recess on the bottom wall thereof, and four recessing sides at four corners of the top wall, bottom wall and side walls towards the mating cavity.

14. A receptacle connector for inserted with a plug connector in a flappable form, comprising:

an insulative housing defining a base and a mating tongue extending from the base with a thickened step structure formed around a root of the mating tongue near to the base;

two rows of contacts disposed in the insulative housing with plate contacting sections exposed upon the mating tongue in front of the step structure and categorized with signal contacts, power contacts and grounding contacts;

a metallic latching structure embedded in the mating tongue and disposed between the plate contacting sections;

wherein the metallic latching structure defines a pair of side edge sections which are immoveable and un-deflectable and protrude beyond corresponding side notches defined the mating tongue in a transverse direction to be locked with two deflectable latching arms in said transverse direction and located in front of the step structure.

15. The receptacle connector as clamed in claim 14, wherein the metallic latching structure has a leg extending therefrom, the leg and a leg of a grounding leg share a same conductive grounding region of a printed circuit board on which the receptacle connector is mounted.

16. The receptacle connector as claimed in claim 14, wherein the receptacle connector comprises a one piece metallic collar intimately surrounds the step structure.

17. The receptacle connector as claimed in claim 14, further including a spacer to align tails of the contacts with regard to a mounting region of a printed circuit board on which the housing is generally seated.

18. The receptacle connector as claimed in claim 14, comprising a shielding shell and a lower bracket, wherein the shielding shell surrounds the mating tongue to define a mating cavity among the shielding shell and the mating tongue, the lower bracket is soldered to a lower sidewall of the shielding shell.

19. A receptacle connector comprising:

a printed circuit board defining a mating tongue with a plurality of circuit pads thereon at a front edge region thereof;

a housing composed of a straddle mounting upper housing and a straddle mounting lower housing commonly sandwiching the printed circuit board so as to define a mating port, the mating tongue extending into the mating port.

20. The receptacle connector as claimed in claim 19, wherein the front edge region of the printed circuit board defines a pair of slots, each of the upper housing and the lower housing includes two side walls extending into the corresponding slots to commonly form the mating port.

* * * * *